(12) United States Patent
Fujimoto et al.

(10) Patent No.: US 11,922,991 B2
(45) Date of Patent: Mar. 5, 2024

(54) INFORMATION PROCESSING APPARATUS, INFORMATION PROCESSING SYSTEM, AND SEMICONDUCTOR STORAGE DEVICE

(71) Applicant: KIOXIA CORPORATION, Tokyo (JP)

(72) Inventors: Akihisa Fujimoto, Yamato (JP); Atsushi Kondo, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/301,482

(22) Filed: Apr. 17, 2023

(65) Prior Publication Data

US 2023/0253027 A1    Aug. 10, 2023

Related U.S. Application Data

(63) Continuation of application No. 17/348,082, filed on Jun. 15, 2021, now Pat. No. 11,664,066, which is a (Continued)

(30) Foreign Application Priority Data

Apr. 12, 2019  (JP) ................................. 2019-076690
Aug. 29, 2019  (JP) ................................. 2019-157077

(51) Int. Cl.
*G11C 5/14*  (2006.01)
*G06F 3/06*  (2006.01)
(Continued)

(52) U.S. Cl.
CPC ........ *G11C 11/4074* (2013.01); *G06F 3/0614* (2013.01); *G06F 3/0653* (2013.01);
(Continued)

(58) Field of Classification Search
CPC ... G11C 11/4074; G11C 7/22; G11C 11/4076; G11C 5/147; G11C 16/20; G11C 16/30;
(Continued)

(56) References Cited

U.S. PATENT DOCUMENTS 4,849,944 A     7/1989  Matsushita
9,853,379 B1 *  12/2017 Hirose .................. H01R 13/26
(Continued)

FOREIGN PATENT DOCUMENTS

JP         2723061 B2     3/1998
JP    WO2006/117966 A1   11/2006
(Continued)

*Primary Examiner* — Uyen Smet
(74) *Attorney, Agent, or Firm* — Oblon, McClelland, Maier & Neustadt, L.L.P.

(57) ABSTRACT

According to one embodiment, an information processing apparatus includes a connector into which a first-type semiconductor storage device operating with n types of power supply voltages or a second-type semiconductor storage device operating with m types of power supply voltages less than the n types of power supply voltages is capable of being placed. The apparatus checks whether or not a notch is formed at a predetermined position of a semiconductor storage device placed into the connector, and supplies the m types of power supply voltages to the semiconductor storage device when the notch is formed at the predetermined position.

10 Claims, 44 Drawing Sheets

Related U.S. Application Data continuation of application No. 16/817,832, filed on Mar. 13, 2020, now Pat. No. 11,081,163.

(51) Int. Cl.
*G11C 7/22* (2006.01)
*G11C 11/4074* (2006.01)
*G11C 11/4076* (2006.01)

(52) U.S. Cl.
CPC .............. *G06F 3/0688* (2013.01); *G11C 7/22* (2013.01); *G11C 11/4076* (2013.01)

(58) Field of Classification Search
CPC ..... G11C 5/025; G06F 3/0614; G06F 3/0653; G06F 3/0688; G06F 3/0625; G06F 3/0634; G06F 3/0679; Y02D 10/00
See application file for complete search history.

(56) References Cited

U.S. PATENT DOCUMENTS

| | | |
|---|---|---|
| 9,893,484 B2 | 2/2018 | Lee |
| 2006/0264100 A1 | 11/2006 | Peng |
| 2009/0077393 A1 | 3/2009 | Nakamura |
| 2010/0131707 A1 | 5/2010 | Chi |
| 2014/0127947 A1 | 5/2014 | Han |
| 2015/0248368 A1 | 9/2015 | Otsuka |
| 2016/0266794 A1 | 9/2016 | Ishibashi |
| 2017/0154003 A1* | 6/2017 | Han .................... G06F 13/4068 |
| 2017/0192475 A1 | 7/2017 | Fujimoto et al. |

FOREIGN PATENT DOCUMENTS

| | | |
|---|---|---|
| JP | 2016-029556 A | 3/2016 |
| JP | 2016-167167 A | 9/2016 |
| JP | 2020-161098 A | 10/2020 |
| WO | WO 2020/188429 A1 | 9/2020 |

* cited by examiner (A) Three-power card (B) Two-power card (or one-power card)

FIG. 5

| Rows | Terminals | Signal names | Functions | Descriptions |
|---|---|---|---|---|
| R11 | P101 | GND | Ground | |
| | P102 | PERp0 | Receiver differential pair, Lane 0 | PCIe RX Differential signals defined by the PCIe 3.0 specification |
| | P103 | PERn0 | | |
| | P104 | GND | Ground | |
| | P105 | PETp0 | Transmitter differential pair, Lane 0 | PCIe TX Differential signals defined by the PCIe 3.0 specification |
| | P106 | PETn0 | | |
| | P107 | GND | Ground | |
| | P108 | PERp1 | Receiver differential pair, Lane 1 | PCIe RX Differential signals defined by the PCIe 3.0 specification |
| | P109 | PERn1 | | |
| | P110 | GND | Ground | |
| | P111 | PETp1 | Transmitter differential pair, Lane 1 | PCIe TX Differential signals defined by the PCIe 3.0 specification |
| | P112 | PETn1 | | |
| | P113 | GND | Ground | |
| | P114 | GND | Ground | |
| R12 | P115 | PERp2 | Receiver differential pair, Lane 2 | PCIe RX Differential signals defined by the PCIe 3.0 specification |
| | P116 | PERn2 | | |
| | P117 | GND | Ground | |
| | P118 | PETp2 | Transmitter differential pair, Lane 2 | PCIe TX Differential signals defined by the PCIe 3.0 specification |
| | P119 | PETn2 | | |
| | P120 | GND | Ground | |
| | P121 | PERp3 | Receiver differential pair, Lane 3 | PCIe RX Differential signals defined by the PCIe 3.0 specification |
| | P122 | PERn3 | | |
| | P123 | GND | Ground | |
| | P124 | PETp3 | Transmitter differential pair, Lane 3 | PCIe TX Differential signals defined by the PCIe 3.0 specification |
| | P125 | PETn3 | | |
| | P126 | GND | Ground | |
| | P127 | GND | Ground | |
| | P128 | REFCLKp | Reference clock differential pair | PCIe Reference Clock signals (100 MHz) defined by the PCIe 3.0 specification |
| | P129 | REFCLKn | | |
| | P130 | GND | Ground | |
| | P131 | PWR_2 | Power Rail 2 | |
| | P132 | PWR_2 | Power Rail 2 | |
| R21 | P133 | PERST# | Fundamental reset/1.8V | Functional reset to the card as defined by the PCIe Mini CEM specification |
| | P134 | PWR_1 | Power Rail 1 | |
| | P135 | CLKREQ# | Clock Request Signal/1.8V open drain | Reference clock request signal by the PCIe Mini CEM specification |
| | P136 | CNTA | Control A | |
| | P137 | PWR_3 | Power Rail 3 | |
| | P138 | PWR_3 | Power Rail 3 | |
| | P139 | CNT_B | Control B | |

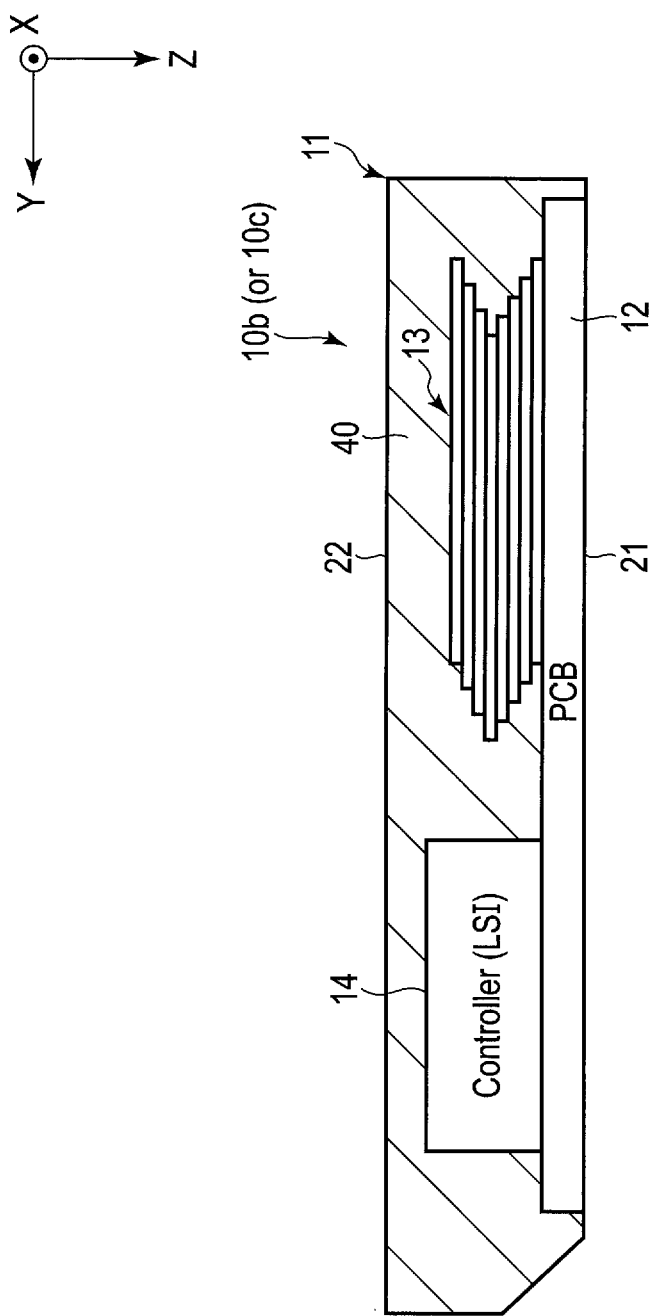
F I G. 6

FIG. 7

(A) Host power configuration (PWR 1 reinforced)

PWR1>PWR2>PWR3
ex PWR1=3.3V
PWR2=1.8V
PWR3=1.2V

| | Powers | Notch Detection | A | B | C | D | E |
|---|---|---|---|---|---|---|---|
| Three-power host | 3 Voltages | Don't care | PWR1 | PWR2 | PWR2 | PWR3 | PWR3 |
| Two-power host | 2 Voltages | Notch detected | PWR1 | PWR2 | PWR2 | PWR1 | PWR1 |
| One-power host | 1 Voltage | Notch detected | PWR1 | PWR1 | 0V | PWR1 | PWR1 |

(B) Host power configuration (PWR 2 reinforced)

| | Powers | Notch Detection | A | B | C | D | E |
|---|---|---|---|---|---|---|---|
| Three-power host | 3 Voltages | Don't care | PWR1 | PWR2 | PWR2 | PWR3 | PWR3 |
| Two-power host | 2 Voltages | Notch detected | PWR1 | PWR2 | PWR2 | PWR2 | PWR1 |
| One-power host | 1 Voltage | Notch detected | PWR1 | PWR1 | 0V | PWR1 | PWR1 |

| | Notch | Powers | A | B | C | D | E |
|---|---|---|---|---|---|---|---|
| Three-power host | No | 3 Voltages | PWR1 | PWR2 | PWR2 | PWR3 | PWR3 |
| Two-power host | Yes | 2 Voltages | PWR1 | PWR2 | PWR2 | PWR1 | PWR1 |
| One-power host | Yes | 1 Voltage | PWR1 | PWR1 | N/R | PWR1 | PWR1 |

Card power configuration (PWR 1 reinforced)

(B)

| | Notch | Powers | A | B | C | D | E |
|---|---|---|---|---|---|---|---|
| Three-power host | No | 3 Voltages | PWR1 | PWR2 | PWR2 | PWR3 | PWR3 |
| Two-power host | Yes | 2 Voltages | PWR1 | PWR2 | PWR2 | PWR2 | PWR1 |
| One-power host | Yes | 1 Voltage | PWR1 | PWR1 | N/R | PWR1 | PWR1 |

Card power configuration (PWR 2 reinforced)

|  | | Cards | | |
|---|---|---|---|---|
|  | | 3 Voltages | 2 Voltages | 1 Voltage |
| Hosts | 3 Voltages | Full | N/A, Full, Limited | N/A, Full, Limited |
|  | 2 Voltages | N/A | Full | N/A, Full, Limited |
|  | 1 Voltage | N/A | N/A | Full |

FIG. 9

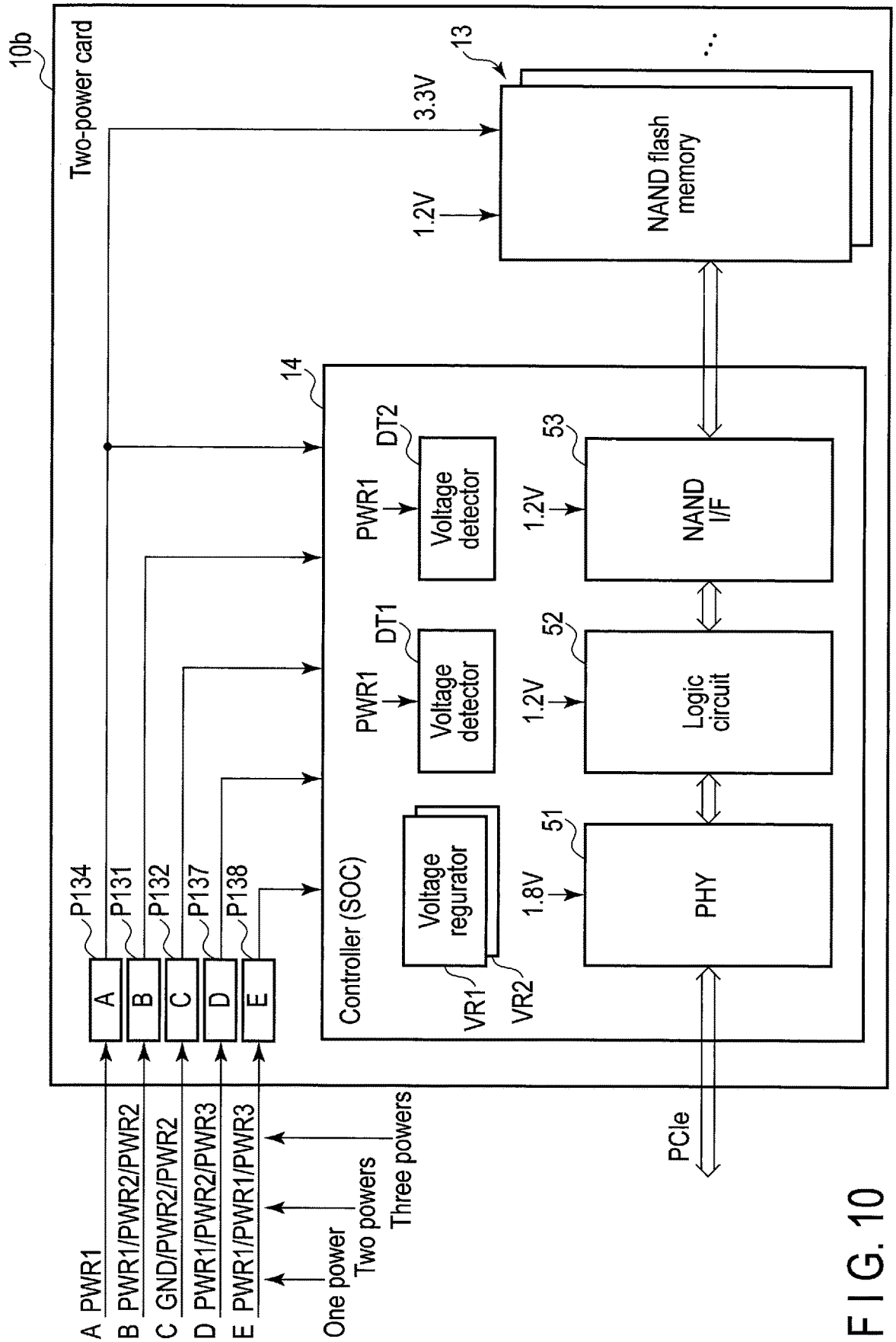
F I G. 10

| DT1 | DT2 | Detected Host Type |
|---|---|---|
| High | Low | One-power host |
| High | High | Two-power host |
| Low | High | Three-power host |

F I G. 14

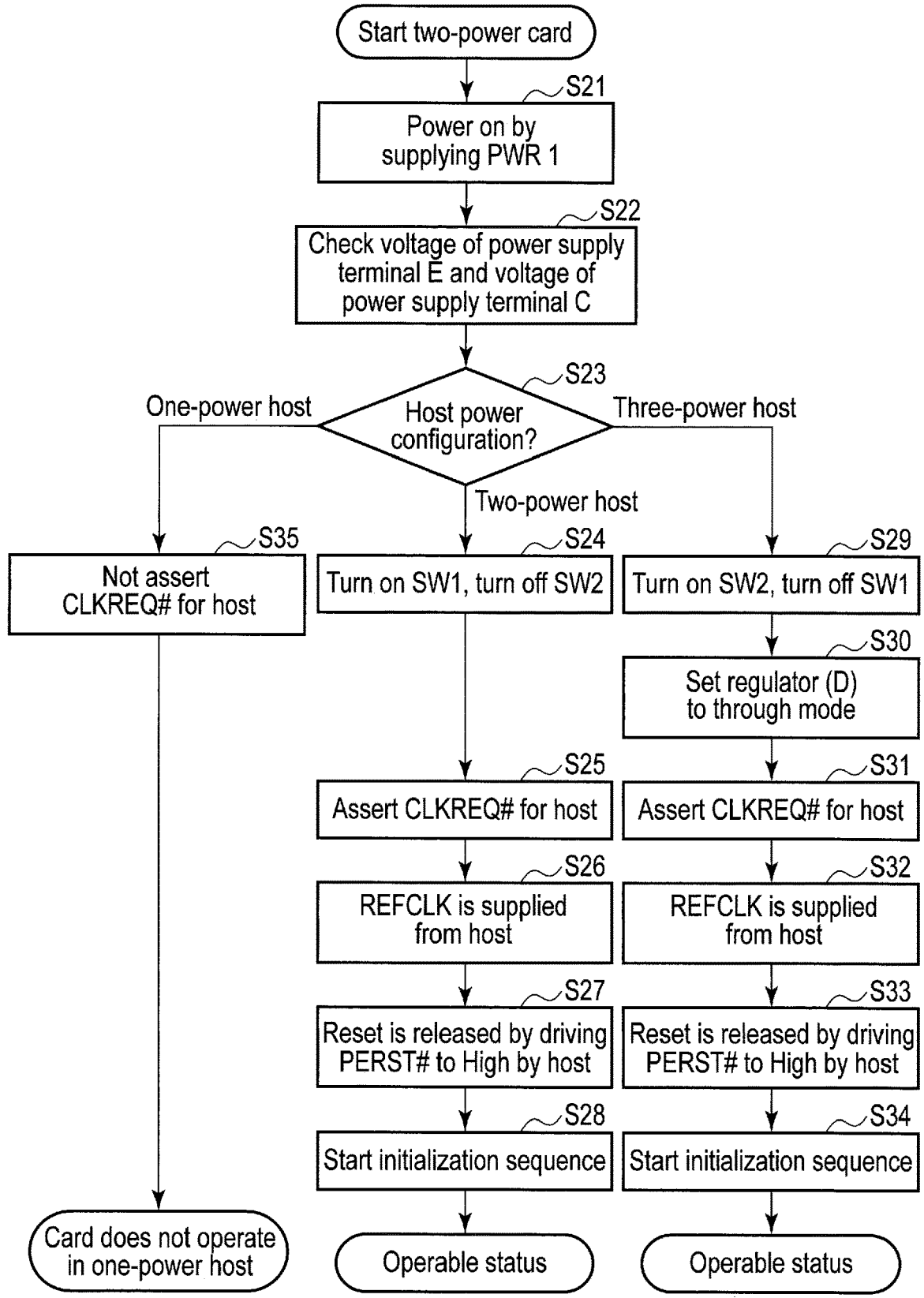
F I G. 20

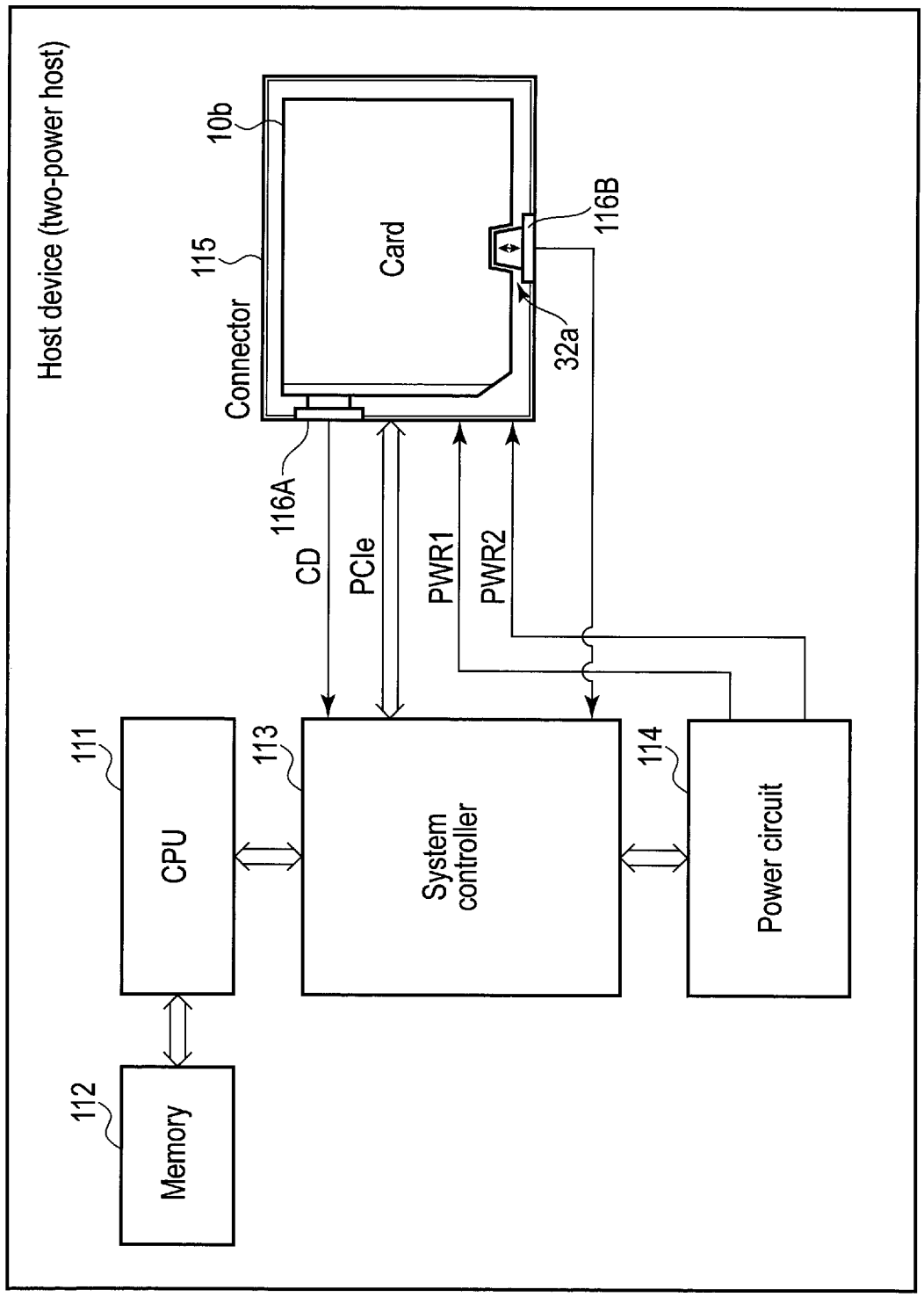
F I G. 23

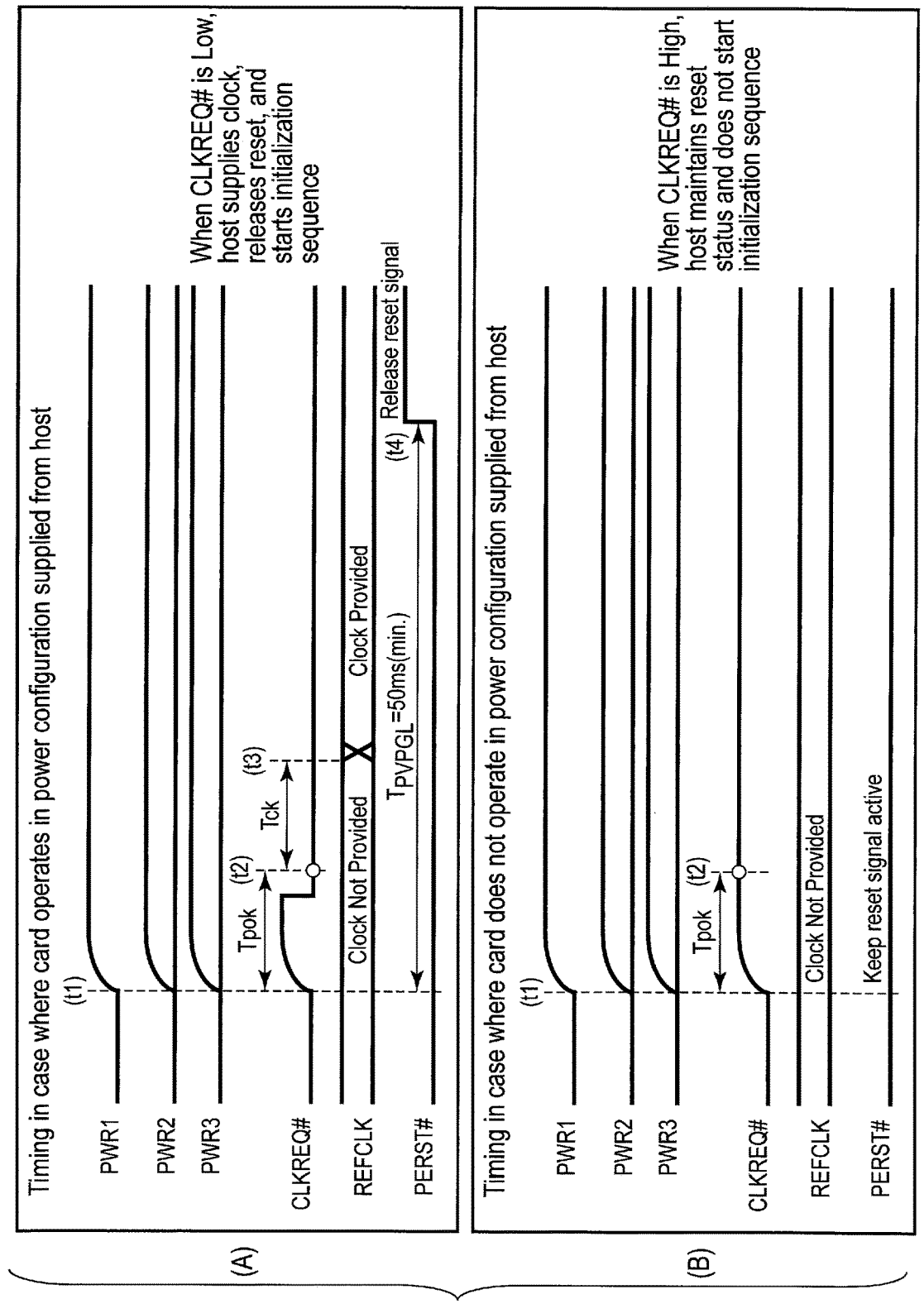
F I G. 24

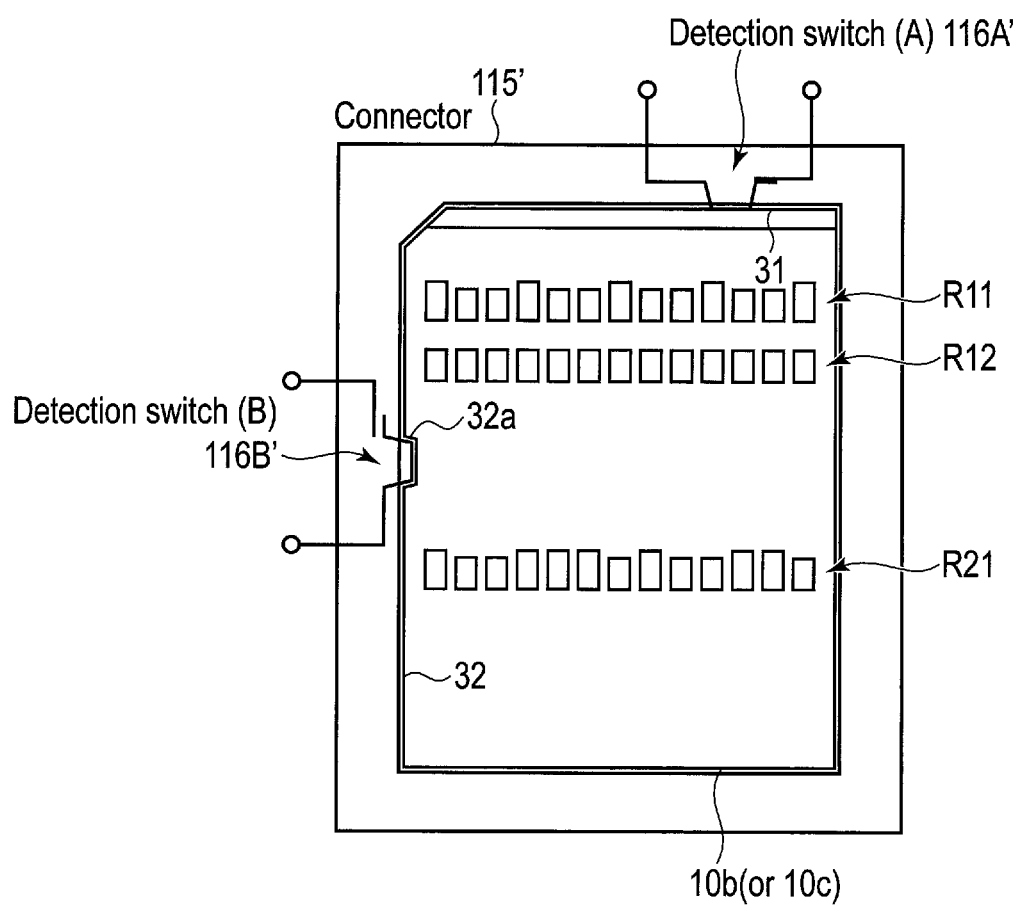
F I G. 27

(A)

| Detection switch (A) | Detection switch (B) | Card type |
|---|---|---|
| OFF | DON'T care | No card |
| ON | ON | Card having no notch |
| ON | OFF | Card having notch |

(B)

| Detection switch (A) | Detection switch (B) | Card type |
|---|---|---|
| Card undetected | DON'T care | No card |
| Card detected | Notch undetected | Card having no notch |
| Card detected | Notch detected | Card having notch |

F I G. 28

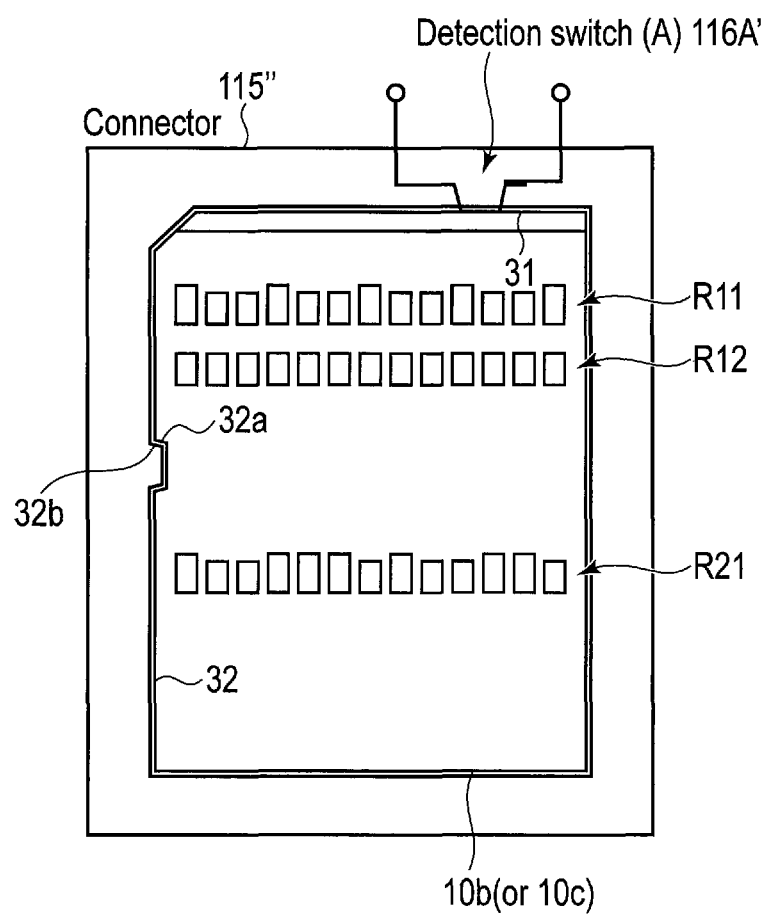
F I G. 29

(A)

PWR1>PWR2>PWR3
ex PWR1=3.3V(or 2.5V)
   PWR2=1.8V
   PWR3=1.2V

| Notch Detection | PWR Set | Powers | A | B | C | D | E |
|---|---|---|---|---|---|---|---|
| Three-power host: Not detected | Set 1 | 3 Voltages | PWR1 | PWR2 | PWR2 | PWR3 | PWR3 |
| Two-power host: Detected | Set 2 | 2 Voltages | PWR1 | PWR2 | PWR2 | PWR1/2 | PWR1 |

(B)

| Notch Detection | PWR Set | Powers | A | B | C | D | E |
|---|---|---|---|---|---|---|---|
| Three-power host: Not detected | Set 1 | 3 Voltages | PWR1 | PWR2 | PWR2 | PWR3 | PWR3 |
| One-power host: Detected | Set 2 | 1 Voltage | PWR1 | PWR1 | PWR1 | PWR1 | PWR1 |

F I G. 30

|  |  | Cards | |
|---|---|---|---|
|  |  | First-type card (3 Voltages) | Second-type card (1 or 2 Voltages) |
| Host | First-type host (3 Voltages) | Available | N/A |
|  | Second-type host (1 or 2 Voltages) | N/A | Available |

F I G. 31

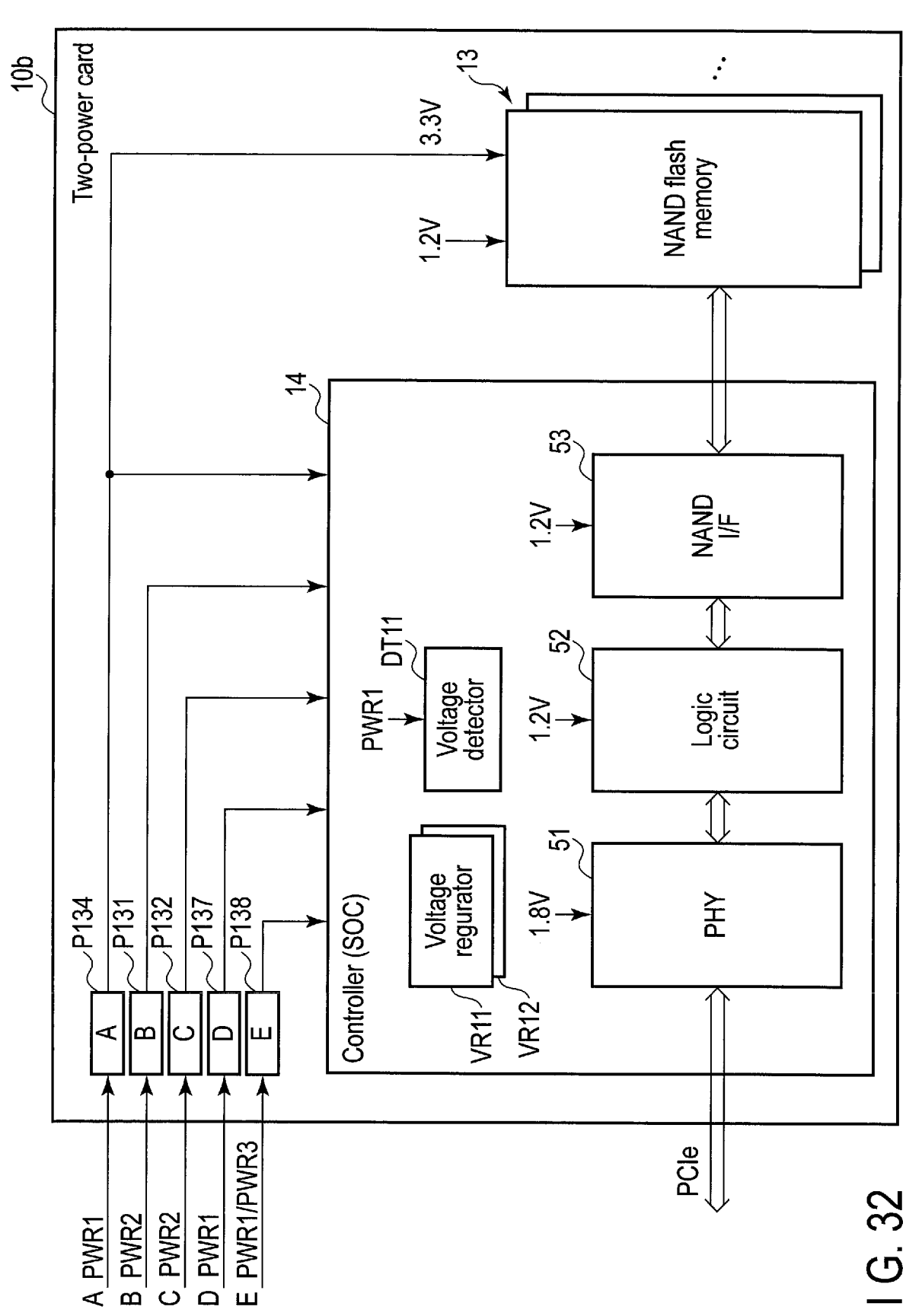
F I G. 32

| DT11 | Detected Host Type |
|---|---|
| Low | First-type host (PWR Set 1) |
| High | Second-type host (PWR Set 2) |

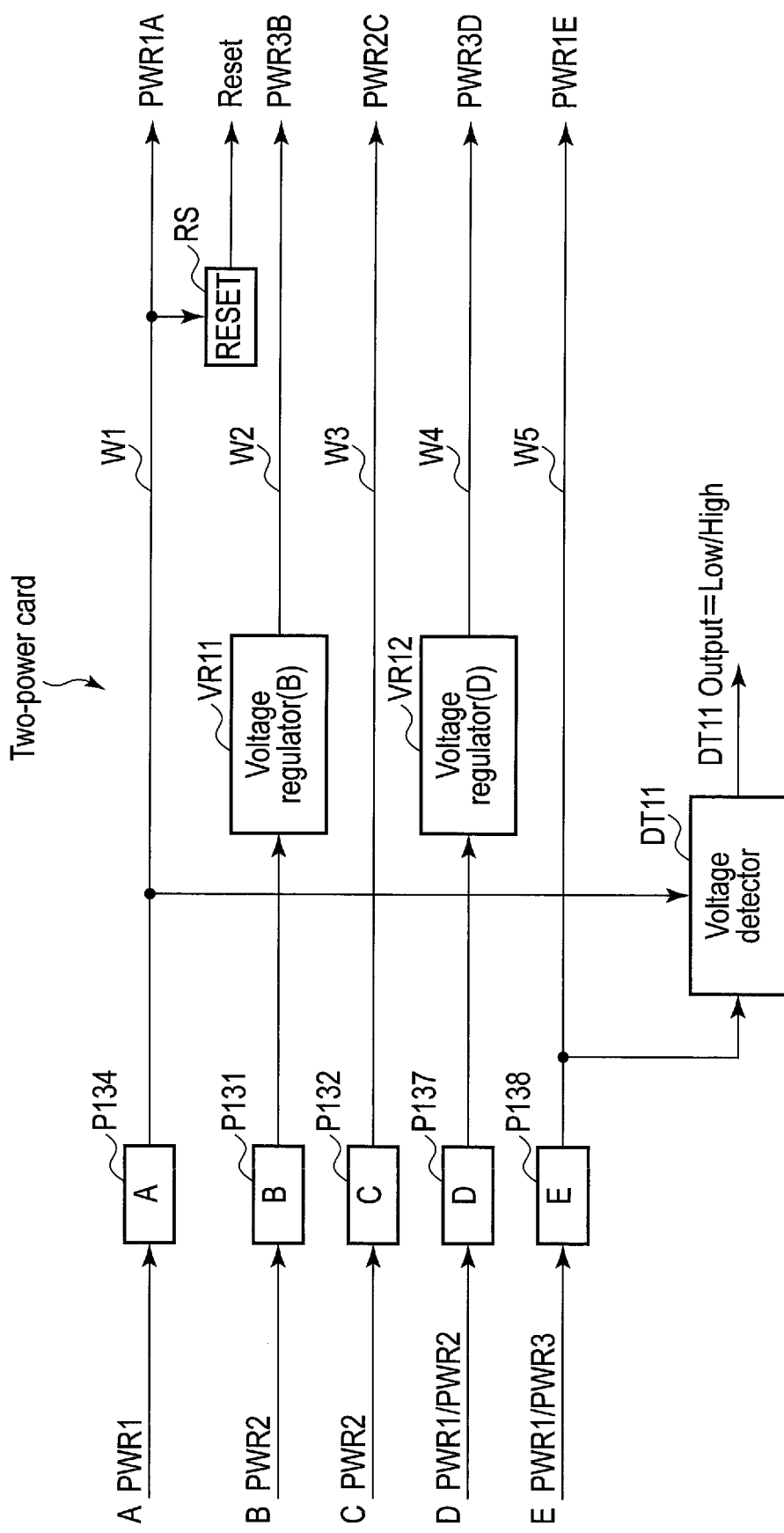
F I G. 36

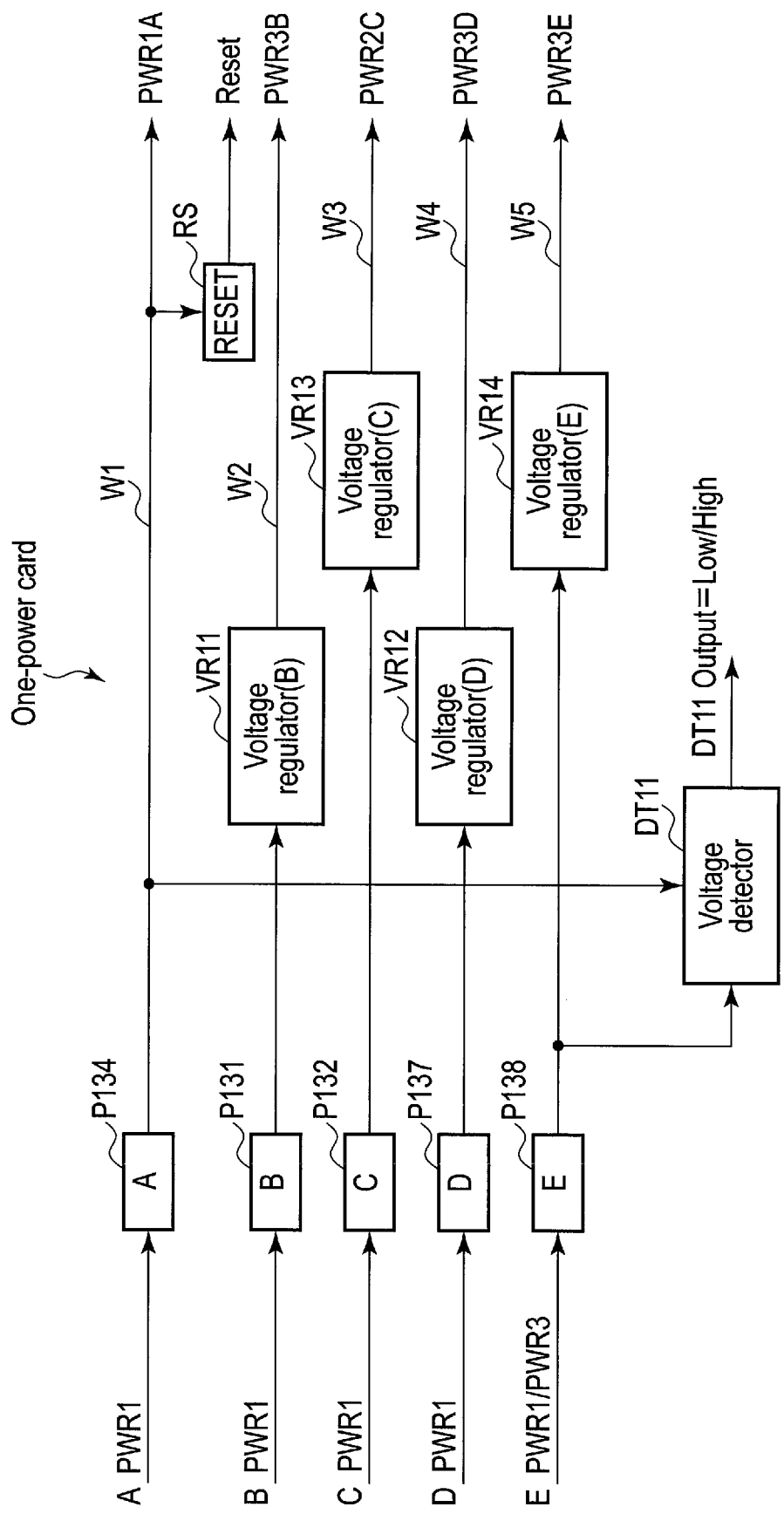
F I G. 37

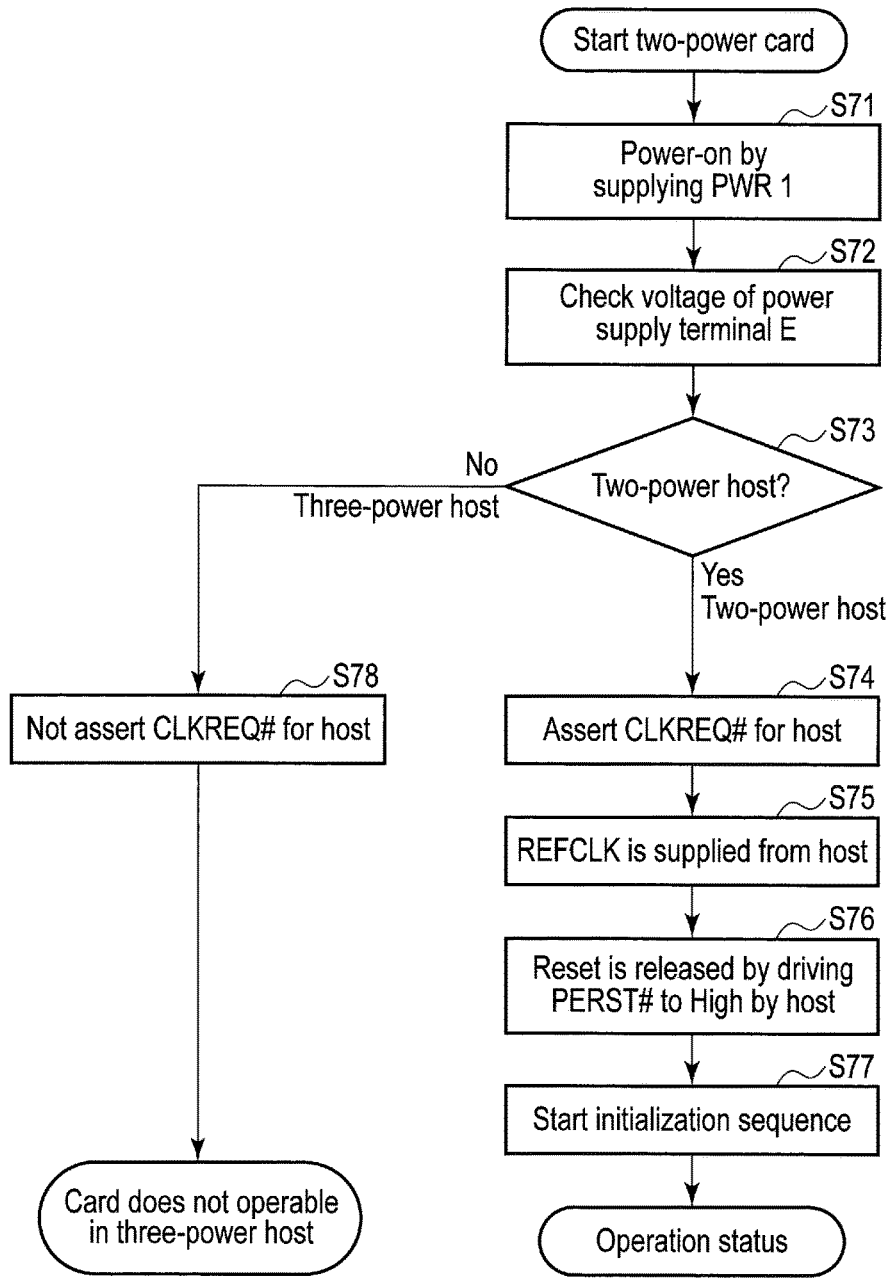
F I G. 38

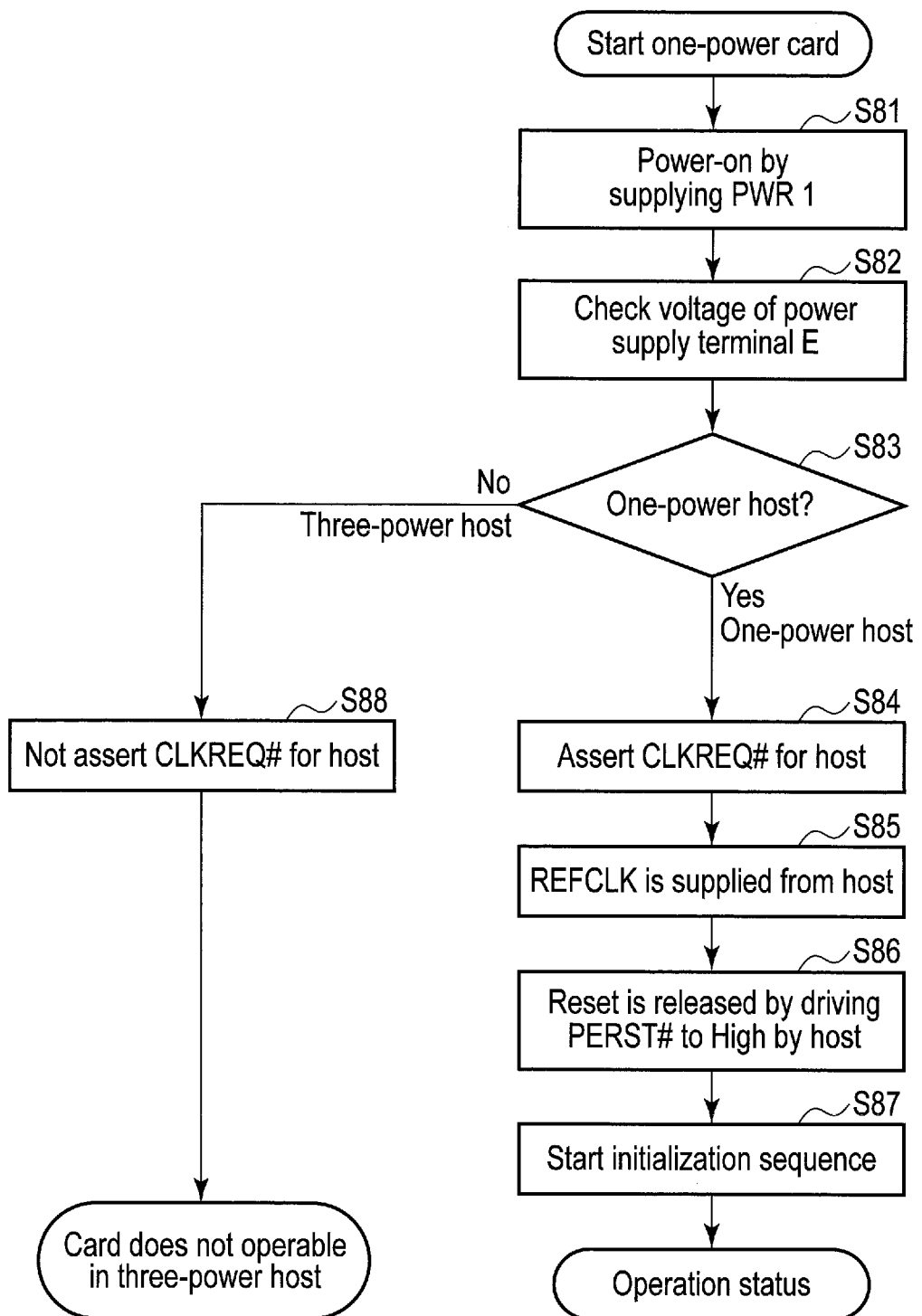
F I G. 39

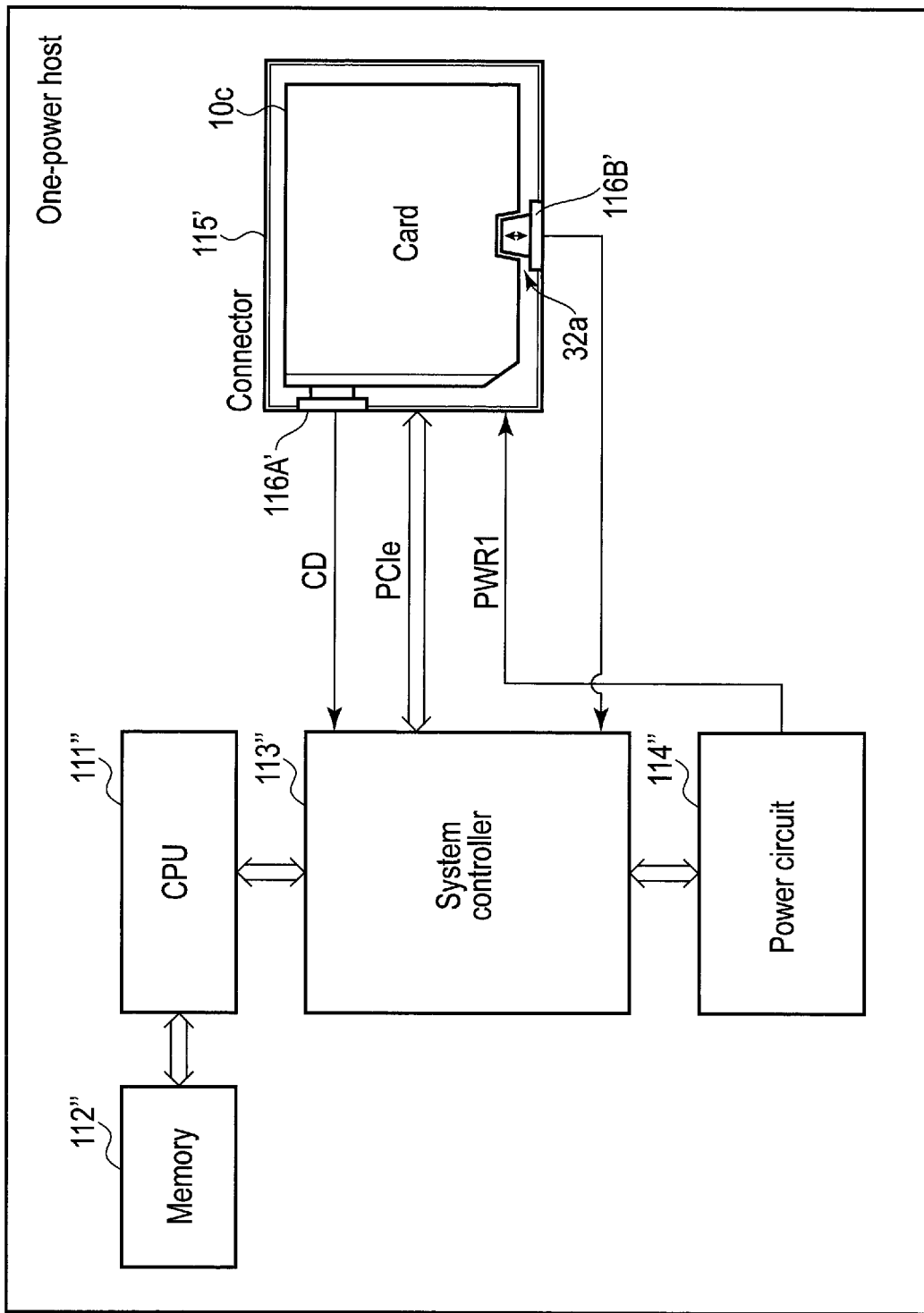
F I G. 41

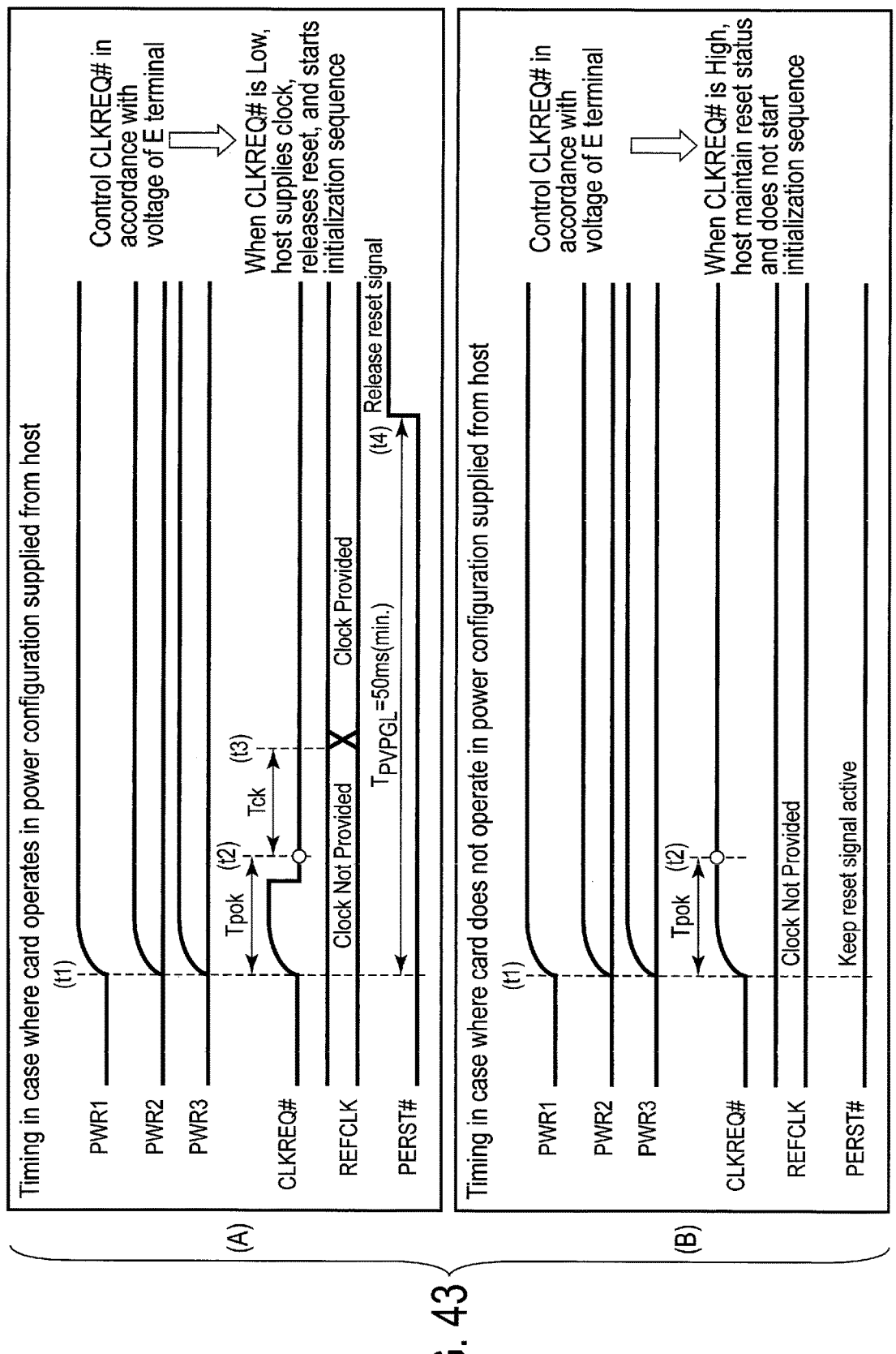
F I G. 43

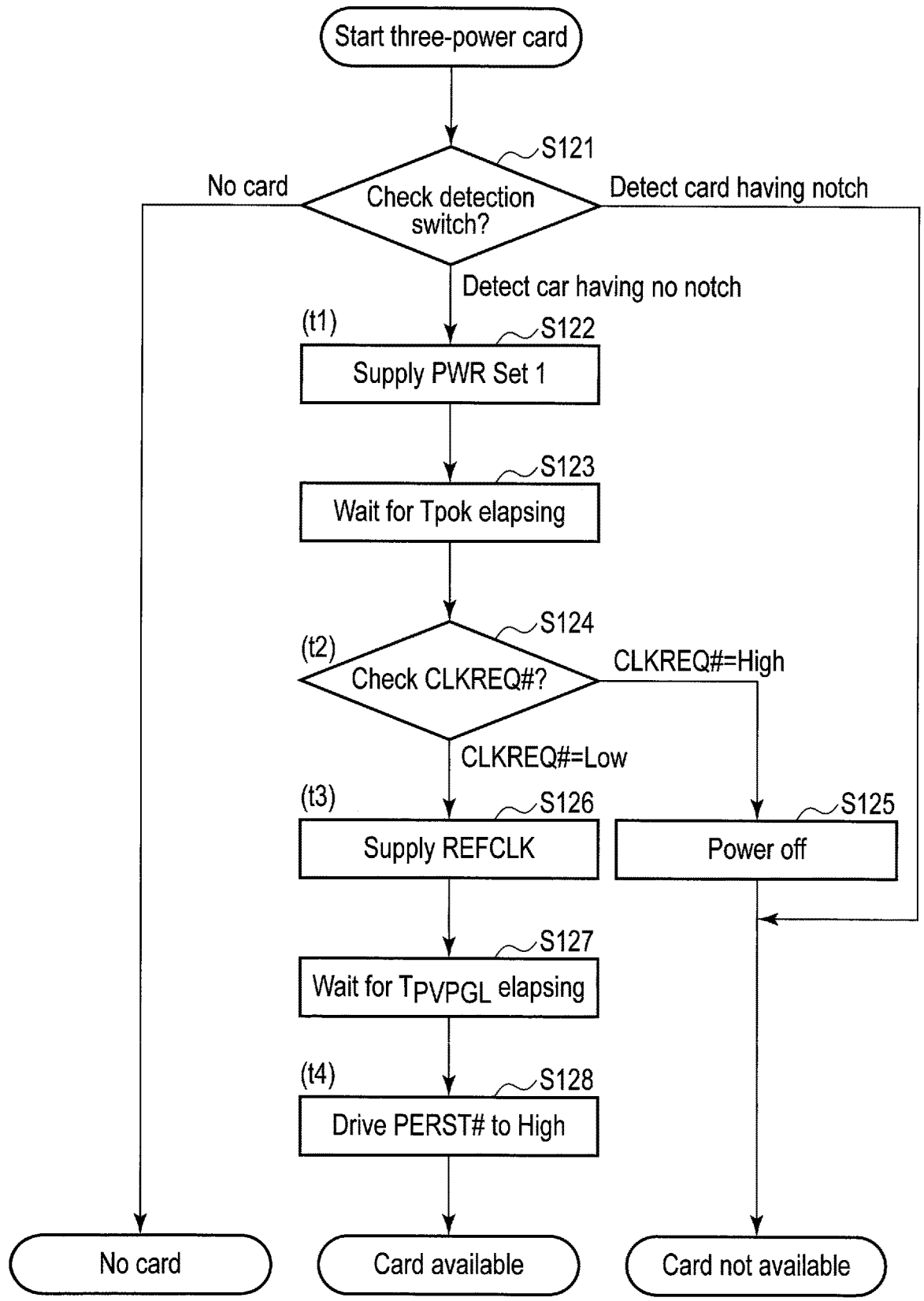
F I G. 44

INFORMATION PROCESSING APPARATUS, INFORMATION PROCESSING SYSTEM, AND SEMICONDUCTOR STORAGE DEVICE

CROSS-REFERENCE TO RELATED APPLICATIONS

This application is a continuation of and claims benefit under 35 U.S.C. § 120 to U.S. application Ser. No. 17/348,082, filed Jun. 15, 2021, which is a continuation of and claims benefit under 35 U.S.C. § 120 to U.S. application Ser. No. 16/817,832, filed Mar. 13, 2020, which is based upon and claims the benefit of priority under 35 U.S.C. § 119 from Japanese Patent Application No. 2019-076690, filed Apr. 12, 2019 and No. 2019-157077, filed Aug. 29, 2019, the entire contents of each of which are incorporated herein by reference.

FIELD

Embodiments described herein relate generally to an information processing apparatus, an information processing system, and a semiconductor storage device.

BACKGROUND

Recently, in accordance with improvement of technologies of a nonvolatile memory such as a NAND flash memory, the storage capacity of the nonvolatile memory has increased. In accordance with this, the semiconductor storage device such as a solid state drive (SSD) has been required to be smaller, thinner, and higher in operation.

Incidentally, in an environment where plural types of semiconductor storage devices different in generation are provided together, a host device and a semiconductor storage device that are different in requirement may be connected.

BRIEF DESCRIPTION OF THE DRAWINGS

FIG. 5 is a diagram illustrating an example of signal assignments to a plurality of terminals of the semiconductor storage device according to the first embodiment.

FIG. 6 is a cross-sectional view illustrating a configuration of the semiconductor storage device according to the first embodiment.

FIG. 7 is a table illustrating an example of a power configuration corresponding to each of three types of host devices (a three-power host, a two-power host, and a one-power host).

FIG. 8 is a table illustrating an example of a power configuration corresponding to each of three types of semiconductor storage devices (a three-power card, a two-power card, and a one-power card).

FIG. 9 is a table illustrating all combinations of the three-power host, two-power host, and one-power host and the three-power card, two-power card, and one-power card, and an operation of a card in each of the combinations.

FIG. 10 is a block diagram illustrating a configuration example of the two-power card.

FIG. 14 is a table illustrating a relationship between combinations of a detected output of the first voltage detector and a detected output of the second voltage detector, and three types of host devices (three-power host, two-power host, and one-power host).

FIG. 20 is a flowchart illustrating a procedure of a process executed by the two-power card applicable to the three-power host.

FIG. 23 is a block diagram showing a configuration example of an information processing apparatus that is a host device according to the first embodiment.

FIG. 24 is a timing chart illustrating a process executed by the card and the host device when the card operates in a power configuration supplied from the host device, and a process executed by the card and the host device when the card does not operate in the power configuration supplied from the host device.

FIG. 27 is a diagram illustrating a configuration example of a connector provided in the host device according to a second embodiment.

FIG. 28 is a table illustrating a correspondence between states of two detection switches arranged in the connector illustrated in FIG. 27 and card detection results.

FIG. 29 is a diagram illustrating a configuration example of another connector provided in the host device according to the second embodiment.

FIG. 30 is a table illustrating a power configuration example of a first-type host corresponding to the first power set (n types of power supply voltages) and a power configuration example of a second-type host corresponding to the second power set (m types of power supply voltages).

FIG. 31 is a table illustrating all combinations of the first-type host, second-type host, first-type card, and second-type card, and an operation of the card in each of the combinations.

FIG. 32 is a diagram illustrating a configuration example of the two-power card that is the second-type card.

FIG. 36 is a diagram illustrating a configuration example of the two-power card that is the second-type card.

FIG. 37 is a diagram illustrating a configuration example of the one-power card that is the second-type card.

FIG. 38 is a flowchart illustrating a procedure of a process executed by the two-power card that is the second-type card.

FIG. 39 is a flowchart illustrating a procedure of a process executed by the one-power card that is the second-type card.

FIG. 41 is a block diagram illustrating a configuration example of an information processing apparatus that is the host device (one-power host) system according to the second embodiment.

FIG. 43 is a timing chart illustrating a process executed by the card and the host device when the card operates in a power configuration supplied from the host device, and a process executed by the card and the host device when the card does not operate in the power configuration supplied from the host device.

FIG. 44 is a flowchart illustrating a procedure of a process executed by the host device (three-power host) according to the second embodiment.

DETAILED DESCRIPTION

Various embodiments will be described hereinafter with reference to the accompanying drawings.

In general, according to one embodiment, an information processing apparatus comprises a connector into which a first-type semiconductor storage device or a second-type semiconductor storage device is capable of being placed. The first-type semiconductor storage device operates with n types of power supply voltages supplied from outside. The second-type semiconductor storage device operates with m types of power supply voltages supplied from outside. The m types of power supply voltages is less than the n types of power supply voltages. n is an integer of 2 or more, and m is an integer of 1 or more and n or less. The information processing apparatus checks whether or not a notch is formed at a predetermined position of a semiconductor storage device placed into the connector when the information processing apparatus is configured to supply the m types of power supply voltages to the second-type semiconductor storage device. The information processing apparatus supplies no power supply voltages to the semiconductor storage device placed into the connector when the notch is not formed at the predetermined position of the semiconductor storage device placed into the connector. The information processing apparatus supplies the m types of power supply voltages to the semiconductor storage device placed into the connector when the notch is formed at the predetermined position of the semiconductor storage device placed into the connector.

First Embodiment

Figure 1:
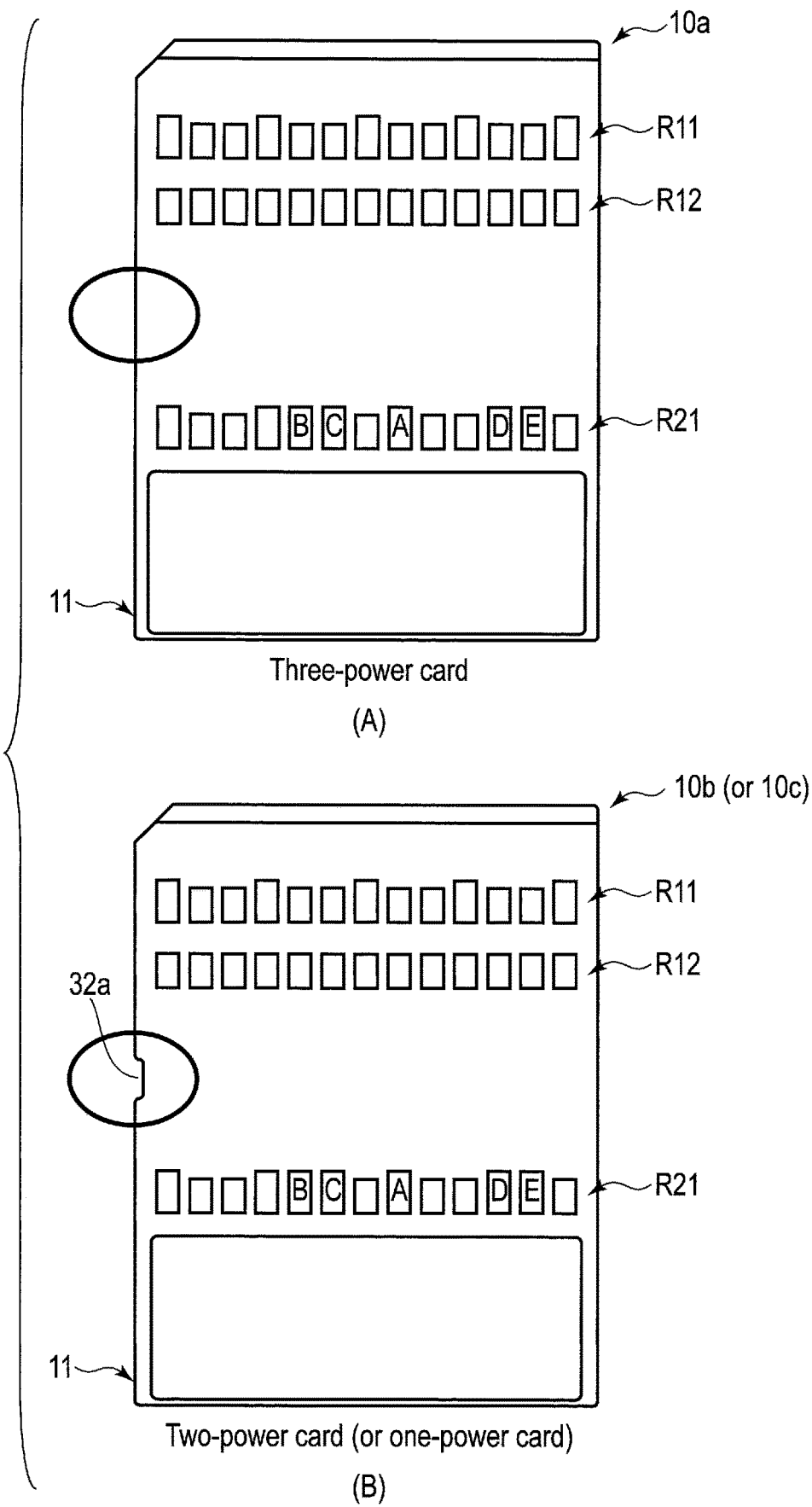
FIG. 1 is an exemplary plan view illustrating outer shapes of a first-generation semiconductor storage device and a semiconductor storage device according to the first embodiment (i.e., a second-generation semiconductor storage device).

FIG. 1 is an exemplary plan view illustrating outer shapes of a first-generation semiconductor storage device and a semiconductor storage device according to the first embodiment (i.e., a second-generation semiconductor storage device).

Each of the first-generation semiconductor storage device and the second-generation semiconductor storage device includes a nonvolatile memory and a controller which controls the nonvolatile memory. Each of these semiconductor storage devices is a storage device configured to write data to a nonvolatile memory and to read data from the nonvolatile memory. Each of the semiconductor storage devices may be implemented as, for example, a solid-state drive (SSD). In this case, the SSD is used as storages of various information processing apparatuses which functions as host devices such as personal computers, mobile devices, video recorders, and vehicle-mounted devices.

Each of the semiconductor storage devices is shaped in a card, and can function as a removable SSD that can be placed into a connector (also referred to as a card connector) in the host device. The connector into which each semiconductor storage device is placed may be a push-push type connector, a push-pull type connector, or a hinge type connector.

The feature of each semiconductor storage device being removable enables capacity upgrade and easy maintenance. The semiconductor storage devices are referred to as cards (or card type storage devices) in the following descriptions.

FIG. 1(A) illustrates an outer shape of a first-generation card 10a. The card 10a is a first-type semiconductor storage device configured to operate with n types of power supply voltages supplied from the outside. In this example, n is an integer of 2 or more.

For example, the first-type semiconductor storage device may be configured to operate with three types of power supply voltages supplied from the outside. The card 10a is referred to as a three-power card in the following descriptions. The three-power card is an example of the first-type semiconductor storage device configured to operate with n types of power supply voltages supplied from the outside.

The three-power card 10a comprises a body 11 shaped in a card. A nonvolatile memory and a controller configured to control the nonvolatile memory are provided inside the body 11. On one surface of the body 11, the terminals may be arranged in three rows, i.e., row R11, row R12, and row R21.

For example, signal terminals for two lanes for a high-speed serial interface such as PCI Express (registered trademark) (PCIe) are arranged in the row R11. Furthermore, signal terminals for two lanes of PCIe are arranged in the row R12. The signal terminals corresponding one lane include two terminals for receiving a receiver differential signal pair, and two terminals for transmitting a transmitter differential signal pair.

In the row R21, a plurality of power supply terminals to which three types of power supply voltages are supplied from the host device are arranged. FIG. 1(A) illustrates an example in which, for example, five power supply terminals are arranged. These power supply terminals are referred to as an A terminal, a B terminal, a C terminal, a D terminal, and an E terminal in the following descriptions.

FIG. 1(B) illustrates outer shapes of second-generation cards 10b and 10c. Each of the cards 10b and 10c is, for example, a new generation card developed after manufacturing and shipment of the three-power card 10a that is the first-generation card.

The card 10b is a second-type semiconductor storage device configured to operate with m types of power supply voltages less than n types of power supply voltages, which are supplied from the outside. In this example, m is an integer smaller than n and larger than or equal to 1. For example, the card 10b may be configured to operate with two types of power supply voltages supplied from the outside. In general, as the number of power supply voltages (i.e., power rails) that need to be supplied from the host device to the card is smaller, the host device can handle the card more easily. The card 10b includes one or more voltage regulators and can generate three types of power supply voltages necessary for operations of the components in the card 10b, from two types of power supply voltages supplied from the host device. The card 10b is referred to as a two-power card in the following descriptions.

The card 10c is also the second-type semiconductor storage device configured to operate with m types of power supply voltages supplied from the outside. For example, the card 10c may be configured to operate with one type of power supply voltage supplied from the outside. The card 10b includes more voltage regulators than those of the two-power card 10b, and can generate three types of power supply voltages necessary for operations of the components in the card 10c, from one type of power supply voltage supplied from the host device. The card 10c is referred to as a one-power card in the following descriptions.

Each of the two-power card 10b and the one-power card 10c has approximately the same outer shape (width, height, thickness, etc.) as the three-power card 10a. That is, each of the two-power card 10b and the one-power card 10c also comprises the body 11 shaped in a card, similarly to the three-power card 10a. A nonvolatile memory and a controller configured to control the nonvolatile memory are provided inside the body 11.

Similarly to the three-power card 10a, for example, the terminals arranged in three rows, i.e., the row R11, row R12, and row R21, are arranged on one surface of the body 11 of each of the two-power card 10b and the one-power card 10c.

The signal terminals for two lanes of PCIe are arranged in the row R11, and the signal terminals for two lanes of PCIe are further arranged in the row R12. In the row R21, the same number of power supply terminals as the number of the power supply terminals of the three-power card 10a, i.e., the A terminal, the B terminal, the C terminal, the D terminal, and the E terminal are arranged.

In general, when the production and shipment of the second-generation cards such as the two-power card 10b and the one-power card 10c are started after time has passed since the start of production and shipment of the first-generation cards such as the three-power card 10a, the first-generation cards and the second-generation cards different in specifications exist together.

For this reason, for example, in the production line of producing the host device such as the information processing apparatus, production and an operation test of the first-type host configured to supply n types of power supply voltages, and production and an operation test of the second-type host configured to supply m types of power supply voltages are often executed.

The first-type host is an information processing apparatus configured to supply n types of power supply voltages to the first-generation card placed into the connector in the host device. Examples of the first-type host include the three-power host that supplies three types of power supply voltages for the three-power card 10a to the card placed into the connector.

The second-type host is an information processing apparatus configured to supply m types of power supply voltages to the second-generation card placed into the connector in the host device. Examples of the second-type host include the two-power host configured to supply two types of power supply voltages for the two-power card 10b to the card placed into the connector, or the one-power host configured to supply one type of power supply voltage for the one-power card 10c to the card placed into the connector.

When the second-generation card has the same card shape as the first-generation card, the operation test of the first-type host may be executed in a state in which the second-generation card is erroneously placed into the connector of the first-type host, or the operation test of the second-type host may be executed in a state in which the first-generation card is erroneously placed into the connector of the second-type host, in the production line.

In the operation test of the host device, the host device is powered on, and the host device thereby supplies several types of power supply voltages corresponding to the type of the host device to the card. When the operation test of the host device is executed in a state where the power supply voltages supplied from the host device do not match the card power configuration, problems that the card is broken or large current flows to the card to ignite may occur. This is because the initialization sequence to enable data to be transferred between the host device and the card may be executed in a state in which the power supply voltage supplied from the host device does not match the power configuration of the card, and the card may start the operation in a state in which a power supply voltage different from an expected power supply voltage is applied to each component in the card. In this case, inconvenience such as breakage of the card or ignition may occur.

Therefore, in the first embodiment, as illustrated in FIG. 1(B), at a predetermined position on a side edge of the second-generation card (i.e., two-power card 10b and one-power card 10c), a notch 32a that is a mechanical identifier indicating that this card is the second-generation card (i.e., second-type semiconductor storage device) is formed. The predetermined position on the side edge where the notch 32a is formed may be a position between the rows R12 and R21, for example, a middle position between the rows R12 and R21. In contrast, as illustrated in FIG. 1(A), the notch 32a is not formed at the predetermined position on the side edge of the first-generation card (i.e., the three-power card 10a).

In the first embodiment, the information processing apparatus which functions as the second-type host comprises a function of checking whether or not the notch 32a is formed on the card placed into the connector in the information processing apparatus or not. When the notch 32a is formed on the card placed into the connector, the information processing apparatus recognizes the card as a second-generation card (second-type semiconductor storage device) and supplies m types of power supply voltages to the card placed into the connector.

In contrast, when the notch 32a is not formed on the card placed into the connector, the information processing apparatus recognizes the card as a first-generation card (first-type semiconductor storage device) and does not supply the power supply voltages to the card placed into the connector.

Thus, even when the first-generation card is placed into the second-type host, inconvenience such as breakage of the first-generation card or ignition can be prevented from occurring.

The information processing apparatus that functions as the second-type host may comprise a connector into which the first-generation card having no notch 32a cannot be placed.

In addition, in the first embodiment, the second-generation card comprises a function of discriminating the power configuration (i.e., the first-type host or the second-type host) of the host device into which the second-generation card is placed, by checking several power supply voltages supplied to the card.

Thus, by having the ability to discriminate the power configuration of the host device, the second-generation card can execute a predetermined measure for protecting itself from its abnormal operation or breakage even when the second-generation card is placed into the first-generation host (i.e., first-type host).

Configuration examples of the three-power card 10a, the two-power card 10b, and the one-power card 10c will be described below.

Figure 2:
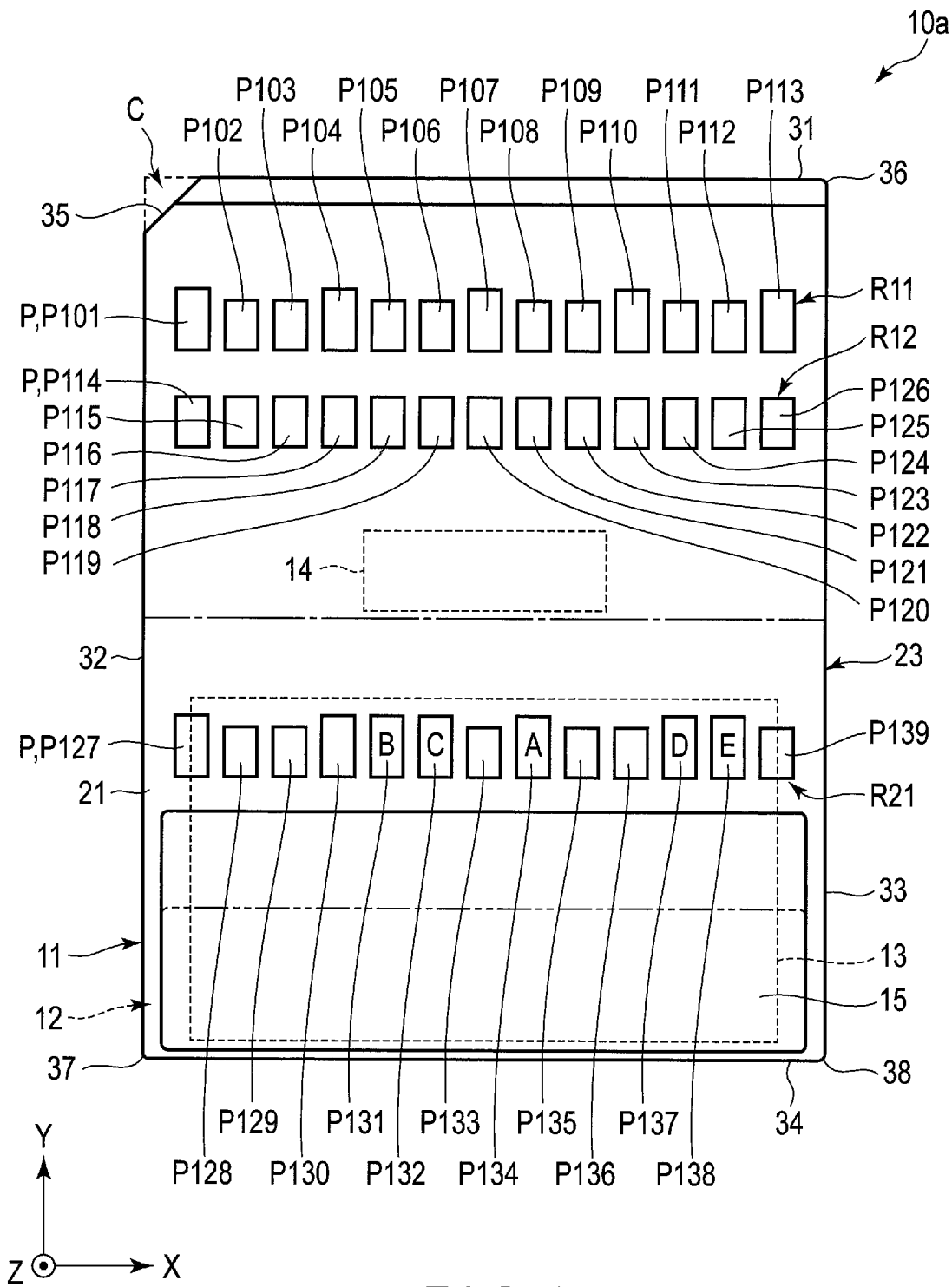
FIG. 2 is a plan view illustrating an example of the outer shape of the first-generation semiconductor storage device and an arrangement of a plurality of terminals.
Figure 3:
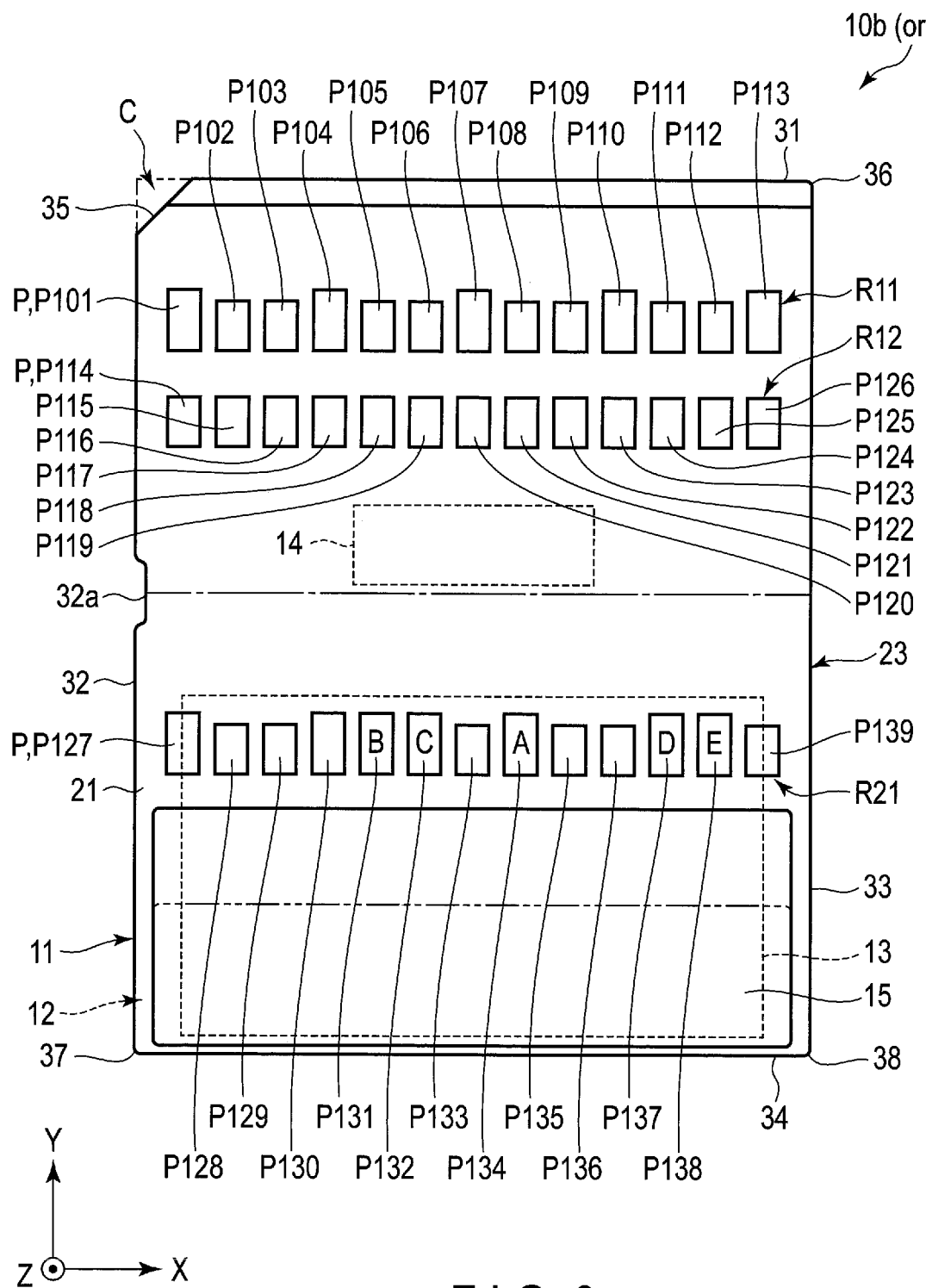
FIG. 3 is a plan view illustrating an example of the outer shape of the semiconductor storage device and an arrangement of a plurality of terminals according to the first embodiment.
Figure 4:
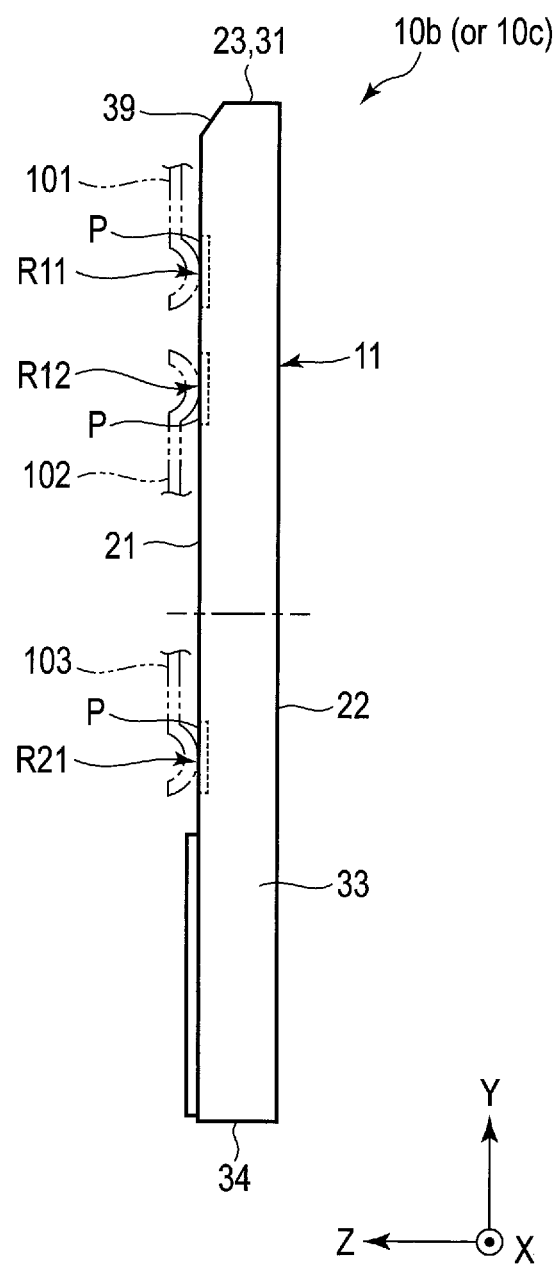
FIG. 4 is an exemplary side view illustrating the semiconductor storage device according to the first embodiment.

FIG. 2 is a plan view illustrating an example of the outer shape of the three-power card 10a and an arrangement of a plurality of terminals. FIG. 3 is a plan view illustrating an example of the outer shape of the two-power card 10b (or the one-power card 10c) and an arrangement of a plurality of terminals. FIG. 4 is an exemplary side view illustrating the two-power card 10b (or the one-power card 10c).

As illustrated in each figure, an X-axis, a Y-axis, and a Z-axis are defined. The X-axis, the Y-axis, and the Z-axis are orthogonal to each other. The X-axis extends along the width of each of the three-power card 10a, the two-power card 10b, and the one-power card 10c. The Y-axis extends along the length (height) of each of the three-power card 10a, the two-power card 10b, and the one-power card 10c. The Z-axis extends along the thickness of each of the three-power card 10a, the two-power card 10b, and the one-power card 10c.

The three-power card 10a, the two-power card 10b, and the one-power card 10c have basically the same outer shape and terminal arrangement except for a feature that the three-power card 10a does not have the notch 32a and each of the two-power card 10b and the one-power card 10c has the notch 32a.

Therefore, the outer shape and terminal arrangement of the two-power card 10b will be mainly described below with reference to FIG. 3 and FIG. 4.

The two-power card 10b includes the body 11, a printed circuit board 12, a NAND flash memory 13, a controller 14, and a protection sheet 15. The NAND flash memory 13 is an example of a nonvolatile memory.

The two-power card 10b and the body 11 are formed in a shape of, for example, an approximately rectangular plate extending in the Y-axis direction. The Y-axis direction is a longitudinal direction of the two-power card 10b and the body 11.

As illustrated in FIG. 4, the body 11 is shaped in a plate and has a first surface 21, a second surface 22, and an outer edge 23. The first surface 21 and the second surface 22 are formed in an approximately square (rectangular) shape extending in the Y-axis direction. That is, the Y-axis direction is also the longitudinal direction of the first surface 21 and the second surface 22.

The first surface 21 is an approximately plane surface facing a positive direction of the Z axis. As illustrated in FIG. 4, the second surface 22 is a surface which is located on the opposite side to the first surface 21 and is approximately plane facing a negative direction of the Z axis.

The outer edge 23 is provided between the first surface 21 and the second surface 22, and connected to an edge of the first surface 21 and an edge of the second surface 22. As illustrated in FIG. 3, the outer edge 23 includes a first edge 31, a second edge 32, a third edge 33, a fourth edge 34, a first corner part 35, a second corner part 36, a third corner part 37, and a fourth corner part 38.

The first edge 31 extends in the X-axis direction to face in the positive direction of the Y-axis. The X-axis direction is a lateral direction of the first surface 21 and the second surface 22, and includes the positive direction of the X-axis and the negative direction of the X-axis.

The second edge 32 extends in the Y-axis direction to face in the negative direction of the X-axis. A recessed notch 32a is provided on the second edge 32. The third edge 33 is located on a side opposite to the second edge 32 to extend in the Y-axis direction and face in the positive direction of the X-axis. The fourth edge 34 is located on a side opposite to the first edge 31 to extend in the X-axis direction and face in the negative direction of the Y-axis.

The length of each of the second edge 32 and the third edge 33 is longer than the length of each of the first edge 31 and the fourth edge 34. The first edge 31 and the fourth edge 34 form shorter sides of the approximately rectangular two-power card 10b. The second edge 32 and the third edge 33 form longer sides of the approximately rectangular two-power card 10b.

The first corner part 35 is a corner part between the first edge 31 and the second edge 32 to connect an end of the first edge 31 in the negative direction of the X-axis and an end of the second edge 32 in the positive direction of the Y-axis.

The first corner part 35 extends straight between the end of the first edge 31 in the negative direction of the X-axis and the end of the second edge 32 in the positive direction of the Y-axis direction. A corner between the first edge 31 and the second edge 32 is set to what is called corner chamfering of C1.1 (also referred to as C chamfering) and the first corner part 35 is thereby provided. According to alternative expression, the first corner part 35 is a chamfering part C formed between the first edge 31 and the second edge 32.

The second corner part 36 is a corner part between the first edge 31 and the third edge 33 to connect an end of the first edge 31 in the positive direction of the X-axis and an end of the third edge 33 in the positive direction of the Y-axis. The second corner part 36 is an arch-shaped corner portion that extends between the end of the first edge 31 in the positive direction of the X-axis and the end of the third edge 33 in the positive direction of the Y-axis direction. A corner between the first edge 31 and the third edge 33 is set to what is called round chamfering of R0.2 (also referred to as R chamfering) and the second corner part 36 is thereby provided. Thus, the shapes of the first corner part 35 and the second corner part 36 are different from each other.

The third corner part 37 connects the end of the second edge 32 in the negative direction of the Y-axis and the end of the fourth edge 34 in the negative direction of the X-axis direction. The fourth corner part 38 connects the end of the third edge 33 in the negative direction of the Y-axis and the end of the fourth edge 34 in the positive direction of the X-axis direction. Each of the third corner part 37 and the fourth corner part 38 archly are arch-shaped corner portions.

In the body 11, the first surface 21, and the second surface 22, the length in the Y-axis direction is set to approximately 18±0.1 mm and the length in the X-axis direction is set to approximately 14±0.1 mm. That is, a distance between the first edge 31 and the fourth edge 34 in the Y-axis direction is set to approximately 18±0.1 mm and a distance between the second edge 32 and the third edge 33 in the X-axis direction is set to approximately 14±0.1 mm. The lengths of the body 11, the first surface 21, and the second surface 22 in the X-axis direction and the Y-axis direction are not limited to this example.

As illustrated in FIG. 4, the body 11 further includes an inclined portion 39. The inclined portion 39 is a corner part between the first surface 21 and the first edge 31, and extends straight between the end of the first surface 21 in the positive direction of the Y-axis and the end of the first edge 31 in the positive direction of the Z-axis.

As illustrated in FIG. 3, the printed circuit board 12, the NAND flash memory 13, and the controller 14 are provided inside the body 11. The printed circuit board 12, the NAND flash memory 13, and the controller 14 may be contained in the body 11 or embedded in the body 11. The NAND flash memory 13 and the controller 14 are mounted on a surface of the printed circuit board 12.

The printed circuit board 12 may constitute a part of the body 11 such that a back surface of the printed circuit board 12 is exposed. In this case, the back surface of the printed circuit board 12 can function as the first surface 21.

The controller 14 controls the NAND flash memory 13, and the whole two-power card 10*b* including the NAND flash memory 13. For example, the controller 14 can execute read/write control for the NAND flash memory 13 and communication control with the outside. This communication control includes protocol control conforming to PCIe.

The protection sheet 15 is affixed to the first surface 21. The protection sheet 15 seals, for example, a test terminal exposed from the first surface 21, or the like.

The two-power card 10*b* further includes a plurality of terminals P. The terminals P are often referred to as pads. In the first embodiment, the two-power card 10*b* includes 26 or 39 terminals P. The number of terminals P is a mere example and is not limited to this example. That is, the number of terminals P may be smaller than 26 or larger than 39. The terminals P are provided on, for example, a back surface of the printed circuit board 12. The terminals P are constituted on the printed circuit board 12 and exposed from the first surface 21. In the first embodiment, the terminals P are not provided on the second surface 22 and, for example, the surface can be used as a printed surface or heat radiation surface. In R11 and R12, thirteen pads are adopted as the pads that enable two lanes of PCIe to be mounted in each row.

The terminals P are aligned in three rows to form rows R11, R12, and R21. Terminals belonging to the row R11 and the R12 are used as signal terminals to transmit differential signal pairs of four lanes conforming to the PCIe standard. The terminal group belonging to the row R21 is mainly used as the power supply terminals and the other signal terminals. When the number of lanes supported by the two-power card 10*b* is two, the two-power card 10*b* may include 26 terminals P arranged in two rows to form the rows R11 and R12. The terminal group belonging to the row R11 is used as signal terminals to transmit differential signal pairs of two lanes.

As illustrated in FIG. 3, the row R11 includes 13 terminals P101 to P113 spaced apart from each other and arranged in the X-axis direction, at positions closer to the first edge 31 than to the fourth edge 34. The terminals P101 to P113 are arranged in the X-axis direction along the first edge 31 at positions near the first edge 31.

The row R12 includes 13 terminals P114 to P126 spaced apart from each other and arranged in the X-axis direction, at positions closer to the first edge 31 than to the fourth edge 34. The terminals P114 to P126 forming the row R12 are arranged at positions farther from the first edge 31 than from the row R11. For this reason, the row R12 is farther from the first edge 31 than from the row R11. The row R11 and the row R12 are spaced apart with a predetermined short interval and arranged in the Y-axis direction.

The row R21 includes 13 terminals P127 to P139 spaced apart from each other and arranged in the X-axis direction, at positions closer to the fourth edge 34 than to the first edge 31. The terminals P127 to P139 forming the row R21 are located at positions closer to the fourth edge 34 than to the first edge 31. According to the other expressions, the terminals P127 to P139 forming the row R21 are arranged between a center line (represented by a one-dot chain line) between the two-power card 10*b* and the body 11 in the Y-axis direction, and the fourth edge 34. For this reason, an interval between the row R12 and the row R21 becomes wider. In the first embodiment, the terminals P forming the row R21 is remote from the center line.

A distance between the terminals P adjacent in the X-axis direction is determined according to, for example, the number of terminals P when a length between the second edge 32 and the third edge 33 is constant. Furthermore, the maximum number of terminals P arranged in the X-axis direction is determined according to the minimum distance between the terminals P adjacent in the X-axis direction. The distances between the terminals P in the X-axis direction may be equal or different. In the first embodiment, the number of the terminals P in the rows R11, R12, and R21 is equal. For this reason, the distance between all the terminals P is constant.

In each of the rows R11, R12, and R21, the terminals P are arranged such that edges of the terminals P are aligned in a negative direction of the Y-axis.

At the signal terminals P of the row R11 and the row R12, the length of the terminals P in the Y-axis direction is set to be equal. Electric properties of the terminals P for data transfer of the row R11 and the row R12 can be thereby made similar.

Moreover, one terminal P may protrude in the positive direction of the Y-axis rather than the edges of the other terminals P in the positive direction of the Y-axis. For example, when the terminal P for power supply and the terminal P for GND protrude rather than the signal terminals P, the terminals P for power supply and for GND are in contact with a lead frame of the connector faster than the signal terminals P, in a lateral insertion connector to which the two-power card 10*b* is inserted in the positive direction of the Y axis. Thus, the GND level of the host device and the GND level of the two-power card 10*b* become equivalent and the electric level of the controller 14 can be made stable.

A large number of signals can hardly be output from the lateral insertion type connector. For this reason, it is assumed that the row R12 of the two-power card 10b is not used for data transfer, in the lateral insertion type connector. Thus, the length of the terminals P of the row R21 in the Y-axis direction is set to be equal. On the other hand, in the row R11 and the row R21, the length of the terminals P for GND and the power supply terminals P in the Y-axis direction is set to be longer than that of the other signal terminals P.

The one-power card 10c has quite the same shape as the two-power card 10b. As illustrated in FIG. 2, the notch 32a is not provided on a longer side 32 of the three-power card 10a.

FIG. 5 illustrates an example of signal assignments with respect to a plurality of terminals P. As illustrated in FIG. 5, signals used for high-speed serial data transfer of PCIe are assigned to the terminals P of the row R11 and the row R12, in the first embodiment. In PCIe, differential signal pairs can be used for data transfer.

In the row R11, ground (GND) is assigned to the terminals P101, P104, P107, P110, and P113, receiver differential signals PERp0, PERn0, PERp1, and PERn1 are assigned to the terminals P102, P103, P108, and P109, and transmitter differential signals PETp0, PETn0, PETp1, and PETn1 are assigned to the terminals P105, P106, P111, and P112.

In the row R12, ground (GND) is assigned to the terminals P114, P117, P120, P123, and P126, receiver differential signals PERp2, PERn2, PERp3, and PERn3 are assigned to the terminals P115, P116, P121, and P122, and transmitter differential signals PETp2, PETn2, PETp3, and PETn3 are assigned to the terminals P118, P119, P124, and P125.

A pair of terminals P102 and P103 to which the receiver differential signals PERp0 and PERn0 are located between two terminals P101 and P104 to which the ground is assigned and are sandwiched between the terminals P101 and P104. A pair of terminals P105 and P106 to which the transmitter differential signals PETp0 and PETn0 are located between two terminals P104 and P107 to which the ground is assigned and are sandwiched between the terminals P104 and P107.

A pair of terminals P108 and P109 to which the receiver differential signals PERp1 and PERn1 are located between two terminals P107 and P110 to which the ground is assigned and are sandwiched between the terminals P107 and P110. A pair of terminals P111 and P112 to which the transmitter differential signals PETp1 and PETn1 are located between two terminals P110 and P113 to which the ground is assigned and are sandwiched between the terminals P110 and P113.

A pair of terminals P115 and P116 to which the receiver differential signals PERp2 and PERn2 are located between two terminals P114 and P117 to which the ground is assigned and are sandwiched between the terminals P114 and P117. A pair of terminals P118 and P119 to which the transmitter differential signals PETp2 and PETn2 are located between two terminals P117 and P120 to which the ground is assigned and are sandwiched between the terminals P117 and P120.

A pair of terminals P121 and P122 to which the receiver differential signals PERp3 and PERn3 are located between two terminals P120 and P123 to which the ground is assigned and are sandwiched between the terminals P120 and P123. A pair of terminals P124 and P125 to which the transmitter differential signals PETp3 and PETn3 are located between two terminals P123 and P126 to which the ground is assigned and are sandwiched between the terminals P123 and P126.

In PCIe, one lane can be composed of a set of the transmitter differential signals PETp0 and PETn0 and the receiver differential signals PERp0 and PERn0. In addition, in PCIe, one lane can be further composed of a set of the transmitter differential signals PETp1 and PETn1 and the receiver differential signals PERp1 and PERn1. Similarly, one lane can be further composed of a set of the transmitter differential signals PETp2 and PETn2 and the receiver differential signals PERp2 and PERn2, and one lane can be further composed of a set of the transmitter differential signals PETp3 and PETn3 and the receiver differential signals PERp3 and PERn3.

In the first embodiment, two lanes are assigned to the terminals P forming the row R11, and two lanes are assigned to the terminals P forming the row R12.

The control signals other than the differential signal of PCIe are assigned to the terminals P in the row R21. In the row R21, GND is assigned to the terminals P127 and P130, and reference clock signals (i.e., PCIe reference differential clock signals) REFCLKp and REFCLKn are assigned to the terminals P128 and P129. Furthermore, a reset signal PERST # is assigned to the terminal P133, a clock request signal CLKREQ # is assigned to the terminals P135, and control signals CNTA and CNTB are assigned to the terminals P136 and P139.

In any one of the three-power card 10a, the two-power card 10b, and the one-power card 10c, the terminals P131, P132, P134, P137, and P138 are used as five power supply terminals described above.

For example, in the three-power card 10a, a first power supply voltage (power rail) PWR1 is assigned to the terminal P134 (A terminal), a second power supply voltage (power rail) PWR2 is assigned to the terminal P131 (B terminal) and the terminal P132 (C terminal), and a third power supply voltage (power rail) PWR3 is assigned to the terminal P137 (D terminal) and the terminal P138 (E terminal).

The three-power host can supply the power supply voltage PWR1 serving as the first power supply voltage to the terminal P134. The power supply voltage PWR1 is set to 3.3V in the first embodiment. The three-power host can supply the power supply voltage PWR2 serving as the second power supply voltage to the terminals P131 and P132. The power supply voltage PWR2 is set to 1.8V in the first embodiment. The three-power host can supply the power supply voltage PWR3 serving as the third power supply voltage to the terminals P137 and P138. The power supply voltage PWR3 is set to 1.2V in the first embodiment.

The two-power card 10b operates with the only power supply voltages PWR1 and PWR2 supplied from the host device, and does not need supply of the power supply voltage PWR3 from the host device. The one-power card 10c operates with the only power supply voltage PWR1 supplied from the host device, and does not need supply of the power supply voltages PWR2 and PWR3 from the host device.

In any one of the three-power card 10a, the two-power card 10b, and the one-power card 10c, since plural terminals P are provided as the power supply terminals, the current can be dispersed, the current flowing to each terminal can be made smaller, and a drop voltage based on a resistance component formed between the power supply circuit of the host device and the power supply terminal can be made smaller.

The reference clock signal REFCLKp/n constitutes the differential clock signal. Each of the three-power card 10a, the two-power card 10b, and the one-power card 10c does not need installment of a high-precision clock oscillator and can facilitate synchronization with the host device into which the card is placed, by transmitting the clock signals having a frequency of MHz band from the host device to the terminals P128 and P129. In addition, occurrence of electromagnetic interference (EMI) can be suppressed by lowering the frequencies of the clock signals used for transmission to the terminals P128 and P129 to make their waveforms similar to a sine wave. A method of suppressing EMI by spreading spectrum through clock fluctuation, which is called spread spectrum clocking (SSC), may be adopted. Each of the cards generates high frequencies of the differential signals by which the terminals P102, P103, P105, P106, P108, P109, P111, P112, P115, P116, P118, P119, P121, P122, P124, and P125 are used for transmission, by multiplying the received clock by the PLL circuit.

The reset signal PERST # is a PCIe reset signal that can be used by the host device to start and reset the card. The clock request signal CLKREQ # is a control signal that requests the host device to supply the reference clock. The clock request signal CLKREQ # is once set to High level (i.e., becomes High by pull-up for open drain) after the card is power one, but the signal is driven to a Low level when the power supply voltage inside the card becomes stable and the card becomes capable of receiving the clock. When detecting that CLKREQ #becomes Low level, the host device starts supply of the reference clock. In addition, the host device can use the clock request signal CLKREQ # as a signal to control the card to transition to the power saving mode of the card and return from the power saving mode. The card can reduce power consumption of PHY by entering a power saving mode when the card is in an idle state of not executing memory access. The host device can stop the reference clock signal REFCLKp/n in the power saving mode, and the card also has a mode of turning off the common power supply of PHY and can remarkably reduce the power consumption.

The reset signal PERST # and the clock request signal CLKREQ # are single-ended signals and are defined as side-band signals of PCIe.

Each card is placed into the connector in the host device. This connector is a card connector to connect the card to the system board of the host device, and this connector may be, for example, a push-push type connector, a push-pull type connector or a hinge type connector.

When the card (for example, two-power card 10b) is inserted into the connector in the host device, lead frames 101, 102, and 103 of the connector are brought into contact with the terminals P forming the row R11, row R12, and row R21, respectively, as illustrated in FIG. 4.

When the lead frames 101, 102, and 103 are brought into contact with the terminals P, the controller (hereinafter referred to as a system controller) arranged on the system board of the host device is brought into electric contact with the controller 14 of the card (for example, two-power card 10b).

FIG. 6 illustrates a configuration example of the two-power card 10b.

In two-power card 10b, the NAND flash memory 13 and the controller 14 are arranged on the printed circuit board 12. The NAND flash memory 13 may include a plurality of NAND flash memory chips stacked. In general, the NAND flash memory chips operate by interleaving operations. The controller 14 is an LSI.

The two-power card 10b is implemented as a package (memory package) shaped in a card, and the NAND flash memory 13 and the controller 14 are covered with a mold resin 40 that is molded to form the body 11 of the two-power card 10b and are thereby sealed.

The one-power card 10c is also implemented as a package (memory package) shaped in a card, similarly to the two-power card 10b, and the three-power card 10a is also implemented as a package (memory package) shaped in a card, similarly to the two-power card 10b.

FIG. 7 illustrates an example of a power configuration corresponding to each of three types of host devices (three-power host, two-power host, and one-power host).

FIG. 7(A) illustrates an example of a host power configuration to reinforce the power supply voltage PWR1, and FIG. 7(B) illustrates an example of a host power configuration to reinforce the power supply voltage PWR2.

<Host that does not Recognize Notch>

The three-power host does not comprise a function (i.e., notch detection) of checking whether or not the notch 32a (i.e., mechanical identifier indicative of a two-power card or a one-power card) is formed on the card placed into the connector in the three-power host. Therefore, the three-power host supplies three power supply voltages (PWR1, PWR2, and PWR3) to the card placed into the connector at any time, irrespective of the type of the card placed into the connector.

In case of the three-power host in FIGS. 7(A) and (B), the power supply voltage PWR1 (3.3V) is assigned to the A terminal, the power supply voltage PWR2 (1.8V) is assigned to the B terminal and the C terminal, and the power supply voltage PWR3 (1.2V) is assigned to the D terminal and the E terminal. Therefore, the three-power host supplies the power supply voltage PWR1 (3.3V) to the A terminal, the power supply voltage PWR2 (1.8V) to each of the B terminal and the C terminal, and the power supply voltage PWR3 (1.2V) to each of the D terminal and the E terminal.

<Host that Recognizes Notch>

(Two-Power Host)

The two-power host comprises a function (i.e., notch detection) of checking whether or not the notch 32a is formed on the card placed into the connector. The two-power host supplies two-power supply voltage (PWR1 and PWR2) to the card placed into the connector only when the notch 32a is formed on the card placed into the connector.

The two-power host does not supply any power supply voltages to the card on which the notch 32a is not formed, because the card on which the notch 32a is not formed cannot be placed into the connector. In this case, the A terminal, the B terminal, the C terminal, the D terminal, and the E terminal are set to 0V.

In the power configuration in FIG. 7(A), in the two-power host, the power supply voltage PWR1 is assigned to each of the D terminal and the E terminal to which the power supply voltage PWR3 is assigned in the three-power host. That is, in the power configuration in FIG. 7(A), the D terminal and the E terminal to which the power supply voltage PWR3 is assigned in the three-power host are used as auxiliary power supply terminals to increase the power supply terminals to which the power supply voltage PWR1 is supplied.

Therefore, when the notch 32a is formed on the card placed into the connector, the two-power host supplies the power supply voltage PWR1 (3.3V) to the A terminal, the power supply voltage PWR2 (1.8V) to each of the B terminal and the C terminal, and the power supply voltage PWR1 (3.3V) to each of the D terminal and the E terminal.

Thus, the amount of the current supplied to the two-power card 10b can be increased by supplying the power supply voltage PWR1 (3.3V) to each of the D terminal and the E terminal. Power integrity of PWR1 can be improved.

In the power configuration in FIG. 7(B), in the two-power host, the power supply voltages PWR2 and PWR1 are assigned to the D terminal and the E terminal to which the power supply voltage PWR3 is assigned in the three-power host, respectively. That is, in the power configuration in FIG. 7(B), the D terminal and the E terminal to which the power supply voltage PWR3 is assigned in the three-power host are used as auxiliary power supply terminals to increase each of the power supply terminals to which the power supply voltages PWR2 and PWR1 is supplied, by one.

Therefore, when the notch 32a is formed on the card placed into the connector, the two-power host supplies the power supply voltage PWR1 (3.3V) to the A terminal, the power supply voltage PWR2 (1.8V) to each of the B terminal and the C terminal, the power supply voltage PWR2 (1.8V) to the D terminal, and the power supply voltage PWR1 (3.3V) to the E terminal.

(One-Power Host)

The one-power host comprises a function (i.e., notch detection) of checking whether or not the notch 32a is formed on the card placed into the connector. The one-power host supplies a power supply voltage (PWR1) to the card placed into the connector only when the notch 32a is formed on the card placed into the connector. The one-power host does not supply the power supply voltage to a card on which the notch 32a is not formed, because the card on which the notch 32a is not formed cannot be placed into the connector. In this case, the A terminal, the B terminal, the C terminal, the D terminal, and the E terminal are set to 0 v.

In any one of the power configurations in FIGS. 7(A) and (B), in the one-power host, the power supply voltage PWR1 is assigned to each of the D terminal and the E terminal to which the power supply voltage PWR3 is assigned in the three-power host. That is, the D terminal and the E terminal to which the power supply voltage PWR3 is assigned in the three-power host are used as auxiliary power supply terminals to increase the power supply terminals to which the power supply voltage PWR1 is supplied.

Furthermore, in the one-power host, the power supply voltage PWR1 is assigned to the B terminal to which the power supply voltage PWR2 is assigned in the three-power host, and the ground (0V) is assigned to the C terminal to which the power supply voltage PWR2 is assigned in the power host. The power supply voltage PWR1 may be assigned to the C terminal.

Therefore, when the notch 32a is formed on the card placed into the connector, the one-power host supplies the power supply voltage PWR1 (3.3V) to the A terminal, supplies the power supply voltage PWR1 (3.3V) to the B terminal, sets the C terminal to 0V, and supplies the power supply voltage PWR1 (3.3V) to each of the D terminal and the C terminal.

Thus, the amount of the current supplied to the one-power card 10C can be increased by supplying the power supply voltage PWR1 (3.3V) to each of the B terminal, the D terminal, and the E terminal. Power integrity of PWR1 can be improved.

According to the power configurations in FIGS. 7(A) and (B), the power supply voltage PWR1 (3.3V) is assigned to the A terminal in any of the host types. Therefore, PWR1 supplied to the A terminal can be used for power-on reset of the card by connecting the reset circuit to the A terminal, in each of the three-power card 10a, the two-power card 10b, and the one-power card 10c.

FIG. 8 illustrates an example of a power configuration corresponding to each of three types of semiconductor storage devices (three-power card, two-power card, and one-power card).

FIG. 8(A) illustrates an example of a card power configuration to reinforce the power supply voltage PWR1, and FIG. 8(B) illustrates an example of a card power configuration to reinforce the power supply voltage PWR2.

In any one of the power configurations in FIGS. 8(A) and (B), of the three-power card 10a, the power supply voltage PWR1 (3.3V) is assigned to the A terminal, the power supply voltage PWR2 (1.8V) is assigned to the B terminal and the C terminal, and the power supply voltage PWR3 (1.2V) is assigned to the D terminal and the E terminal.

The two-power card 10b does not need the power supply voltage PWR3 (1.2V) from the host device. When the two-power card 10b has the power configuration in FIG. 8(A), the D terminal and the E terminal to which the power supply voltage PWR3 (1.2V) is assigned in the three-power card 10a are effectively used as auxiliary power supply terminals to receive the power supply voltage PWR1 (3.3V) from the host device.

That is, in the power configuration in FIG. 8(A), of the two-power card 10b, the power supply voltage PWR1 (3.3V) is assigned to the A terminal, the power supply voltage PWR2 (1.8V) is assigned to the B terminal and the C terminal, and the power supply voltage PWR1 (3.3V) is assigned to the D terminal and the E terminal. Thus, in the two-power card 10b, the power supply voltage PWR1 (3.3V) is assigned to both the A terminal to which the power supply voltage PWR1 (3.3V) is assigned in the three-power card 10a and the E terminal (more specifically, the E terminal and the D terminal) to which the power supply voltage PWR3 (1.2V) is assigned in the three-power card 10a.

Since the two-power card 10b is configured to receive 3.3V at the D terminal and the E terminal, the withstand voltage of each of the D terminal and the E terminal is set to 3.3V or higher. When the two-power card 10b is placed into the three-power host, the power supply voltage PWR3 (1.2V) is supplied to the D terminal and the E terminal. However since the power supply voltage PWR3 (1.2V) is a voltage value lower than the withstand voltages of the D terminal and the E terminal of the two-power card 10b, breakage of the two-power card 10b and the like does not occur even if the two-power card 10b is placed into the three-power host.

In the power configuration in FIG. 8(B), of the two-power card 10b, the power supply voltage PWR1 (3.3V) is assigned to the A terminal, the power supply voltage PWR2 (1.8V) is assigned to each of the B terminal and the C terminal, and the power supply voltages PWR2 (1.8V) and PWR1 (3.3V) are assigned to the D terminal and the E terminal to which the power supply voltage PWR3 (1.2V) is assigned in the three-power card 10a, respectively.

Since the two-power card 10b is configured to receive 1.8V and 3.3V at the D terminal and the E terminal, respectively, the withstand voltage of the D terminal is set to 1.8V or higher and the withstand voltage of the E terminal is set to 3.3V or higher. When the two-power card 10b is placed into the three-power host, the power supply voltage PWR3 (1.2V) is supplied to the D terminal and the E terminal. However since the power supply voltage PWR3 (1.2V) is a voltage value lower than the withstand voltages of the D terminal and the E terminal of the two-power card 10*b*, breakage of the two-power card 10*b* and the like does not occur.

In any one of the power configurations in FIGS. 8(A) and (B), of the one-power card 10*c*, the power supply voltage PWR1 (3.3V) is assigned to the A terminal, the power supply voltage PWR1 (3.3V) is assigned to the B terminal to which the power supply voltage PWR2 (1.8V) is assigned in the three-power card 10*a*, the C terminal to which the power supply voltage PWR2 (1.8V) is assigned in the three-power card 10*a* is not used (N/R), and the power supply voltages PWR1 (3.3V) is assigned to each of the D terminal and the E terminal to which the power supply voltage PWR3 (1.2V) is assigned in the three-power card 10*a*. In the one-power card 10*c*, the power supply voltage PWR1 (3.3V) may be assigned to the C terminal.

Since the one-power card 10*c* is configured to receive 3.3V at the B terminal, the D terminal, and the E terminal, the withstand voltage of each of the B terminal, the D terminal, and the E terminal is set to 3.3V or higher. When the one-power card 10*c* is placed into the three-power host, the power supply voltage PWR2 (1.8V) is supplied to the B terminal, and the power supply voltage PWR3 (1.2V) is supplied to each of the D terminal and the E terminal. However, the power supply voltage PWR2 (1.8V) is a voltage value lower than a withstand voltage of the B terminal of the one-power card 10*c*. In addition, the power supply voltage PWR3 (1.2V) is a voltage value lower than withstand voltages of the D terminal and the E terminal of the one-power card 10*c*. Therefore, breakage of the one-power card 10*c* and the like does not occur even if the one-power card 10*c* is placed into the three-power host.

<Card Having No Notch>

A notch 32*a* is not provided on the three-power card 10*a*. The three-power card 10*a* without notch 32*a* does not comprise the function of detecting the power configuration (three-power host, two-power host, and one-power host) of the host device into which the three-power card 10*a* is placed.

However, since the two-power host and the one-power host comprise the function (notch detection) of checking whether the notch 32*a* is formed or not, application of 3.3V (or 1.8V) to the E terminal (or the D terminal) of the three-power card 10*a* to which 1.2V is to be applied can be prevented even if the three-power card 10*a* is placed into the two-power host or the one-power host.

<Card Having Notch>

The second-generation card operating with m types of power supply voltages from the host device determines which of the first-type host device supplying n types of power supply voltages corresponding to the first-generation card and the second-type host device supplying m types of power supply voltages corresponding to the second-generation card is the host device into which the second-generation card is placed, based on the voltages of the first power supply terminal (for example, E terminal) and the second power supply terminal (for example, C terminal) of the A terminal, the B terminal, the C terminal, the D terminal, and the E terminal.

When the host device into which the second-generation card is placed is the second-type host device supplying m types of power supply voltages corresponding to the second-generation card, the second-generation card asserts the clock request signal CLKREQ # that requests the host device to supply the reference clock signal, and the power-up sequence of the device (card) defined under PCIe is thereby executed normally. Therefore, the host device can start initialization sequence of PCIe required to enable data transfer between the host device and the card after the power-up sequence.

In contrast, when the host device into which the second-generation card is placed is the first-type host device (three-power host) supplying n types of power supply voltages corresponding to the first-generation card, the second-generation card does not assert the clock request signal CLKREQ # for the host device. In this case, the host device stops supply of n types of power supply voltages to the second-generation card without executing the initialization sequence after the time-out period elapses.

Thus, the second-generation card comprises the function of detecting the host power configuration and, when the second-generation card is placed into the three-power host, the second-generation card does not assert the clock request signal CLKREQ # for the host device. Therefore, since executing the initialization sequence can be prevented in a state in which the power supply voltage supplied from the host device does not match the power configuration of the second-generation card, the card can be protected against its abnormal operation and breakage.

The second-generation card may comprise an ability to correspond to the three-power host (optional). In this case, the second-generation card includes an internal circuit that can generate a plurality of power supply voltages necessary for the operation of the second-generation card from n types of power supply voltages supplied from the three-power host. The second-generation card asserts the clock request signal CLKREQ # for the host device after changing the settings of the internal circuit such that plural types of power supply voltages necessary for the operation of the second-generation card are generated from n types of power supply voltages supplied to the A terminal, the B terminal, the C terminal, the D terminal, and the E terminal. Thus, even if the second-generation card is placed into the first-type host device, the second-generation card can operate normally.

A case where the second-generation card (two-power card or one-power card) detects three types of host power configurations (three-power host, two-power host, and one-power host) will be described below in detail.

(Two-Power Card)

A notch 32*a* is provided on the two-power card 10*b*. The two-power card 10*b* having the notch 32*a* comprises the function of detecting the power configuration (three-power host, two-power host, and one-power host) of the host device into which the two-power card 10*b* is placed.

For example, the two-power card 10*b* determines whether the voltage of the E terminal is the power supply voltage PWR1 (3.3V) or the power supply voltage PWR3 (1.2V), and further determines whether the voltage of the C terminal is the power supply voltage PWR2 (1.8V) or 0V. As a result, the two-power card 10*b* can determine whether the host device into which the two-power card 10*b* is placed is the three-power host, the two-power host, or the one-power host, and can determine whether or not the host device into which the two-power card 10*b* is placed is the host device in which the two-power card 10*b* can operate, based on the determination result.

(One-Power Card)

A notch 32*a* is provided on the one-power card 10*c*. The one-power card 10*c* having the notch 32*a* comprises the function of detecting the power configuration (three-power host, two-power host, and one-power host) of the host device into which the one-power card 10*c* is placed.

For example, the one-power card 10*c* determines whether the voltage of the E terminal is the power supply voltage PWR1 (3.3V) or the power supply voltage PWR3 (1.2V), and further determines whether the voltage of the C terminal is the power supply voltage PWR2 (1.8V) or 0V. As a result, the one-power card 10c can determine whether the host device into which the one-power card 10c is placed is the three-power host, the two-power host, or the one-power host, and can determine whether or not the host device into which the one-power card 10c is placed is the host device in which the one-power card 10c can operate, based on the determination result.

FIG. 9 illustrates all combinations of the three type hosts and three type cards, and an operation of a card in each of the combinations.

When the power supply voltage is supplied from the host device to each of the two-power card 10b and the one-power card 10c, each of the two-power card 10b and the one-power card 10c notifies the host device of the possibility of its own operation. In this case, CLKREQ #=Low is indicative of "operable" (Full/Limited). "Full" is indicative of being fully operable, and "Limited" is indicative of being operable in a state in which the power consumption (performance) is limited. CLKREQ #=High is indicative of "inoperable" (N/A: Not Available).

When the host power configuration matches the card power configuration, the card is fully operable. When the host power configuration does not match the card power configuration, the card is basically inoperable (N/A: Not Available). However, even if the host power configuration does not correspond to the card power configuration, the card can often operate in the state in which the power consumption (performance) is limited.

As illustrated in FIG. 9, the three-power card 10a is fully operable (Full) only when placed into the three-power card 10a, and is inoperable (N/A) when placed into the two-power host or the one-power host.

The two-power card 10b is fully operable (Full) when placed into the two-power host, inoperable (N/A) when placed into the one-power host, and inoperable (N/A) when placed into the three-power host. The two-power card 10b applicable to the three-power host becomes fully operable (Full) or operable in the limited status (Limited) when placed into the three-power host.

The one-power card 10c is fully operable (Full) when placed into the one-power host, inoperable (N/A) when placed into the two-power host, and inoperable (N/A) when placed into the three-power host. The one-power card 10c applicable to the two-power host becomes fully operable (Full) or operable in the limited status (Limited) when placed into the two-power host. In addition, the one-power card 10c applicable to the three-power host becomes fully operable (Full) or operable in the limited status (Limited) when placed into the three-power host.

FIG. 10 is a block diagram illustrating a configuration example of the two-power card 10b.

The controller 14 includes a physical layer (PHY) 51, a logic circuit 52, a NAND interface (NAND I/F) 53, voltage regulators VR1 and VR2, voltage detectors DT1 and DT2, and the like.

The physical layer (PHY) 51 includes a receiver and a transmitter. The receiver includes a circuit that receives receiver differential signals PERp0, PERn0, PERp1, PERn1, PERp2, PERn2, PERp3, and PERn3. The transmitter includes a circuit that transmits data as transmitter differential signals PETp0, PETn0, PETp1, PETn1, PETp2, PETn2, PETp3, and PETn3. The physical layer (PHY) 51 can execute serial-parallel translation, parallel-serial translation, symbol encoding, and the like. The symbol encoding can be executed with 8b/10b coding of translating 8-bit data into a 10-bit pattern in which the number of times of sequence of "1" or "0" is suppressed to a predetermined value or less or 128b/130b coding of translating 128-bit data into a 130-bit pattern in which the number of times of sequence of "1" or "0" is suppressed to a predetermined value or less. This symbol encoding enables bias of the voltage level to be suppressed at data transmission. In addition, when the same symbol pattern is repeatedly transferred, a higher harmonic of a specific frequency becomes large, but the higher harmonic of the specific frequency can be prevented from becoming large by changing a symbol pattern to a plurality of symbols different in pattern not to form the repeated pattern. That is, occurrence of EMI can be suppressed.

In the transaction layer of PCIe, data can be packetized and then transmitted and received, and messages can be transmitted and received. In the data link layer of the PCIe, sequence numbers can be added to packets received from the transaction layer and CRC can be added to the packets. The sequence number can be used for acknowledgment of packets, etc.

PCIe can be composed of a plurality of lanes, and each of the lanes that connect the host device and the two-power card 10b is initialized independently. The only lanes in which initialization is completed and communications can be executed are used. In the first embodiment, a maximum of 4 lanes are used but only one or two lanes may be used.

| One lane: | PERp0, PERn0, PETp0, and PETn0, (or PERp1, PERn1, PETp1, and PETn1) |
|---|---|
| Two lanes : | PERp0, PERn0, PETp0, and PETn0, PERp1, PERn1, PETp1, and PETn1 |
| Four lanes: | PERp0, PERn0, PETp0, and PETn0, PERp1, PERn1, PETp1, and PETn1, PERp2, PERn2, PETp2, and PETn2, PERp3, PERn3, PETp3, and PETn3 |

In addition, the physical layer (PHY) 51 can transmit and receive single-ended signals such as PERST #, CLKREQ #, CNTA, and CNTB.

The logic circuit 52 executes operations of controlling the physical layer (PHY) 51 and the NAND interface (NAND I/F) 53, operations for various signal processes, and the like.

The NAND interface (NAND I/F) 53 executes a write control operation of writing data to the NAND flash memory 13, a read control operation of reading data from the NAND flash memory 13, and the like.

Each of the voltage regulators VR1 and VR2 is a down-converter that generates a desired output voltage lower than the input voltage. The output voltage value can be preset. For example, when the power supply voltage PWR2 (1.8V) or the power supply voltage PWR1 (3.3V) is input to each of the voltage regulators VR1 and VR2, each of the voltage regulators VR1 and VR2 generates the power supply voltage PWR3 (1.2V) from the power supply voltage PWR2 (1.8V) or the power supply voltage PWR1 (3.3V).

The voltage detector DT1 detects the power supply voltage PWR1 (3.3V) or the power supply voltage PWR3 (1.2V) as the voltage of the E terminal. The E terminal is a power supply terminal to which PWR3 (1.2V) is assigned in the three-power card 10a and the power supply voltage PWR1 (3.3V) is assigned in the two-power card 10b. The E terminal is also a power supply terminal to which PWR3 (1.2V) is assigned in the three-power card 10a and the power supply voltage PWR1 (3.3V) is assigned in the one-power card 10c. The voltage detector DT1 operates with PWR1 (3.3V) supplied from the host device to the A terminal.

The voltage detector DT2 detects the power supply voltage PWR2 (1.8V) or 0V as the voltage of the C terminal. The C terminal is a power supply terminal to which PWR2 (1.8V) is assigned in the three-power card 10*a* and the power supply voltage PWR2 (1.8V) is assigned in the two-power card 10*b*. The C terminal is also a power supply terminal to which PWR2 (1.8V) is assigned in the three-power card 10*a* and 0V (or the power supply voltage PWR1 (3.3V)) is assigned in the one-power card 10*c*. The voltage detector DT2 also operates with the power supply voltage PWR1 (3.3V) supplied from the host device to the A terminal.

The power supply voltage PWR1 (3.3V) is supplied to the NAND flash memory 13 and the controller 14. In the first embodiment, the power supply voltage PWR1 (3.3V) is mainly used for the operations of the NAND flash memory 13 such as read/write of the NAND flash memory 13. The program voltage of the NAND flash memory 13 is generated by boosting the power supply voltage PWR1. In addition, the power supply voltage PWR1 can be used for the other purposes.

The NAND interface (NAND I/F) 53 operates with the power supply voltage PWR3 (1.2V) generated by the voltage regulator VR1 or VR2. The NAND flash memory 13 includes an interface circuit that executes communications with the NAND interface (NAND I/F) 53, and this interface circuit also operates with the power supply voltage PWR3 (1.2V) generated by the voltage regulator VR1 or VR2.

The logic circuit 52 also operates with the power supply voltage PWR3 (1.2V) generated by the voltage regulator VR1 or VR2. The physical layer 51 operates with the power supply voltage PWR2 (1.8V).

Figure 11:
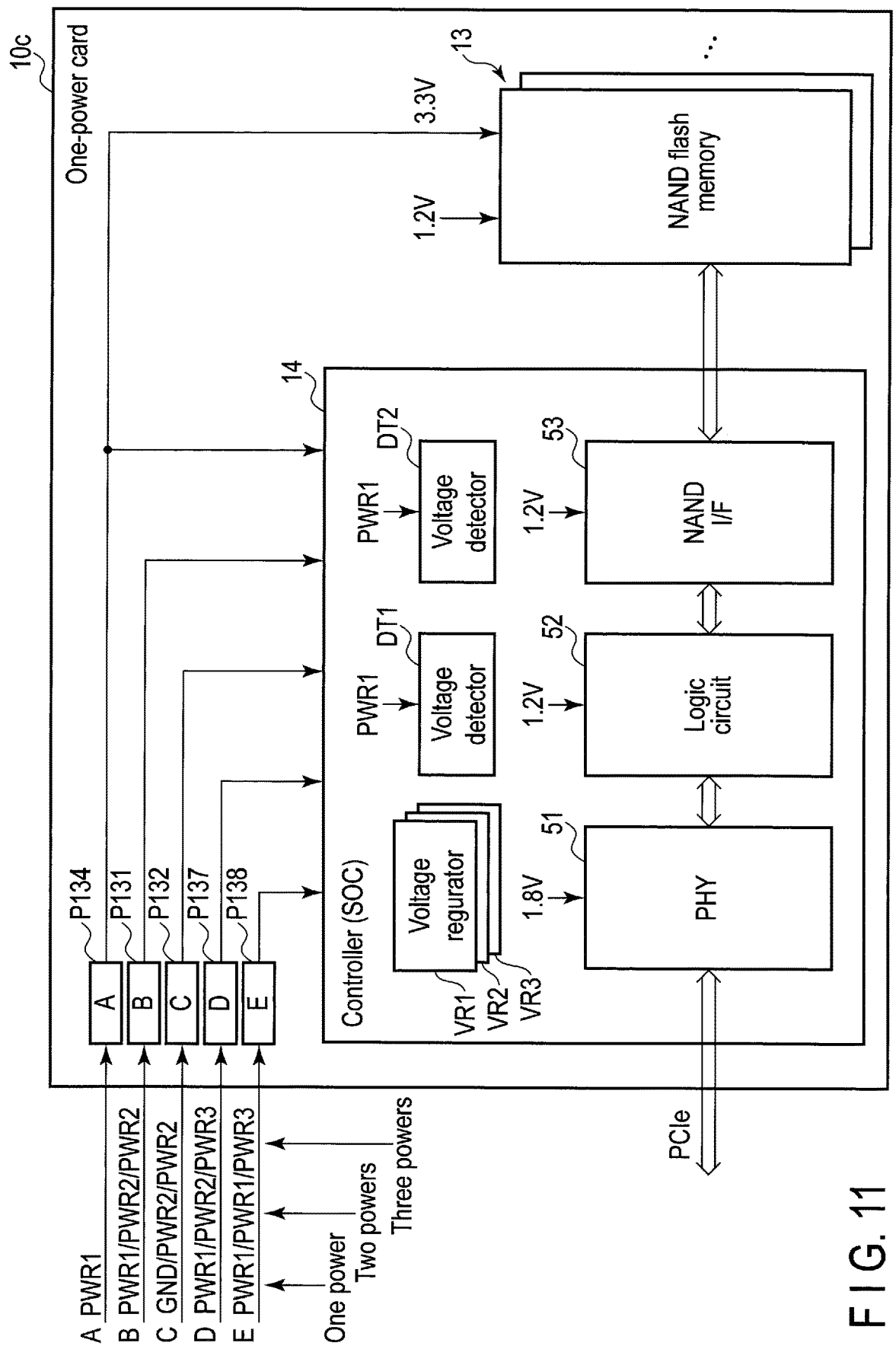
FIG. 11 is a block diagram illustrating a configuration example of the one-power card.

FIG. 11 is a block diagram illustrating a configuration example of the one-power card 10*c*.

The one-power card 10*c* is different from the two-power card 10*b* with respect to a feature that a voltage regulator VR3 that generates the power supply voltage PWR2 (1.8V) is provided in the controller 14 as well as the voltage regulators VR1 and VR2, and the other constituent elements are the same as those of the two-power card 10*b*. The voltage regulator VR3 is a down-converter that generates a desired output voltage lower than the input voltage. The output voltage value can be preset. For example, when the power supply voltage PWR1 (3.3V) is input to the voltage regulator VR3, the voltage regulator VR3 generates the power supply voltage PWR2 (1.8V) from the power supply voltage PWR1 (3.3V).

Figure 12:
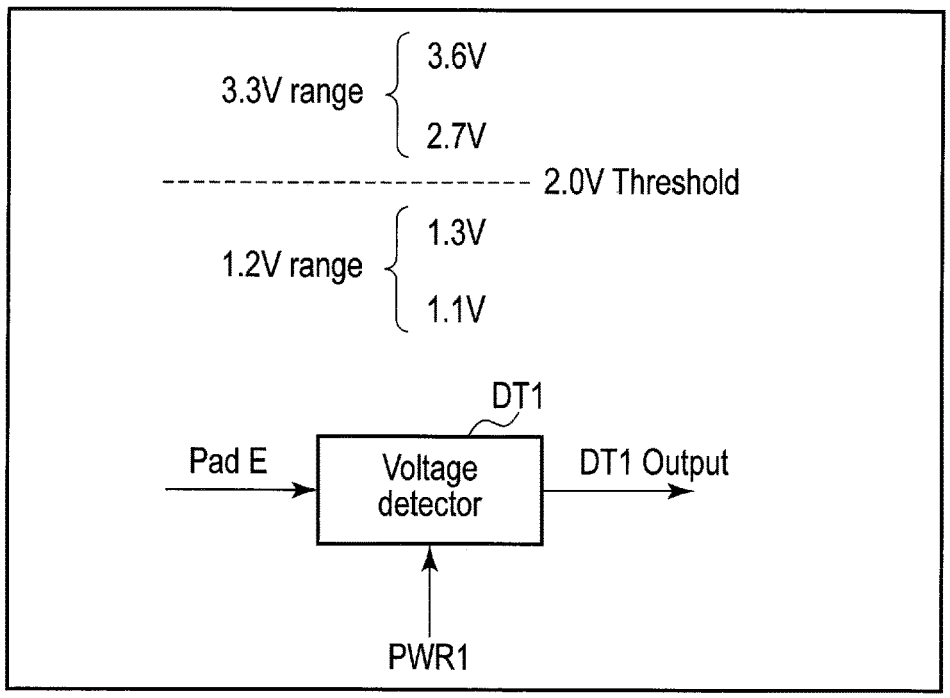
FIG. 12 is a diagram illustrating a configuration example of a first voltage detector used to detect a host power configuration.

FIG. 12 illustrates a configuration example of the voltage detector DT1.

The voltage detector DT1 detects the power supply voltage PWR1 (3.3V) or the power supply voltage PWR3 (1.2V) as the voltage of the E terminal (Pad E). In the first embodiment, a threshold voltage of the voltage detector DT1 is set to 2.0V, i.e., a middle value between a 1.2V range (1.1V to 1.3V) and a 3.3V range (2.7V to 3.6V). The detected output of the voltage detector DT1 is High when the power supply voltage PWR1 (3.3V) is supplied to the E terminal (Pad E), and the detected output of the voltage detector DT1 is Low when the power supply voltage PWR3 (1.2V) is supplied to the E terminal (Pad E).

Figure 13:
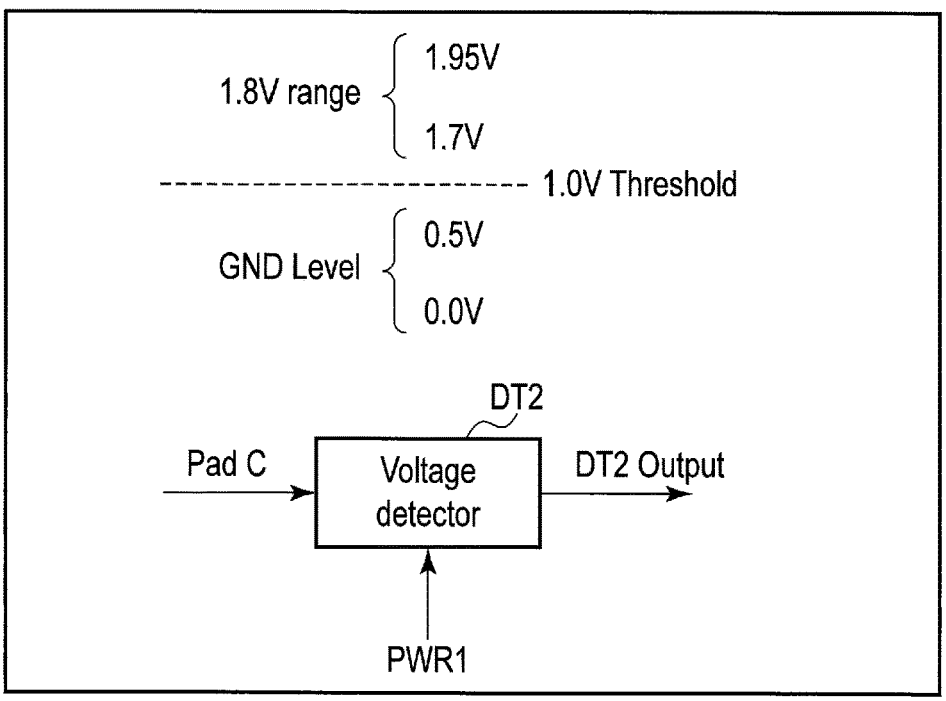
FIG. 13 is a diagram illustrating a configuration example of a second voltage detector used to detect the host power configuration.

FIG. 13 illustrates a configuration example of the voltage detector DT2.

The voltage detector DT2 detects the power supply voltage PWR2 (1.8V) or 0V as the voltage of the C terminal (Pad C). In the first embodiment, a threshold voltage of voltage detector DT2 is set to 1.0V, i.e., a value slightly lower than the middle value between a 1.8V range (1.7V to 1.95V) and a GND level (0.0V to 0.5V). The detected output of the voltage detector DT2 is High when the power supply voltage PWR2 (1.8V) is supplied to the C terminal (Pad C), and the detected output of the voltage detector DT2 is Low when 0V are supplied to the C terminal (Pad C). DT2 may be configured to have a threshold between 1.8V and 3.3V at the B terminal to distinguish two-power card from one-power card.

FIG. 14 illustrates a relationship between combinations of a detected output of the first voltage detector DT1 and a detected output of the second voltage detector DT2, and three types of host devices (three-power host, two-power host, and one-power host).

As illustrated in FIG. 7, each of the three-power host, the two-power host, and the one-power host supplies the power supply voltage PWR1 (3.3V) to the A terminal. For this reason, in each of the two-power card 10*b* and the one-power card 10*c*, the power supply voltage PWR1 (3.3V) supplied to the A terminal can be used to generate a power-on reset signal to release the reset status of the controller 14 in accordance with supply of the power supply voltage PWR1. The voltage detectors DT1 and DT2 are driven with the power supply voltage PWR1 (3.3V) supplied to the A terminal such that the each of the two-power card 10*b* and the one-power card 10*c* can operate when placed into any type of the host device.

As illustrated in FIG. 7, the three-power host supplies the power supply voltage PWR3 (1.2V) to the E terminal and supplies the power supply voltage PWR2 (1.8V) to the C terminal, the two-power host supplies the power supply voltage PWR1 (3.3V) to the E terminal and supplies the power supply voltage PWR2 (1.8V) to the C terminal, and the one-power host supplies the power supply voltage PWR1 (3.3V) to the E terminal and supplies 0V to the C terminal.

For this reason, as illustrated in FIG. 14, a combination of the detected output=Low of the voltage detector DT1 and the detected output=High of the voltage detector DT2 indicates that the host device placed into the card is the three-power host. A combination of the detected output=High of the voltage detector DT1 and the detected output=High of the voltage detector DT2 indicates that the host device placed into the card is the two-power host. A combination of the detected output=High of the voltage detector DT1 and the detected output=Low of the voltage detector DT2 indicates that the host device placed into the card is the one-power host.

Therefore, the two-power card 10*b* can determine whether the host device into which the two-power card 10*b* is placed is the two-power host or not, based on the voltage of the E terminal and the voltage of the C terminal. In other words, when the combination of the detected output=High of the voltage detector DT1 and the detected output=High of the voltage detector DT2 is detected, two types of power supply voltages necessary for the operations of the two-power card 10*b* are supplied correctly, and the two-power card 10*b* can thereby determine that the host device into which the two-power card 10*b* is placed is the two-power host. In contrast, when the combination of the detected output=Low of the voltage detector DT1 and the detected output=High of the voltage detector DT2 is detected, the two-power card 10*b* can determine that the host device into which the two-power card 10*b* is placed is the three-power host. In addition, when the combination of the detected output=High of the voltage detector DT1 and the detected output=Low of the voltage detector DT2 is detected, the two-power card 10*b* can determine that the host device into which the two-power card 10*b* is placed is the one-power host.

Similarly, the one-power card 10*c* can determine whether the host device into which the one-power card 10*c* is placed is the one-power host or not, based on the voltage of the E terminal and the voltage of the C terminal. In other words, when the combination of the detected output=High of the voltage detector DT1 and the detected output=Low of the voltage detector DT2 is detected, one type of power supply voltage necessary for the operations of the one-power card 10*c* is supplied correctly, and the one-power card 10*c* can thereby determine that the host device into which the one-power card 10*c* is placed is the one-power host. In contrast, for example, when the combination of the detected output=Low of the voltage detector DT1 and the detected output=High of the voltage detector DT2 is detected, the one-power card 10*c* can determine that the host device into which the one-power card 10*c* is placed is the three-power host. Further, when the combination of the detected output=High of the voltage detector DT1 and the detected output=High of the voltage detector DT2 is detected, the one-power card 10*c* can determine that the host device into which the one-power card 10*c* is placed is the two-power host.

Figure 15:
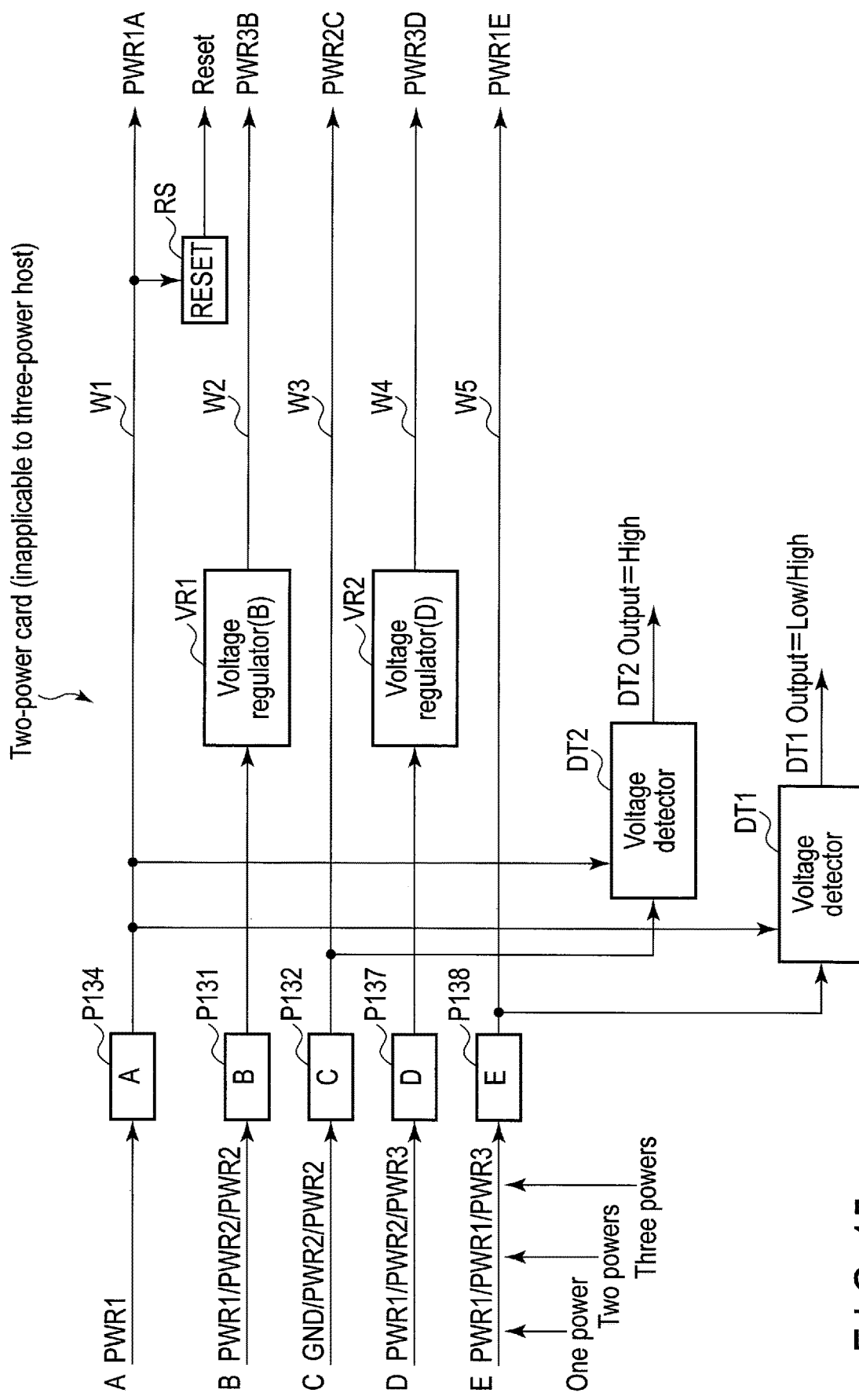
FIG. 15 is a diagram illustrating a configuration example of the two-power card inapplicable to the three-power host.

FIG. 15 illustrates a configuration example of the two-power card 10*b* inapplicable to the three-power host.

The two-power card 10*b* inapplicable to the three-power host is configured to assert the clock request signal for the host device only when the host device into which the two-power card 10*b* is placed is the two-power host.

The A terminal is not connected to any voltage regulators, and the power supply voltage PWR1 (3.3V) supplied to the A terminal is supplied to several components in the two-power card 10*b* as the internal power supply voltage PWR1A (3.3V) via a power supply line W1. In addition, a reset circuit RS is connected to the A terminal. When the power supply voltage PWR1 (3.3V) is supplied to the A terminal, the reset circuit RS outputs a power-on reset signal Reset and thereby releases the reset status of the controller 14. The reset circuit RS may be a reset IC connected to the controller 14.

A voltage regulator (B) VR1 is connected to the B terminal. The voltage regulator (B) VR1 has, for example, a withstand voltage of 3.3V or more. The voltage regulator (B) VR1 generates a predetermined power supply voltage (1.2V) lower than the power supply voltage input to the voltage regulator VR1. The power supply voltage (1.2V) generated by the voltage regulator (B) VR1 is supplied to several components in the two-power card 10*b* as the internal power supply voltage PWR3B (1.2V) via a power supply line W2.

The C terminal is not connected to any voltage regulators, and the power supply voltage PWR2 (1.8V) supplied to the C terminal is supplied to several components in the two-power card 10*b* as the internal power supply voltage PWR2C (1.8V) via a power supply line W3.

A voltage regulator (D) VR2 is connected to the D terminal. The voltage regulator (D) VR2 has, for example, a withstand voltage of 3.3V or more. The voltage regulator (D) VR2 generates a predetermined power supply voltage (1.2V) lower than the power supply voltage input to the voltage regulator VR2. The power supply voltage (1.2V) generated by the voltage regulator (D) VR2 is supplied to several components in the two-power card 10*b* as the internal power supply voltage PWR3D (1.2V) via a power supply line W4.

The E terminal is not connected to any voltage regulators, and the power supply voltage PWR1 (3.3V) supplied to the E terminal is supplied to several components in the two-power card 10*b* as the internal power supply voltage PWR1E (3.3V) via a power supply line W5.

The detected output level of the voltage detector DT1 and the detected output level of the voltage detector DT2 are determined by the voltage of the E terminal and the voltage of the C terminal, respectively. In the case where the two-power card 10*b* comprises the configuration of FIG. 15, the two-power card 10*b* can operate only when the two-power card 10*b* is placed into the two-power host (DT1=High, DT2=High). Therefore, in the case where DT1=High and DT2=High, the two-power card 10*b* drives the clock request signal CLKREQ # to Low. In contrast, in cases other than the case where DT1=High and DT2=High, the two-power card 10*b* maintains the clock request signal CLKREQ # at High.

Figure 16:
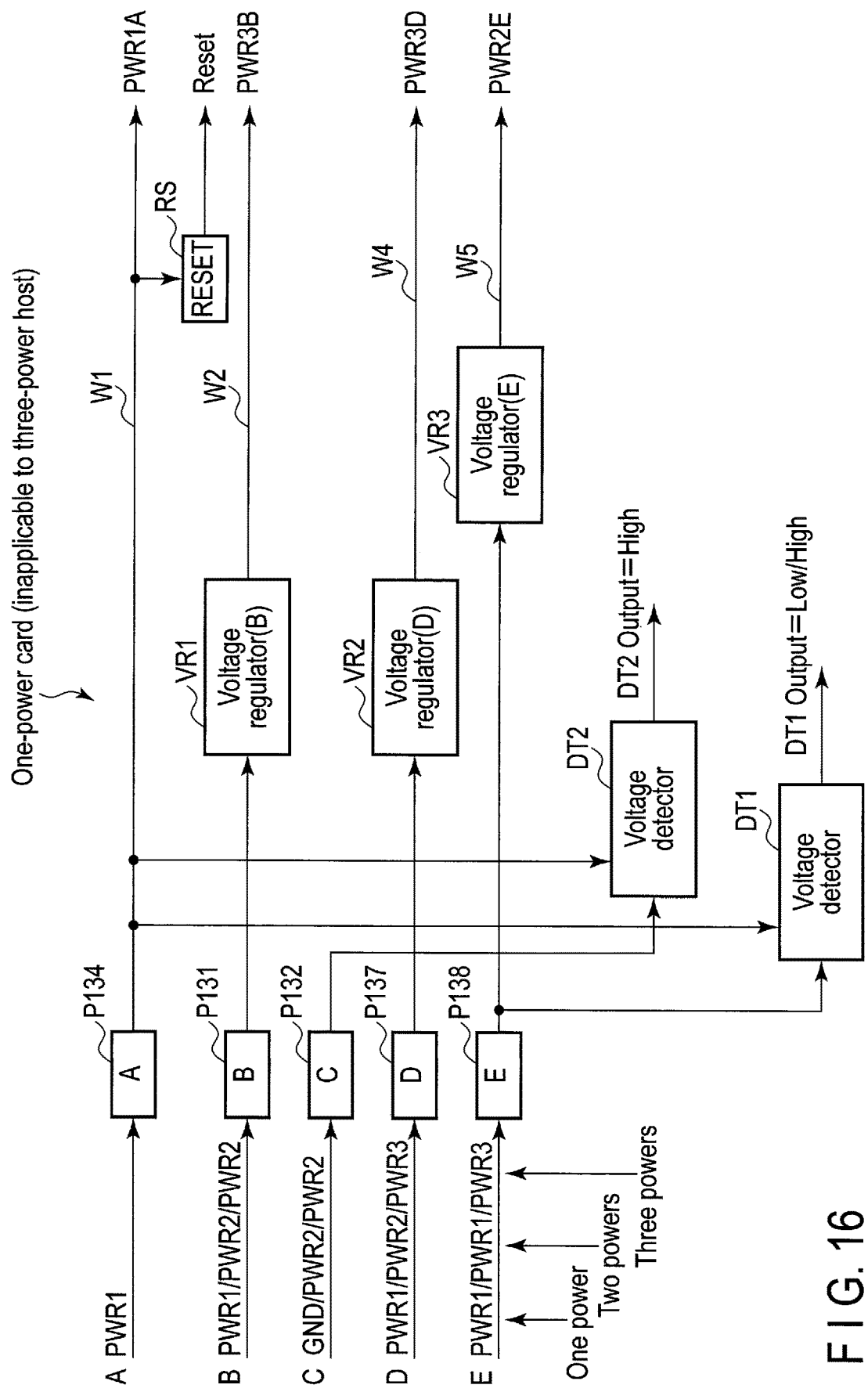
FIG. 16 is a diagram illustrating a configuration example of the one-power card inapplicable to the three-power host.

FIG. 16 illustrates a configuration example of the one-power card 10*c* inapplicable to the three-power host.

The A terminal is not connected to any voltage regulators, and the power supply voltage PWR1 (3.3V) supplied to the A terminal is supplied to several components in the one-power card 10*c* as the internal power supply voltage PWR1A (3.3V) via a power supply line W1. In addition, a reset circuit RS is connected to the A terminal. When the power supply voltage PWR1 (3.3V) is supplied to the A terminal, the reset circuit RS outputs a power-on reset signal Reset and thereby releases the reset status of the controller 14.

A voltage regulator (B) VR1 is connected to the B terminal. The voltage regulator (B) VR1 has, for example, a withstand voltage of 3.3V or more. The voltage regulator (B) VR1 generates a predetermined power supply voltage (1.2V) lower than the power supply voltage input to the voltage regulator (B) VR1. The power supply voltage (1.2V) generated by the voltage regulator (B) VR1 is supplied to several components in the one-power card 10*c* as the internal power supply voltage PWR3B (1.2V) via a power supply line W2.

The C terminal is separated from the power supply line. A voltage regulator (D) VR2 is connected to the D terminal. The voltage regulator (D) VR2 has, for example, a withstand voltage of 3.3V or more. The voltage regulator (D) VR2 generates a predetermined power supply voltage (1.2V) lower than the power supply voltage input to the voltage regulator VR2. The power supply voltage (1.2V) generated by the voltage regulator (D) VR2 is supplied to several components in the one-power card 10*c* as the internal power supply voltage PWR3D (1.2V) via a power supply line W4.

A voltage regulator (E) VR3 is connected to the E terminal. The voltage regulator (E) VR3 has, for example, a withstand voltage of 3.3V or more. The voltage regulator (E) VR3 generates a predetermined power supply voltage (1.8V) lower than the power supply voltage input to the voltage regulator VR3. The power supply voltage (1.8V) generated by the voltage regulator (E) VR3 is supplied to several components in the one-power card 10*c* as an internal power supply voltage PWR2E (1.8V) via a power supply line W5.

The detected output level of the voltage detector DT1 and the detected output level of the voltage detector DT2 are determined by the voltage of the E terminal and the voltage of the C terminal, respectively. In the case where the one-power card 10*c* comprises the configuration of FIG. 16, the one-power card 10*c* can operate when the one-power card 10*c* is placed into the one-power host (DT1=High and DT2=Low) and can also operate when the one-power card 10*c* is placed into the two-power host (DT1=High and DT2=High). Therefore, in the case of comprising the configuration of FIG. 16, when DT1=High and DT2=Low or when DT1=High and DT2=High, the one-power card 10c drives the clock request signal CLKREQ # to Low. In contrast, in cases other than the case where DT1=High and DT2=Low (or DT1=High and DT2=High), the one-power card 10c maintains the clock request signal CLKREQ # at High.

Figure 17:
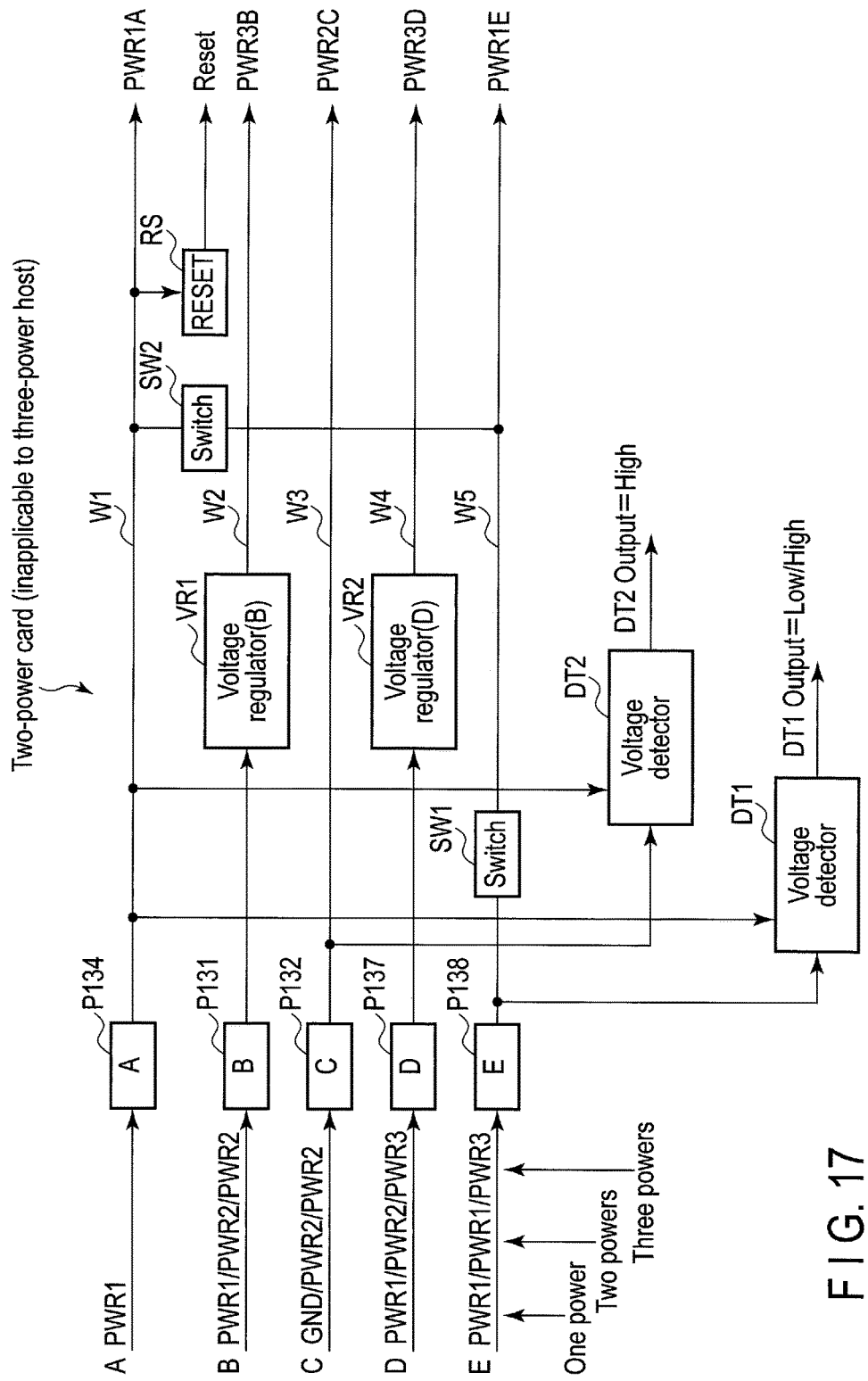
FIG. 17 is a diagram illustrating a configuration example of the two-power card applicable to the three-power host.

FIG. 17 illustrates a configuration example of the two-power card 10b applicable to the three-power host.

As illustrated in FIG. 17, the two-power card 10b applicable to the three-power host comprises switches SW1 and SW2 as well as the configuration of FIG. 15. In addition, the voltage regulator (D) VR2 has a through mode.

The switch SW1 is connected between the E terminal and the power supply line W5, and the switch SW2 is connected between the power supply line W1 and the power supply line W5. The switch SW1 and the switch SW2 are set to an off status when the two-power card 10b is powered on.

When the host device into which the two-power card 10b is placed is the two-power host (DT1=High and DT2=High), the two-power card 10b drives the clock request signal CLKREQ # to Low in the status of setting the switch SW1=on and the switch SW2=off. The status where the switch SW1=on and the switch SW2=off is a default switch status corresponding to the two-power host.

In contrast, when the host device into which the two-power card 10b is placed is the three-power host (DT1=Low and DT2=High), the two-power card 10b changes the settings of the internal circuits (switch SW1, switch SW2, and voltage regulator (D) VR2) such that plural types of power supply voltages (PWR1A, PWR3B, PWR2C, PWR3D, and PWR1E) necessary for the operations of the two-power card 10b are generated from three types of power supply voltages (PWR1, PWR2, and PWR3) supplied from the host device to the A terminal, the B terminal, the C terminal, the D terminal, and the E terminal, and then drives the clock request signal CLKREQ # to Low.

That is, when the host device into which the two-power card 10b is placed is the three-power host (DT1=Low and DT2=High), the controller 14 (logic circuit 52) of the two-power card 10b turns off the switch SW1 and turns on the switch SW2. Thus, the power supply voltage PWR1 (3.3V) supplied to the A terminal can be supplied to several components in the two-power card 10b as the internal power supply voltage PWR1E (3.3V) via the power supply line W5.

Furthermore, the controller 14 (logic circuit 52) sets the voltage regulator (D) VR2 to the through mode such that the power supply voltage PWR3 (1.2V) supplied to the D terminal is supplied to several components in the two-power card 10b as the power supply voltage PWR3D (1.2V) via the power supply line W4.

When the voltage regulator (D) VR2 is set to the through mode, for example, an input terminal and an output terminal of the voltage regulator (D) VR2 are connected by a circuit (for example, transistor) inside the voltage regulator (D) VR2. Thus, the power supply voltage PWR3 (1.2V) supplied to the D terminal can be used as the power supply voltage PWR3D (1.2V) although a small voltage drop may occur.

Figure 18:
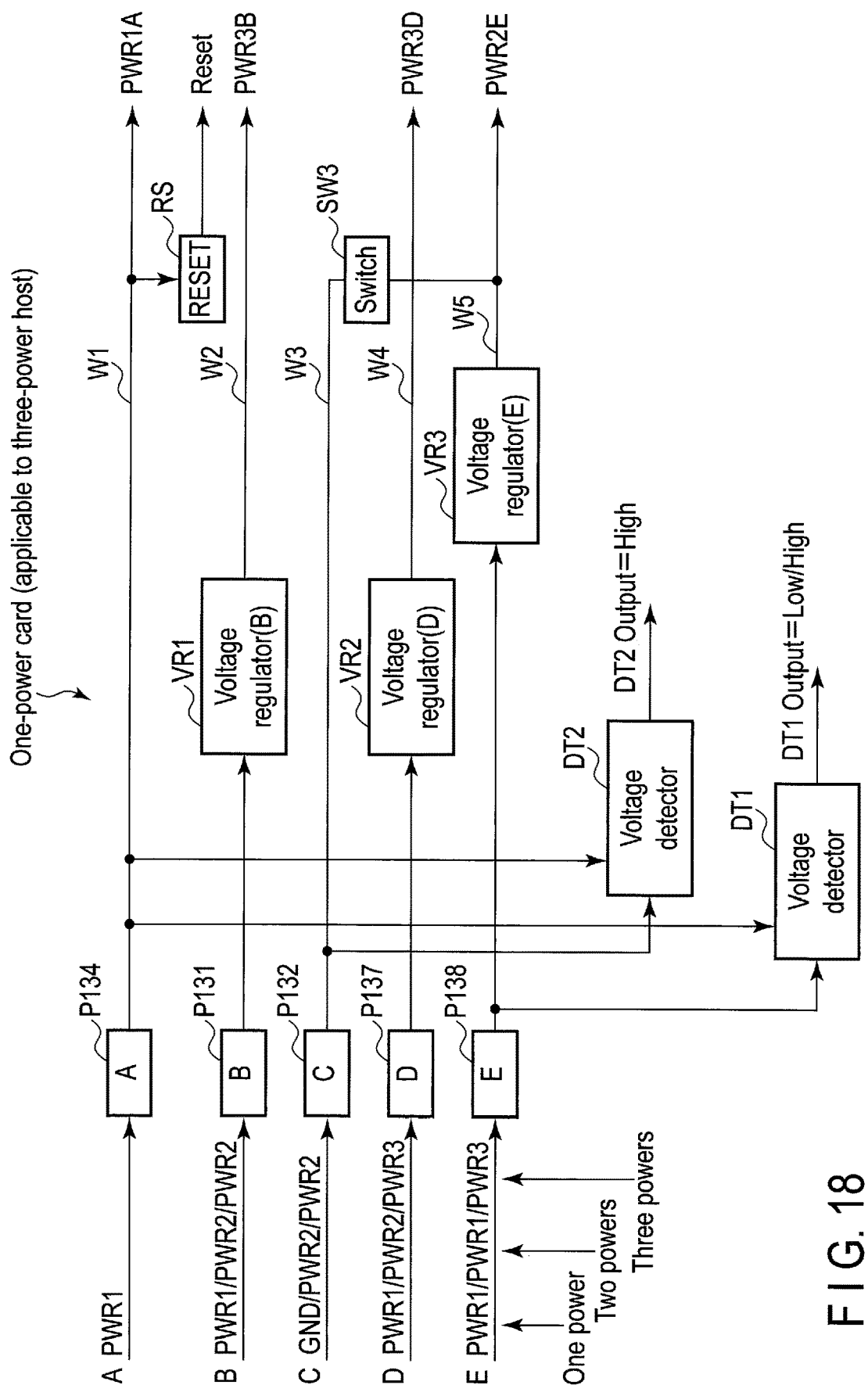
FIG. 18 is a diagram illustrating a configuration example of the one-power card applicable to the three-power host.

FIG. 18 illustrates a configuration example of the one-power card 10c applicable to the three-power host.

As illustrated in FIG. 18, the one-power card 10c applicable to the three-power host comprises a switch SW3 as well as the configuration of FIG. 16. In addition, the voltage regulator (D) VR2 has a through mode.

The switch SW3 is connected between the C terminal and the power supply line W5. The switch SW3 is set to an off status when the one-power card 10c is powered on.

When the host device into which the one-power card 10c is placed is the one-power host (DT1=High and DT2=Low), the one-power card 10c drives the clock request signal CLKREQ # to Low in the status of setting the switch SW3=off. The status where the switch SW3=off is a default switch status corresponding to the one-power host. As illustrated in FIG. 16, the one-power card 10c comprising the configuration of FIG. 16 or FIG. 18 is also operable in the two-power host, when the host device into which the one-power card 10c is placed is the two-power host (DT1=High and DT2=High), the one-power card 10c drives the clock request signal CLKREQ # to Low in the status of setting the switch SW3 to the default status (switch SW3=off).

In contrast, when the host device into which the one-power card 10c is placed is the three-power host (DT1=Low and DT2=High), the one-power card 10c changes the settings of the internal circuits (switch SW3 and voltage regulator (D) VR2) such that plural types of power supply voltages (PWR1A, PWR3B, PWR2C, PWR3D, and PWR1E) necessary for the operations of the one-power card 10c are generated from three types of power supply voltages (PWR1, PWR2, and PWR3) supplied from the host device to the A terminal, the B terminal, the C terminal, the D terminal, and the E terminal, and then drives the clock request signal CLKREQ # to Low.

That is, when the host device into which the one-power card 10c is placed is the three-power host (DT1=Low and DT2=High), the controller 14 (logic circuit 52) of the one-power card 10c turns off the voltage regulator (E) VR3 and turns on the switch SW3. Thus, the power supply voltage PWR2 (1.8V) supplied to the C terminal can be supplied to several components in the one-power card 10c as the power supply voltage PWR2E (1.8V) via the power supply line W5.

Furthermore, the controller 14 (logic circuit 52) sets the voltage regulator (D) VR2 to the through mode such that the power supply voltage PWR3 (1.2V) supplied to the D terminal is supplied to several components in the one-power card 10c as the power supply voltage PWR3D (1.2V) via the power supply line W4.

Figure 19:
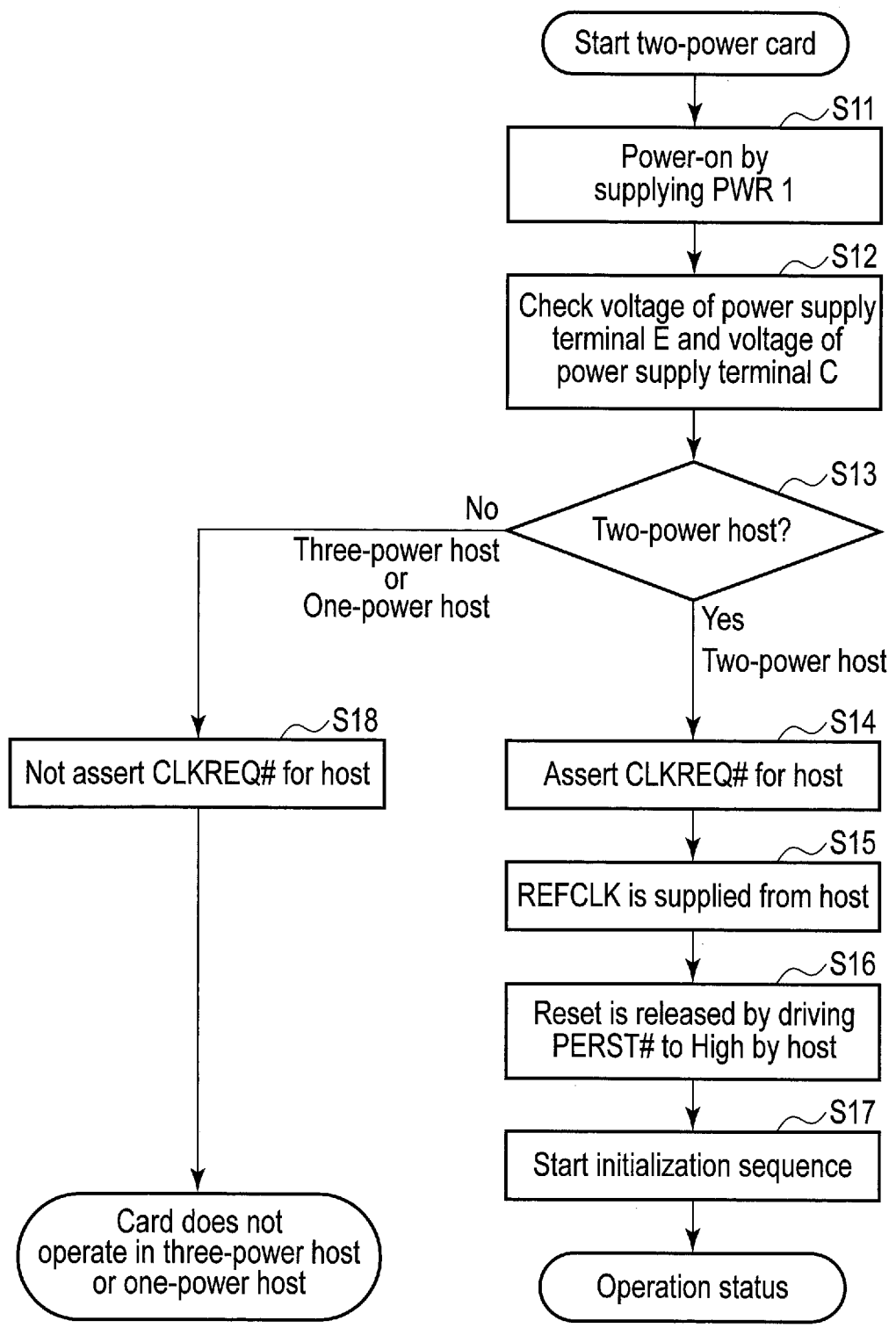
FIG. 19 is a flowchart illustrating a procedure of a process executed by the two-power card inapplicable to the three-power host.

FIG. 19 is a flowchart illustrating a procedure of a process executed by the two-power card 10b inapplicable to the three-power host.

When the power supply voltage PWR1 (3.3V) is supplied from the host device to the A terminal, the power supply voltage PWR1 (3.3V) is supplied to the controller 14 as the main power, and the reset status of the controller 14 is released by the reset circuit RS (step S11).

The voltage detectors DT1 and DT2 check the power supply voltage supplied to the E terminal and the power supply voltage supplied to the C terminal to detect the power configuration of the host device into which the two-power card 10b is placed (step S12).

When DT1=High and DT2=High, i.e., when the host device into which the two-power card 10b is placed is the two-power host (YES in step S13), the controller 14 asserts the clock request signal CLKREQ # for the host device by driving the clock request signal CLKREQ # to Low (step S14). Then, the reference clock signal REFCLK is supplied from the host device (step S15), the reset status of the PCIe function of the two-power card 10b is released by driving PERST # to High by the host device (step S16), and the initialization sequence of the two-power card 10*b* is started (step S17).

In contrast, when the host device into which the two-power card 10*b* is placed is the three-power host or the one-power host (NO in step S13), the controller 14 does not assert the clock request signal CLKREQ # for the host device (step S18).

FIG. 20 is a flowchart illustrating a procedure of a process executed by the two-power card 10*b* applicable to the three-power host.

When the power supply voltage PWR1 (3.3V) is supplied from the host device to the A terminal, the power supply voltage PWR1 (3.3V) is supplied to the controller 14 as the main power, and the reset status of the controller 14 is released by the reset circuit RS (step S21).

The voltage detectors DT1 and DT2 check the power supply voltage supplied to the E terminal and the power supply voltage supplied to the C terminal to detect the power configuration of the host device into which the two-power card 10*b* is placed (step S22).

When DT1=High and DT2=High, i.e., when the host device into which the two-power card 10*b* is placed is the two-power host (step S23), the controller 14 sets each of the switch SW1 and the switch SW2 to a default status (switch SW1=on and switch SW2=off) (step S24), and asserts the clock request signal CLKREQ # for the host device by driving the clock request signal CLKREQ # to Low (step S25). Then, the reference clock signal REFCLK is supplied from the host device (step S26), the reset status of the PCIe function of the two-power card 10*b* is released by driving PERST # to High by the host device (step S27), and the initialization sequence of the two-power card 10*b* is started (step S28).

When the host device into which the two-power card 10*b* is placed is the three-power host (step S23), the controller 14 turns on the switch SW2 and turns off the switch SW1 to change the settings of the internal circuits (step S29), and further sets the voltage regulator (D) VR2 to the through mode (step S30). Then, the controller 14 asserts the clock request signal CLKREQ # for the host device by driving the clock request signal CLKREQ # to Low (step S31). Then, the reference clock signal REFCLK is supplied from the host device (step S32), the reset status of the PCIe function of the two-power card 10*b* is released by driving PERST # to High by the host device (step S33), and the initialization sequence of the two-power card 10*b* is started (step S34).

When the host device into which the two-power card 10*b* is placed is the one-power host (step S23), the controller 14 does not assert the clock request signal CLKREQ # for the host device (step S35).

Figure 21:
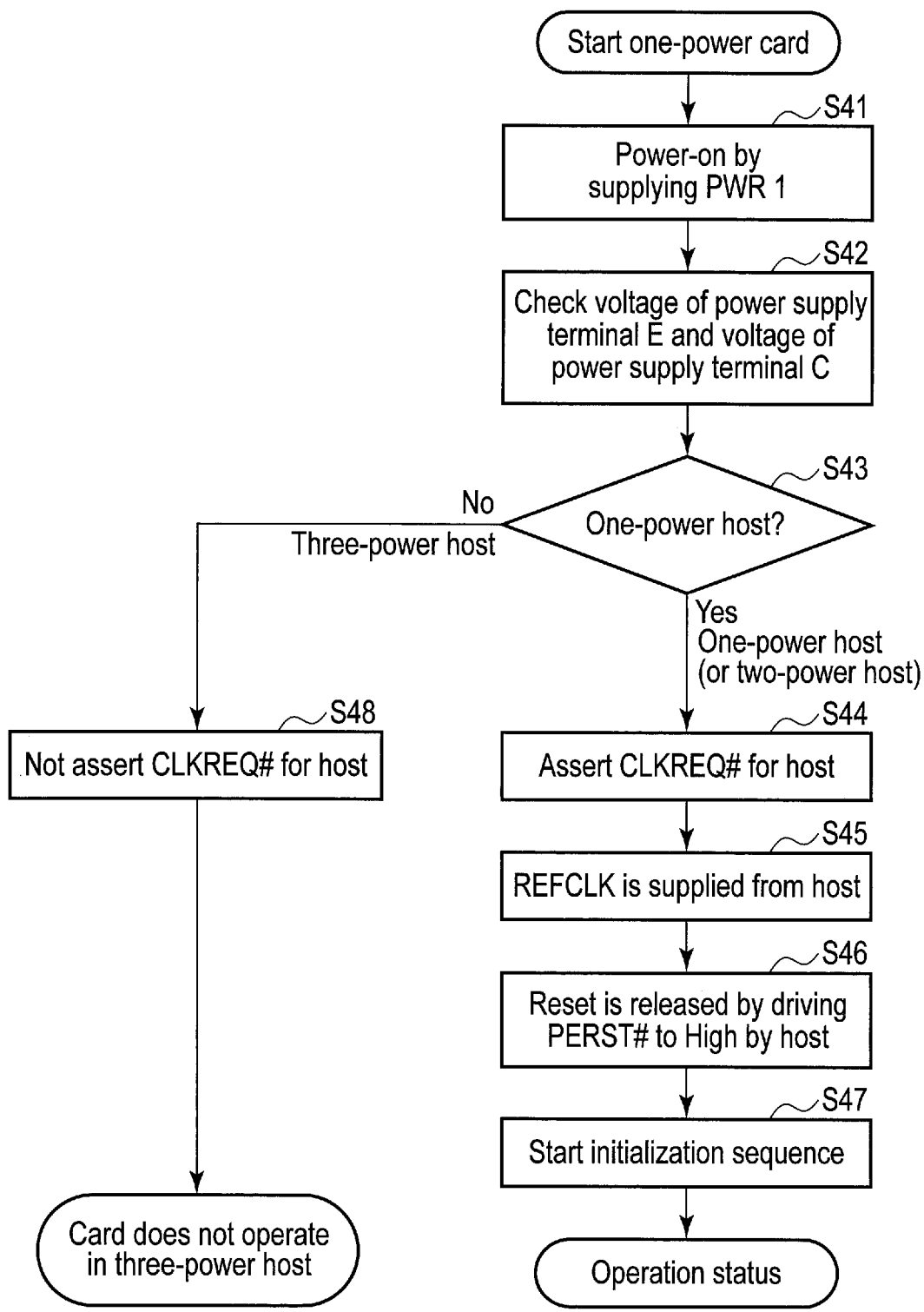
FIG. 21 is a flowchart illustrating a procedure of a process executed by the one-power card inapplicable to the three-power host.

FIG. 21 is a flowchart illustrating a procedure of a process executed by the one-power card 10*c* inapplicable to the three-power host.

When the power supply voltage PWR1 (3.3V) is supplied from the host device to the A terminal, the power supply voltage PWR1 (3.3V) is supplied to the controller 14 as the main power, and the reset status of the controller 14 is released by the reset circuit RS (step S41).

The voltage detectors DT1 and DT2 check the power supply voltage supplied to the E terminal and the power supply voltage supplied to the C terminal to detect the power configuration of the host device into which the one-power card 10*c* is placed (step S42).

When the host device into which the one-power card 10*c* is placed is the one-power host (when the host device into which the one-power card 10*c* is the one-power host or the two-power host in a case where the one-power card 10*c* is operable in the one-power host and the two-power host) (YES in step S43), the controller 14 asserts the clock request signal CLKREQ # for the host device by driving the clock request signal CLKREQ # to Low (step S44). Then, the reference clock signal REFCLK is supplied from the host device (step S45), the reset status of the PCIe function of the one-power card 10*c* is released by driving PERST # to High by the host device (step S46), and the initialization sequence of the two-power card 10*b* is started (step S47).

In contrast, when the host device into which the one-power card 10*c* is placed is the three-power host (NO in step S43), the controller 14 does not assert the clock request signal CLKREQ # for the host device (step S48).

Figure 22:
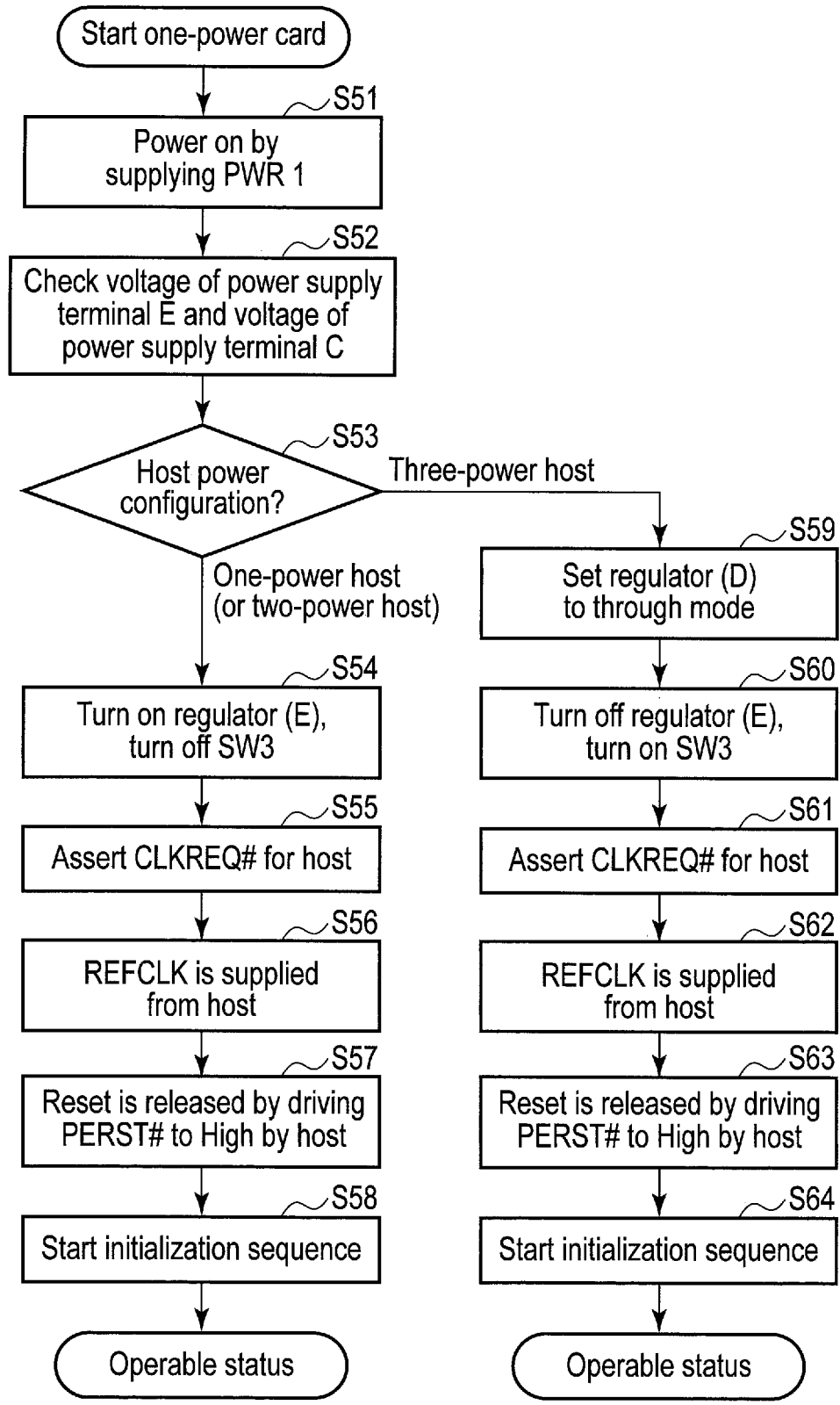
FIG. 22 is a flowchart illustrating a procedure of a process executed by the one-power card applicable to the three-power host.

FIG. 22 is a flowchart illustrating a procedure of a process executed by the one-power card 10*c* applicable to the three-power host.

When the power supply voltage PWR1 (3.3V) is supplied from the host device to the A terminal, the power supply voltage PWR1 (3.3V) is supplied to the controller 14 as the main power, and the reset status of the controller 14 is released by the reset circuit RS (step S51).

The voltage detectors DT1 and DT2 check the power supply voltage supplied to the E terminal and the power supply voltage supplied to the C terminal to detect the power configuration of the host device into which the one-power card 10*c* is placed (step S52).

When the host device into which the one-power card 10*c* is placed is the one-power host (when the host device into which the one-power card 10*c* is the one-power host or the two-power host in a case where the one-power card 10*c* is operable in the one-power host and the two-power host) (step S53), the controller 14 sets each of the voltage regulator (E) VR3 and the switch SW3 to the default status (voltage regulator (E) VR3=on and switch SW3=off) (step S54), and asserts the clock request signal CLKREQ # for the host device by driving the clock request signal CLKREQ # to Low (step 355). Then, the reference clock signal REFCLK is supplied from the host device (step 356), the reset status of the PCIe function of the one-power card 10*c* is released by driving PERST # to High by the host device (step S57), and the initialization sequence of the two-power card 10*b* is started (step S58).

When the host device into which the one-power card 10*c* is placed is the three-power host (step 353), the controller 14 changes the settings of the internal circuit. In this case, the controller 14 sets the voltage regulator (D) VR2 to the through mode (step S59), further sets the voltage regulator (E) VR3 to be turned off, and sets the switch SW3 to be turned off (step S60). Then, the controller 14 asserts the clock request signal CLKREQ # for the host device by driving the clock request signal CLKREQ # to Low (step S61). Then, the reference clock signal REFCLK is supplied from the host device (step S62), the reset status of the PCIe function of the one-power card 10*c* is released by driving PERST # to High by the host device (step 363), and the initialization sequence of the two-power card 10*b* is started (step S64).

FIG. 23 illustrates a configuration example of the host device comprising the function of determining presence of the notch 32*a*.

It is assumed here that the host device is implemented as a two-power host.

The two-power host includes a CPU 111, a memory 112, a system controller 113, a power supply circuit 114, a connector 115, and the like.

The CPU 111 is a processor configured to execute various computer programs (operating system, application program, device driver, and the like) loaded onto the memory 112. The system controller 113 is connected to the connector 115 via a serial interface such as PCIe and is configured to control a card (in this example, two-power card 10b) placed into the connector 115.

The power supply circuit 114 supplies two types of power supply voltages, i.e., power supply voltage PWR1 (3.3V) and power supply voltage PWR2 (1.8V) to the two-power card 10b placed into the connector 115 under control of the system controller 113. In the connector 115, for example, the power supply voltage PWR1 is allocated to the A terminal, the D terminal and the E terminal, and the power supply voltage PWR2 is allocated to the B terminal and the C terminal.

A detection switch 116A is provided at the connector 115 to detect whether the card is placed into the connector 115 or not. The detection switch 116A may be implemented by, for example, a micro-switch or the like. When the card is placed into the connector 115, an active-level card detect signal CD is output from the detection switch 116A to the system controller 113. Furthermore, a detection switch 116B is provided at the connector 115 to determine whether or not the notch 32a is formed at a predetermined position on the side of the card paced into the connector 115. The detection switch 116B may be implemented by, for example, a micro-switch or the like.

When the notch 32a is not formed at a predetermined position on the side of the card placed into the connector 115, the system controller 113 controls the power supply circuit 114 such that the power supply voltage PWR1 (3.3V) or the power supply voltage PWR2 (1.8V) is not supplied to the card. In this case, each of the power supply voltage PWR1 (i.e., 3.3V) and the power supply voltage PWR2 (i.e., 1.8V) is set to 0V. In contrast, when the notch 32a is formed at the predetermined position on the side of the card placed into the connector 115, the system controller 113 controls the power supply circuit 114 such that the power supply voltage PWR1 (3.3V) and the power supply voltage PWR2 (1.8V) are supplied to the card.

FIG. 24 is a timing chart illustrating a process executed by the card and the host device when the card operates in a power configuration supplied from the host device, and a process executed by the card and the host device when the card does not operate in the power configuration supplied from the host device.

FIG. 24(A) illustrates a timing chart in the case where the card operates in the power configuration supplied from the host device. The two-power host starts supply of the power supply voltage PWR1 (3.3V) and the power supply voltage PWR2 (1.8V) at timing t1, the one-power host starts supply of the only power supply voltage PWR1 (3.3V) at timing t1, and the three-power host starts supply of the power supply voltage PWR1 (3.3V), the power supply voltage PWR2 (1.8V), and power supply voltage PWR3 (1.2V) at timing t1.

When the power supply voltage PWR1 (3.3V) rises and becomes stable, the two-power card 10b (or the one-power card 10c) checks the voltage of the E terminal and the voltage of the C terminal and detects the power configuration of the host device.

In addition, when the power supply voltage PWR1 (3.3V) rises and becomes stable, the clock request signal CLKREQ #becomes High.

When the power configuration of the host device is the power configuration that enables the two-power card 10b (or the one-power card 10c) to be operated, the two-power card 10b (or the one-power card 10c) drives the clock request signal CLKREQ # to Low before a predetermined period (Tpok) elapses after the start of supply of the power supply voltage PWR1 (3.3V).

When the clock request signal CLKREQ # is driven to Low, the host device supplies the reference clock REFCLK to the two-power card 10b (or the one-power card 10c) at the point of time (timing t3) when the time (Tclk) elapses from the timing t2 when a predetermined period (Tpok) elapses after the start of supply of the power supply voltage PWR1 (3.3V). Then, at timing t4 when a predetermined period (TPVGGL) elapses after the start of supply of the power supply voltage PWR1 (3.3V), the host device drives PERST # to High, releases the reset status of the two-power card 10b (or the one-power card 10c), and starts the initialization sequence.

FIG. 24(B) illustrates a timing chart in the case where the card does not operate in the power configuration supplied from the host device. The two-power host starts supply of the power supply voltage PWR1 (3.3V) and the power supply voltage PWR2 (1.8V) at timing t1, the one-power host starts supply of the only power supply voltage PWR1 (3.3V) at timing t1, and the three-power host starts supply of the power supply voltage PWR1 (3.3V), the power supply voltage PWR2 (1.8V), and power supply voltage PWR3 (1.2V) at timing t1.

When the power supply voltage PWR1 (3.3V) rises and becomes stable, the two-power card 10b (or the one-power card 10c) checks the voltage of the E terminal and the voltage of the C terminal and detects the power configuration of the host device.

In addition, when the power supply voltage PWR1 (3.3V) rises and becomes stable, the clock request signal CLKREQ #becomes High.

When the power configuration of the host device is the power configuration in which the two-power card 10b (or the one-power card 10c) cannot be operated, the two-power card 10b (or the one-power card 10c) maintains the clock request signal CLKREQ # to High even after a predetermined period (Tpok) elapses after the start of supply of the power supply voltage PWR1 (3.3V).

When the clock request signal CLKREQ # is High after the predetermined period (Tpok) elapses, the host device does not supply the reference clock REFCLK to the two-power card 10b (or the one-power card 10c), and maintains the card in the reset status by maintaining PERST # in the active status (Low) and does not start the initialization sequence.

Figure 25:
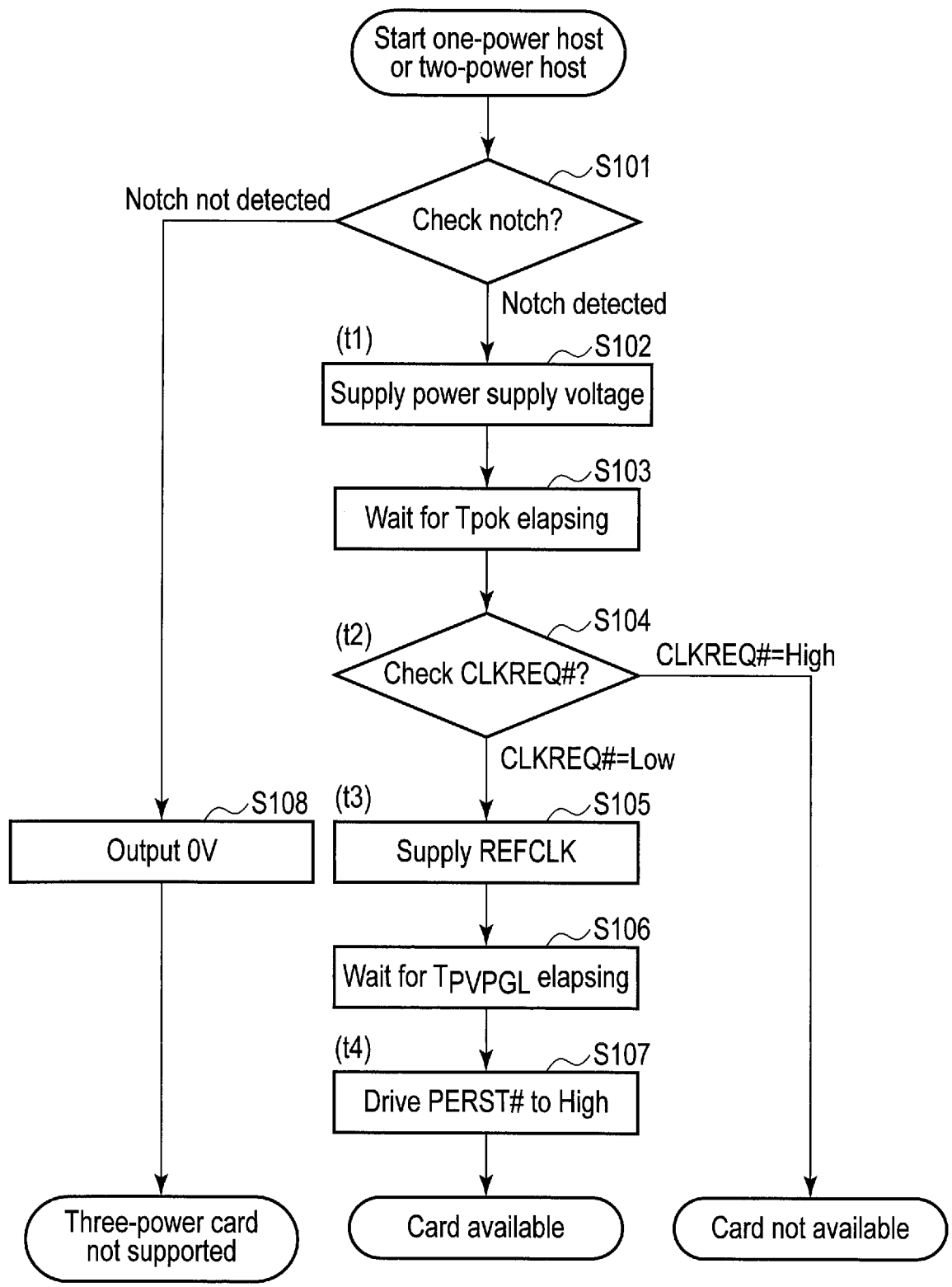
FIG. 25 is a flowchart illustrating a procedure of a process executed by the host device (two-power host or one-power host) according to the first embodiment.

FIG. 25 is a flowchart illustrating a procedure of a process executed by a two-power host (or a one-power card).

When the card is placed into the connector in a state in which the two-power host (or the one-power host) is powered on or when the two-power host (or the one-power host) is powered on in a state in which the card is placed into the connector, the two-power host (or the one-power host) detects the card placed into the connector by a card detect signal CD. When detecting the card placed into the connector, the two-power host (or the one-power host) first checks whether the notch 32a, i.e., a mechanical identifier indicating that the card is the two-power card or one-power card is formed at a predetermined position of the card placed into the connector or not (step S101).

When determining that the notch 32a is formed at the predetermined position of the card, the two-power host (or the one-power host) supplies the power supply voltage to the card (step S102). In this case, the two-power host supplies the power supply voltage PWR1 (3.3V) and the power supply voltage PWR2 (1.8V) to the card, and the one-power host supplies the power supply voltage PWR1 (3.3V) to the card.

The two-power host (or the one-power host) waits for the predetermined time (Tpok) elapsing after the start of supply of the second power set (m types of power supply voltages) (step S103). Then, when the predetermined time (Tpok) elapses after the start of supply of the power supply voltage, the two-power host (or the one-power host) checks the clock request signal CLKREQ #(step S104).

When the clock request signal CLKREQ # is High, the two-power host (or the one-power host) recognizes that an abnormality occurs on the card, does not supply the reference clock REFCLK to the card, and maintains PERST # in the active status (Low) and does not start the initialization sequence.

When the clock request signal CLKREQ # is Low, the two-power host (or the one-power host) supplies the reference clock REFCLK to the card (step S105). Then, the two-power host (or the one-power host) waits until the frequency of the reference clock REFCLK becomes stable. In this case, the two-power host (or the one-power host) waits for, for example, the predetermined time ($T_{PVPGL}$) elapsing after the start of supply of the power supply voltage (m types of power supply voltages) (step S106). In a low temperature environment, this wait time includes the warm-up time of the card.

When the predetermined time ($T_{PVPGL}$) elapses after the start of supply of the power supply voltages (m types of power supply voltages), the two-power host (or the one-power host) drives PERST # to High to release the reset status of the card (step S107), and thereby starts the initialization sequence to enable data to be transmitted or received between the card and the host device via the PCIe interface.

When the notch 32a is not detected at the predetermined position of the card, the two-power host (or the one-power host) does not supply the power supply voltage to the card and sets the power supply voltages supplied to the A terminal, the B terminal, the C terminal, the D terminal, and the E terminal of the connector to 0V (step S108).

Figure 26:
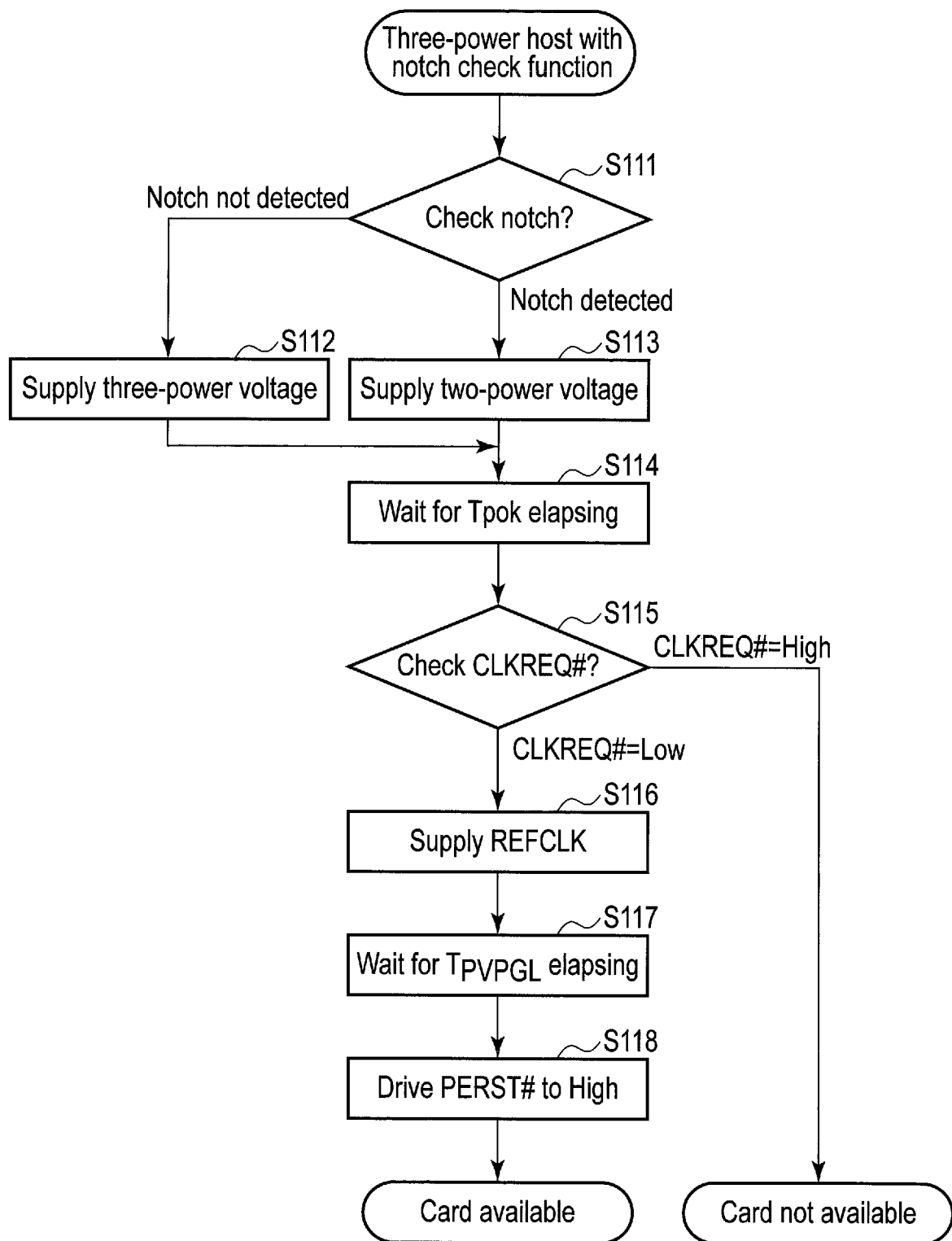
FIG. 26 is a flowchart illustrating a procedure of a process executed by a three-power host equipped with a notch check function.

FIG. 26 is a flowchart illustrating a procedure of a process executed by a three-power host equipped with a notch check function.

The three-power host basically does not comprise a notch check function. In future, however, a three-power host comprising the notch check may be implemented. The three-power host comprising the notch check is a host device that supports both the two-power card and the three-power card.

When the card is placed into the connector in a state in which the three-power host is powered on or when the three-power host is powered on in a state in which the card is placed into the connector, the three-power host detects the card placed into the connector by a card detect signal CD. When detecting the card placed into the connector, the three-power host first checks whether the notch 32a, i.e., a mechanical identifier indicating that the card is the two-power card or one-power card is formed at a predetermined position of the card placed into the connector or not (step S111).

When the notch 32a is not detected at a predetermined position of the card, the three-power host supplies the power supply voltage PWR1 (3.3V), the power supply voltage PWR2 (1.8V), and the power supply voltage PWR3 (1.2V) to the card (step S112). In contrast, when the notch 32a is detected, the three-power host supplies the power supply voltage PWR1 (3.3V) and the power supply voltage PWR2 (1.8V) to the card (step S113).

The three-power host waits for the predetermined time (Tpok) elapsing after the start of supply of three power supply voltages or two power supply voltages (step S114). Then, when the predetermined time (Tpok) elapses after the start of supply of three power supply voltages or two power supply voltages, the three-power host checks the clock request signal CLKREQ #(step S115).

When the clock request signal CLKREQ # is High, the three-power host recognizes that an abnormality occurs on the card, does not supply the reference clock REFCLK to the card, and maintains PERST # in the active status (Low) and does not start the initialization sequence.

When the clock request signal CLKREQ # is Low, the three-power host supplies the reference clock REFCLK to the card (step S116). Then, the three-power host waits for the predetermined time ($T_{PVPGL}$) elapsing after that the supply of three power supply voltages or two power supply voltages is started (step S117). When the predetermined time ($T_{PVPGL}$) elapses after the start of supply of three power supply voltages or two power supply voltages, the three-power host drives PERST # to High to release the reset status of the card (step S118), and thereby starts the initialization sequence.

As described above, the second-generation card (two-power card or one-power card), according to the first embodiment, has approximately the same outer shape as the first-generation card (three-power card) operating with n types of power supply voltages supplied from the outside and is configured to operate with m types of power supply voltages less than n types of power supply voltages supplied from the outside. The second-generation card (two-power card or one-power card) includes a body in which a notch 32a, i.e., a mechanical identifier indicating that the card is a card (second-generation card) of the type of operating with m types of power supply voltages.

The host device configured to supply m types of power supply voltages to the card placed into the connector, i.e., the information processing apparatus (two-power host or one-power host) comprises the function of checking whether or not the mechanical identifier indicating that this card is a card of the type of operating with m types of power supply voltages from the host device, i.e., the notch 32a is formed on the card placed into the connector. The information processing apparatus does not supply the power supply voltage to the card when the notch 32a is not formed at the predetermined position of the card placed into the connector, and supplies m types of power supply voltages to the card when the notch 32a is formed at the predetermined position of the card placed into the connector. Thus, even when the first-generation card is placed into the information processing apparatus, inconvenience such as an abnormal operation of the first-generation card or breakage of the first-generation card can be prevented from occurring since no power supply voltages are supplied to the first-generation card.

In addition, the second-generation card comprises a function of determining whether the host device into which the second-generation card is placed is a first-type host device that supplies n types of power supply voltages or a second-type host device that supplies m types of power supply voltages, based on the voltages of the first and second power supply terminals (E terminal and C terminal) of the plural power supply terminals. In the case where the second-generation card is limited to a card of either of the two-power card and the one-power card, the second-generation card may determine whether the host device into which the second-generation card is placed is a first-type host device that supplies n types of power supply voltages or a second-type host device that supplies m types of power supply voltages, based on the voltage of the predetermined first power supply terminal (E terminal) of the plural power supply terminals. Thus, the second-generation card can determine whether the host device into which the second-generation card is placed is a first-type host device that supplies n types of power supply voltages or a second-type host device that supplies m types of power supply voltages, based on the voltages of the predetermined first and second power supply terminals (E terminal and C terminal) of the plural power supply terminals.

When the host device into which the second-generation card is placed is the second-type host device, the second-generation card asserts the clock request signal CLKREQ # that requests to the host device to supply the reference clock signal. Thus, the host device can normally execute the power-up sequence of the card and can start the initialization sequence to enable data to be transmitted and received between the card and the host device.

In contrast, when the host device into which the second-generation card is placed is the first-type host device, the second-generation card does not assert the clock request signal for the host device. If the initialization sequence to enable data to be transferred between the host device and the card is executed in a state in which the power supply voltage supplied from the host device does not match the power configuration of the second-generation card, the card may start the operation in a state in which a power supply voltage different from an expected power supply voltage is applied to each component in the card, and inconvenience such as an abnormal operation of the car and breakage of the car may be thereby caused. In the first embodiment, when the host device into which the second-generation card is placed is the first-type host device, the second-generation card does not assert the clock request signal for the host device, and the card can be thereby prevented from starting the operation in a state in which a power supply voltage different from an expected power supply voltage is applied to each component in the card.

In addition, the second-generation card comprising the function conforming to the first-type host device may assert the clock request signal for the host device after changing the settings of the internal circuit of the card such that plural types of power supply voltages necessary for the operation of the card are generated from n types of power supply voltages.

In the first embodiment, the notch 32a is formed on the second edge 32 of the body of the second-generation card has been described, but the notch 32a may be formed on the third edge 33 of the body of the second-generation card. In addition, as described in the first embodiment, the mechanical identifier indicative of the second-generation card (second-type semiconductor storage device) is the notch 32a, but a mechanical part other than the notch by which the host device can identify the difference in shape between the first-generation card and the second-generation card may be formed as a mechanical identifier at a predetermined position of the body of the second-generation card (second-type semiconductor storage device). Examples of mechanical part other than the notch include a hole formed in the card body, a protrusion formed on a side or a surface of the card body, a pad formed on a surface of the card body, and the like. In addition, a configuration of detecting the processing of the surface of the card body, the color of the face of the card body and the like by a sensor arranged on the connector can be employed.

In the present embodiment, a NAND flash memory is illustrated as an example of the nonvolatile memory. However, the functions of the first embodiment can also be applied to, for example, various other nonvolatile memories such as a magnetoresistive random access memory (MRAM), a phase change random access memory (PRAM), a resistive random access memory (ReRAM) or a ferroelectric random access memory (FeRAM).

Second Embodiment

Next, the second embodiment will be described with reference to FIG. 27 to FIG. 46.

In the following descriptions, a first-generation card is also referred to as a first-type card, and a second-generation card is also referred to as a second-type card. In addition, a first-type host device and a second-type host device are also referred to as a first-type host and a second-type host, respectively.

In the first embodiment, the case where two types of cards (two-power card and one-power card) exist as the second-type card operating with m types of power supply voltages supplied from the outside has been mainly described but, in the second embodiment, a case where only one type of card (for example, either the two-power card or the one-power card) exists as the second-type card is assumed. In this case, as regards the second-type host configured to supply m types of power supply voltages to the card, too, either of the two-power host that supplies two types of power supply voltages to the card or the one-power host that supplies one type of the power supply voltage to the card exists.

In addition, in the first embodiment, the case where the first-type host (three-power host) configured to supply n types of power supply voltages to the card does not comprise the notch detection function has been mainly described and, in the second embodiment, it is assumed that both the first-type host and the second-type host comprise the notch detection functions.

The shape, circuit configuration, terminal arrangement, signal assignment, formation (presence or absence) of the notch 32a, and the like of the three-power card 10a, the two-power card 10b, and the one-power card 10c are basically the same as those of the first embodiment, and parts different from the first embodiment will be mainly described below.

FIG. 27 is a diagram illustrating a configuration example of a connector 115' provided in the host device according to a second embodiment.

In the second embodiment, each of the first-type host and the second-type host includes the connector 115' illustrated in FIG. 27. The connector 115' is a connector into which the first-type card or the second-type card can be placed, similarly to the connector 115 described in the first embodiment. In other words, both the two types of cards can be placed into the connector 115'. The connector 115' may be a push-push type connector, a push-pull type connector, or a hinge type connector.

The connector 115' includes two types of detection switches, i.e., a detection switch (A) 116A' and a detection switch (B) 116B'. The detection switch (A) 116A' determines whether or not the card is placed into the connector 115'. The detection switch (A) 116A' is arranged at, for example, a position in the connector 115' opposed to an upper side (first edge 31) of the card. When the card is not placed into the connector 115', the detection switch (A) 116A' is in the off status. When the card is placed into the connector 115', the upper side (first edge 31) of the card is brought into contact with the detection switch (A) 116A', the detection switch (A) 116A' is thus pushed, and the detection switch (A) 116A' is thereby turned on.

The detection switch (B) 116B' determines whether or not the notch 32a is formed at a predetermined position on a side surface (second edge 32) of the card placed into the connector 115'. The predetermined position on the side edge where the notch 32a is formed may be a position between the rows R12 and R21, for example, a middle position between the rows R12 and R21. The detection switch (B) 116B' is arranged at a position in the connector 115' opposed to the notch 32a of the side (second edge 32) of the card so as to engage with the notch 32a of the two-power card 10b (or the one-power card 10c).

When the notch 32a is formed at a predetermined position on the side (second edge 32) of the card placed into the connector 115', i.e., when the second-type card (any one of the two-power card 10b and the one-power card 10c) is placed into the connector 115' as illustrated in FIG. 27, the detection switch (B) 116B' is not pushed due to the notch 32a (recess part) but maintained in the off state.

In contrast, when the notch 32a is not formed at a predetermined position on the side (second edge 32) of the card placed into the connector 115', i.e., when the first-type card (three-power card 10a) is placed into the connector 115', the side surface (second edge 32) of the card is brought into contact with the detection switch (B) 116B', the detection switch (B) 116B' is pushed, and the detection switch (B) 116B' is thereby turned on.

Thus, two types of detection switches, i.e., a detection switch (A) 116A' and a detection switch (B) 116B' are provided in the connector 115'. The on status of the detection switch (A) 116A' indicates that the card is placed into the connector 115', and the off status of the detection switch (A) 116A' indicates that the card is not placed into the connector 115'. The off status of the detection switch (B) 116B' indicates that the notch 32a (a mechanical identifier indicating that the card is a second-type card) is formed on the card, and the on status of the detection switch (B) 116B' indicates that the notch 32a is not formed on the card.

FIG. 28 illustrates a correspondence between states of two detection switches arranged in the connector 115' illustrated in FIG. 27 and the card detection results.

As illustrated in FIG. 28(A), when the detection switch (A) 116A' is in the off status, the status of the detection switch (B) 116B' is neglected since the card is not inserted into the connector 115'. When the detection switch (A) 116A' is turned on, the host device can discriminate the type of the card on the basis of the status of the detection switch (B) 116B'. When the detection switch (B) 116B' is in the on status, the host device can discriminate the card placed into the connector 115' as the card having no notch (first-type card). When the detection switch (B) 116B' is in the off status, the host device can discriminate the card placed into the connector 115' as the card having a notch (second-type card).

FIG. 28(B) illustrates generalized statuses of two detection switches in FIG. 28(A). In other words, it can be discriminated that the card is not detected or detected, in accordance with the off/on status of the detection switch (A) 116A'. When the card is detected, it is discriminated whether the card placed into the connector 115' is the card having no notch (first-type card) or the card having a notch (second-type card), in accordance with the on/off status of the detection switch (B) 116B'. Thus, three card statuses (no card, detection of card having a notch, and detection of the card having no notch) are discriminated in accordance with the statuses of two detection switches.

FIG. 29 illustrates a configuration example of a connector 115" configured such that a card having no notch (first-type card) cannot be placed into the connector.

The connector 115" may be, for example, a hinge-type connector. In the connector 115", a protrusion 32b is arranged at a predetermined position in the connector 115" opposed to the notch 32a. For this reason, the card having a notch (second-type card) can be placed into the connector 115", and the card having no notch (first-type card) cannot be placed into the connector 115". In the connector 115", the only detection switch (A) 116A' is arranged and a detection switch (B) 116B' is not arranged.

The connector 115" may be provided at, for example, the second-type host. The first-type card can be thereby prevented from being placed into the second-type host by accident. In the first-type host, the connector 115' of FIG. 27 may be provided.

FIG. 30 illustrates a power configuration example of a first-type host corresponding to the first power set (n types of power supply voltages) and a power configuration example of a second-type host corresponding to the second power set (m types of power supply voltages).

In the second embodiment, two types of power configurations, i.e., first power set (PWR Set 1) and second power set (PWR Set 2) are applied to each of the host and the card. The first power set (PWR Set 1) is n types of power supply voltages (for example, three power supply voltages) and the second-power set (PWR Set 2) is m types of power supply voltages (for example, either two power supply voltages or one power supply voltage). In the first embodiment, use of 3.3V as PWR 1 has been described, and PWR 1 is not limited to 3.3V but PWR 1 of 2.5V may be used when the flash memory 13 is operable with the power supply voltage of 2.5V.

In FIG. 30(A), it is assumed that the first power set (PWR Set 1) is three supply voltages and the second-power set (PWR Set 2) is two power supply voltages. In addition, in FIG. 30(B), it is assumed that the first power set (PWR Set 1) is three power supply voltages and the second-power set (PWR Set 2) is one power supply voltage.

The first-type host (in this example, three-power host) comprises a function (i.e., notch detection) of checking whether or not the notch 32a (i.e., mechanical identifier indicative of a two-power card or a one-power card) is formed on the card placed into the connector in the first-type host. The first-power set (PWR Set 1), i.e., three power supply voltages (PWR1, PWR2, and PWR3) are supplied to the card placed into the connector only when the notch 32a is not formed on the card placed into the connector. The first-type host (in this example, three-power host) does not supply any power supply voltages to the card placed into the connector when the notch 32a is formed on the card placed into the connector.

In the first-power set (PWR Set 1), in any one of the power configurations in FIGS. 30(A) and (B), the power supply voltage PWR1 (3.3V or 2.5V) is assigned to the A terminal, the power supply voltage PWR2 (1.8V) is assigned to each of the B terminal and the C terminal, and the power supply voltage PWR3 (1.2V) is assigned to the D terminal and the E terminal. Therefore, when the notch 32a is not formed on the card placed into the connector, the first-type host (in this example, the three-power host) supplies the power supply voltage PWR1 (3.3V or 2.5V) to the A terminal, the power supply voltage PWR2 (1.8V) to each of the B terminal and the C terminal, and the power supply voltage PWR3 (1.2V) to each of the D terminal and the E terminal.

The second-type host (in this example, two-power host) comprises a function (i.e., notch detection) of checking whether or not the notch 32a is formed on the card placed into the connector. The second-type host (in this example, the two-power host) supplies a second-power set (PWR Set 2), i.e., two-power supply voltage (PWR1 and PWR2) to the card placed into the connector only when the notch 32a is formed on the card placed into the connector.

When the notch 32a is not formed on the card placed into the connector, the second-type host (in this example, the two-power host) does not supply any power supply voltages to the card placed into the connector.

In the power configuration in FIG. 30(A), in the two-power host, the power supply voltage PWR1 is assigned to the E terminal to which the power supply voltage PWR3 is assigned in the three-power host. In addition, in the two-power host, the power supply voltage PWR1 (or the power supply voltage PWR2) is assigned to the D terminal to which the power supply voltage PWR3 is assigned in the three-power host.

Therefore, when the notch 32a is formed on the card placed into the connector, the two-power host supplies the power supply voltage PWR1 (3.3V or 2.5V) to the A terminal, the power supply voltage PWR2 (1.8V) to each of the B terminal and the C terminal, the power supply voltage PWR1 (3.3V or 2.5V) or PWR2 (1.8V) to the D terminal, and the power supply voltage PWR1 (3.3V or 2.5V) to the E terminal.

The first-type host also comprises a function (i.e., notch detection) of checking whether or not the notch 32a is formed on the card placed into the connector or not. The one-power host supplies a power supply voltage (PWR1) to the card placed into the connector only when the notch 32a is formed on the card placed into the connector. The one-power host does not supply the power supply voltage to the card placed into the connector when the notch 32a is not formed on the card placed into the connector.

In the power configuration in (FIG. 30(B), in the one-power host, the power supply voltage PWR1 is assigned to each of the A terminal, the B terminal, the C terminal, D terminal, and the E terminal. Therefore, when the notch 32a is formed on the card placed into the connector, the one-power host supplies the power supply voltage PWR1 (3.3V or 2.5V) to the A terminal, the B terminal, the C terminal, the D terminal, and the E terminal.

FIG. 31 illustrates all combinations of the two type hosts (first-type host and second-type host) and two type cards (first-type card and second-type card), and an operation of the card in each of the combinations.

When the power configuration of the card matches the power configuration of the host into which the card is placed, the card is operable (Available). When the power configuration of the card does not match the power configuration of the host into which the card is placed, the card is inoperable (N/A: Not Available).

Each of the first-type card and the second-type card can discriminate the power configuration of the host, based on the voltage of the E terminal, and can notify the host device of the possibility of its operation with CLKREQ #. When the power configuration of the card matches the power configuration of the host, CLKREQ # is set to Low. In this case, CLKREQ #=Low indicates that the card is operable. When the card power configuration does not match the host power configuration, CLKREQ # is set to High. CLKREQ #=High indicates that the card is inoperable. Thus, since each of the first-type card and the second-type card comprises a function of discriminating the host power configuration, safety of the card can be secured even when the notch discriminating function (notch detection) of the host side operates erroneously.

In addition, each of the first-type card and the second-type card also sets CLKREQ # to High when being inoperable for reasons other than the mismatch between the card power configuration and the host power configuration. Examples of the other reasons include abnormality of the power supply voltage value and the like.

FIG. 32 is a block diagram illustrating a configuration example of the two-power card 10b that is the second-type card.

FIG. 32 illustrates an example that PWR1 is 3.3V, but PWR1 may be 2.5V as described above. The configuration of the two-power card 10b of the second embodiment is approximately the same as that of the two-power card of the first embodiment described with reference to FIG. 10 and the like. In the controller 14 of the two-power card 10b according to the second embodiment, too, the physical layer (PHY) 51, the logic circuit 52, and the NAND interface (NAND I/F) 53 are provided. In addition, the controller 14 includes voltage regulators VR1 and VR2, and a voltage detector DT11.

Each of the voltage regulators VR11 and VR12 is a down-converter that generates a desired output voltage lower than the input voltage. The output voltage value can be preset. For example, when the power supply voltage PWR2 (1.8V) or the power supply voltage PWR1 (3.3V or 2.5V) is input to each of the voltage regulators VR11 and VR12, each of the voltage regulators VR11 and VR12 generates the power supply voltage PWR3 (1.2V) from the power supply voltage PWR2 (1.8V) or the power supply voltage PWR1 (3.3V).

The voltage detector DT11 detects the power supply voltage PWR1 (3.3V or 2.5V) or the power supply voltage PWR3 (1.2V) as the voltage of the E terminal. The E terminal is a power supply terminal to which PWR3 (1.2V) is assigned in the three-power card 10a and the power supply voltage PWR1 (3.3V or 2.5V) is assigned in the two-power card 10b.

Figure 33:
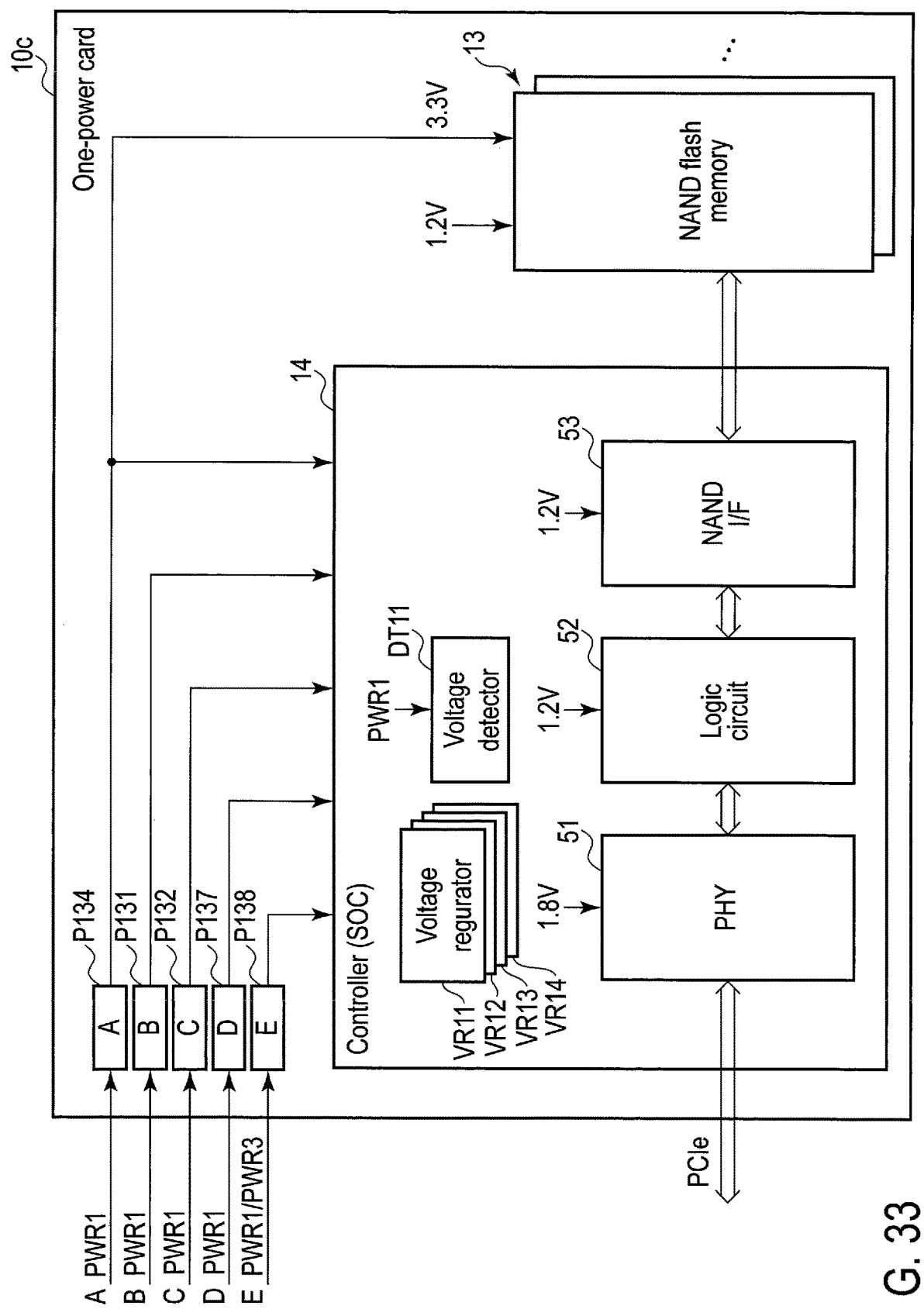
FIG. 33 is a diagram illustrating a configuration example of the one-power card that is the second-type card.

FIG. 33 is a block diagram illustrating a configuration example of the one-power card 10c according to the second embodiment.

The one-power card 10c is different from the two-power card 10b of FIG. 32 with respect to a feature that voltage regulators VR13 and VR14 are provided in the controller 14 as well as the voltage regulators VR11 and VR12, and the other constituent elements are the same as those of the two-power card 10b of FIG. 32. The voltage regulator VR13 is a down-converter that generates a desired output voltage lower than the input voltage. The output voltage value can be preset. For example, when the power supply voltage PWR1 (3.3V or 2.5V) is input to the voltage regulator VR13, the voltage regulator VR13 generates the power supply voltage PWR2 (1.8V) from the power supply voltage PWR1 (3.3V or 2.5V).

The voltage regulator VR14 is also a down-converter that generates a desired output voltage which is lower than the input voltage. The output voltage value can be preset. For example, when the power supply voltage PWR1 (3.3V or 2.5V) is input to the voltage regulator VR14, the voltage regulator VR14 generates the power supply voltage PWR3 (1.2V) from the power supply voltage PWR1 (3.3V or 2.5V).

Figures 34, 35:
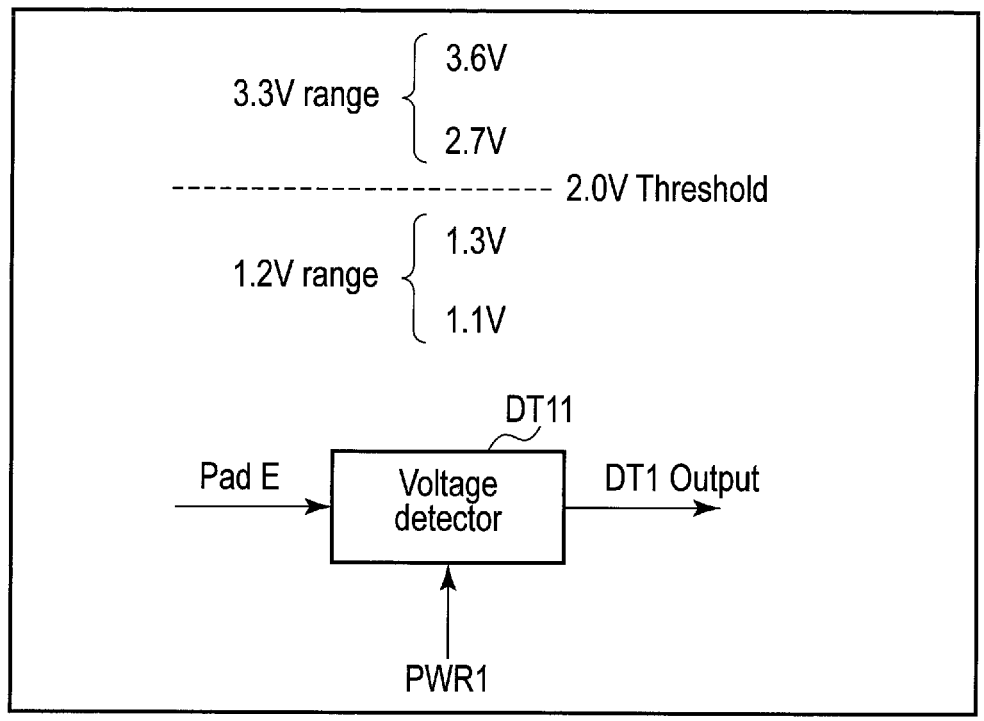
FIG. 34 is a diagram illustrating a configuration example of the first voltage detector used to detect the host power configuration.
FIG. 35 is a table illustrating a relationship between detected output of the first voltage detector and two-type host devices (first-type host and second-type host).

FIG. 34 illustrates a configuration example of the voltage detector DT11.

The voltage detector DT11 is driven with the power supply voltage PWR1 (3.3V or 2.5V) supplied to the A terminal. The voltage detector DT11 detects the power supply voltage PWR1 (3.3V or 2.5V) or the power supply voltage PWR3 (1.2V) as the voltage of the E terminal (Pad E). When the PWR1 is 3.3V, a threshold voltage of the voltage detector DT1 is set to 2.0V, i.e., a middle value between a 1.2V range (1.1V to 1.3V) and a 3.3V range (2.7V to 3.6V). The detected output of the voltage detector DT1 is High when the power supply voltage PWR1 (3.3V) is supplied to the E terminal (Pad E), and the detected output of the voltage detector DT1 is Low when the power supply voltage PWR3 (1.2V) is supplied to the E terminal (Pad E).

When the PWR1 is 2.5V, the threshold voltage of the voltage detector DT1 may be set to a middle value between a 1.2V range and a 2.5V range.

FIG. 35 illustrates a relationship between detected output of the voltage detector DT11 and two-type host devices (first-type host and second-type host).

When the detected output of the voltage detector DT11 is Low, the card determines that the type of the host into which the card is placed is the first-type host. When the detected output of the voltage detector DT11 is High, the card determines that the type of the host into which the card is placed is the second-type host.

FIG. 36 illustrates a configuration example of the two-power card 10b.

The two-power card 10b that is the second-type card is configured to assert the clock request signal for the host device only when the host device into which the two-power card 10b is placed is the second-type host (two-power host) to increase safety of the two-power card 10b.

The A terminal is not connected to any voltage regulators, and the power supply voltage PWR1 (3.3V or 2.5V) supplied to the A terminal is supplied to several components in the two-power card 10b as the internal power supply voltage PWR1A (3.3V or 2.5V) via a power supply line W1. In addition, a reset circuit RS is connected to the A terminal. When the power supply voltage PWR1 (3.3V or 2.5V) is supplied to the A terminal, the reset circuit RS outputs a power-on reset signal Reset and thereby releases the reset status of the controller 14. The reset circuit RS may be a reset IC connected to the controller 14.

A voltage regulator (B) VR11 is connected to the B terminal. The voltage regulator (B) VR11 has, for example, a withstand voltage of 3.3V (or 2.5V) or more. The voltage regulator (B) VR11 generates a predetermined power supply voltage (1.2V) lower than the power supply voltage input to the voltage regulator VR11. The power supply voltage (1.2V) generated by the voltage regulator (B) VR11 is supplied to several components in the two-power card 10b as the internal power supply voltage PWR3B (1.2V) via a power supply line W2.

The C terminal is not connected to any voltage regulators, and the power supply voltage PWR2 (1.8V) supplied to the C terminal is supplied to several components in the two-power card 10b as the internal power supply voltage PWR2C (1.8V) via a power supply line W3.

A voltage regulator (D) VR12 is connected to the D terminal. The voltage regulator (D) VR12 has, for example, a withstand voltage of 3.3V (or 2.5V) or more. The voltage regulator (D) VR12 generates a predetermined power supply voltage (1.2V) lower than the power supply voltage input to the voltage regulator VR12. The power supply voltage (1.2V) generated by the voltage regulator (D) VR12 is supplied to several components in the two-power card 10b as the internal power supply voltage PWR3D (1.2V) via a power supply line W4.

The E terminal is not connected to any voltage regulators, and the power supply voltage PWR1 (3.3V or 2.5V) supplied to the E terminal is supplied to several components in the two-power card 10b as the internal power supply voltage PWR1E (3.3V or 2.5V) via a power supply line W5.

The detected output level of the voltage detector DT11 is determined by the voltage of the E terminal. The two-power card 10b can operate only when the two-power card 10b is placed into the two-power host (DT11=High). Therefore, in the case where DT11=High, the two-power card 10b drives the clock request signal CLKREQ # to Low. In contrast, in the case where DT11=Low, the two-power card 10b maintains the clock request signal CLKREQ # at High.

FIG. 37 illustrates a configuration example of the one-power card 10c.

The A terminal is not connected to any voltage regulators, and the power supply voltage PWR1 (3.3V or 2.5V) supplied to the A terminal is supplied to several components in the one-power card 10c as the internal power supply voltage PWR1A (3.3V or 2.5V) via a power supply line W1. In addition, a reset circuit RS is connected to the A terminal. When the power supply voltage PWR1 (3.3V or 2.5V) is supplied to the A terminal, the reset circuit RS outputs a power-on reset signal Reset and thereby releases the reset status of the controller 14.

A voltage regulator (B) VR11 is connected to the B terminal. The voltage regulator (B) VR11 has, for example, a withstand voltage of 3.3V (or 2.5V) or more. The voltage regulator (B) VR11 generates a predetermined power supply voltage (1.2V) lower than the power supply voltage input to the voltage regulator (B) VR11. The power supply voltage (1.2V) generated by the voltage regulator (B) VR11 is supplied to several components in the one-power card 10c as the internal power supply voltage PWR3B (1.2V) via a power supply line W2.

A voltage regulator (C) VR13 is connected to the C terminal. The voltage regulator (C) VR13 has, for example, a withstand voltage of 3.3V (or 2.5V) or more. The voltage regulator (C) VR13 generates a predetermined power supply voltage (1.8V) lower than the power supply voltage input to the voltage regulator (C) VR13. The power supply voltage (1.8V) generated by the voltage regulator (C) VR13 is supplied to several components in the one-power card 10c as an internal power supply voltage PWR2C (1.8V) via a power supply line W3.

A voltage regulator (D) VR12 is connected to the D terminal. The voltage regulator (D) VR2 has, for example, a withstand voltage of 3.3V (or 2.5V) or more. The voltage regulator (D) VR12 generates a predetermined power supply voltage (1.2V) lower than the power supply voltage input to the voltage regulator (D) VR12. The power supply voltage (1.2V) generated by the voltage regulator (D) VR12 is supplied to several components in the one-power card 10c as the internal power supply voltage PWR3D (1.2V) via a power supply line W4.

A voltage regulator (E) VR14 is connected to the E terminal. The voltage regulator (E) VR14 has, for example, a withstand voltage of 3.3V (or 2.5V) or more. The voltage regulator (E) VR14 generates a predetermined power supply voltage (1.2V) lower than the power supply voltage input to the voltage regulator (E) VR14. The power supply voltage (1.2V) generated by the voltage regulator (E) VR14 is supplied to several components in the one-power card 10c as an internal power supply voltage PWR3E (1.2V) via a power supply line W5.

The detected output level of the voltage detector DT11 is determined by the voltage of the E terminal. In the case where the one-power card 10c comprises the configuration of FIG. 37, the one-power card 10c can operate when the one-power card 10c is placed into the second-type host (one-power host) (DT11=High) and cannot operate when the one-power card 10c is placed into the first-type host (three-power host) (DT11=Low).

In the second embodiment, the first-type card (three-power card) may comprise the function of discriminating the host power configuration in accordance with the voltage of the E terminal, similarly to the second-type card. The first-type card (three-power card) can operate when the three-power card 10a is placed into the first-type host (DT11=Low) and cannot operate when the three-power card 10a is placed into the second-type host (DT11=High).

FIG. 38 is a flowchart illustrating a procedure of a process executed by the second-type card (in this example, two-power card 10b).

When the power supply voltage PWR1 (3.3V or 2.5V) is supplied from the host device to the A terminal, the power supply voltage PWR1 (3.3V or 2.5V) is supplied to the controller 14 as the main power, and the reset status of the controller 14 is released by the reset circuit RS (step S71).

The voltage detector DT11 checks the power supply voltage supplied to the E terminal to detect the power configuration of the host device into which the second-type card (in this example, two-power card 10b) is placed (step S72).

When DT11=High, i.e., when the host device into which the second-type card (in this example, two-power card 10b) operating with the second-power set (m types of power supply voltages) is placed is the second-type host (in this example, two-power host) that supplies the second-power set (in this example, m types of power supply voltages) (YES in step S73), the controller 14 asserts the clock request signal CLKREQ # for the host device by driving the clock request signal CLKREQ # to Low (step S74). Then, the reference clock signal REFCLK is supplied from the host device (step S75), the reset status of the PCIe function of the second-type card (in this example, two-power card 10b) is released by driving PERST # to High by the host device (step S76), and the initialization sequence of the second-type card (in this example, two-power card 10b) is started (step S77).

In contrast, when the host device into which the second-type card (in this example, two-power card 10b) is placed is the first-type host (three-power host) (NO in step S73), the controller 14 does not assert the clock request signal CLKREQ # for the host device (step S78).

FIG. 39 is a flowchart illustrating a procedure of a process executed by the second-type card (in this example, one-power card 10c).

When the power supply voltage PWR1 (3.3V or 2.5V) is supplied from the host device to the A terminal, the power supply voltage PWR1 (3.3V or 2.5V) is supplied to the controller 14 as the main power, and the reset status of the controller 14 is released by the reset circuit RS (step S81).

The voltage detector DT11 checks the power supply voltage supplied to the E terminal to detect the power configuration of the host device into which the second-type card (in this example, one-power card 10c) is placed (step S82).

When DT11=High, i.e., when the host device into which the second-type card (in this example, one-power card 10c) operating with the second-power set (m types of power supply voltages) is placed is the second-type host (in this example, one-power host) that supplies the second-power set (in this example, m types of power supply voltages) (YES in step S83), the controller 14 asserts the clock request signal CLKREQ # for the host device by driving the clock request signal CLKREQ # to Low (step S84). Then, the reference clock signal REFCLK is supplied from the host device (step S85), the reset status of the PCIe function of the second-type card (in this example, one-power card 10c) is released by driving PERST # to High by the host device (step S86), and the initialization sequence of the second-type card (in this example, one-power card 10c) is started (step S87).

In contrast, when the host device into which the second-type card (in this example, one-power card 10c) is placed is the first-type host (three-power host) (NO in step S83), the controller 14 does not assert the clock request signal CLKREQ # for the host device (step S88).

When DT11=Low, i.e., when the host device into which the first-type card (in this example, three-power card 10a) is placed is the first-type host (in this example, three-power host) that supplies the first-power set (in this example, n types of power supply voltages), the first-type card (in this example, three-power card 10a) operating with the first-power set (n types of power supply voltages) asserts the clock request signal CLKREQ # for the host device by driving the clock request signal CLKREQ # to Low. In contrast, when DT11=High, i.e., when the host device into which the first-type card (in this example, three-power card 10a) is placed is the second-type host that supplies the second-power set (in this example, m types of power supply voltages), the first-type card (three-power card 10a) does not assert the clock request signal CLKREQ # for the host device.

Figure 40:
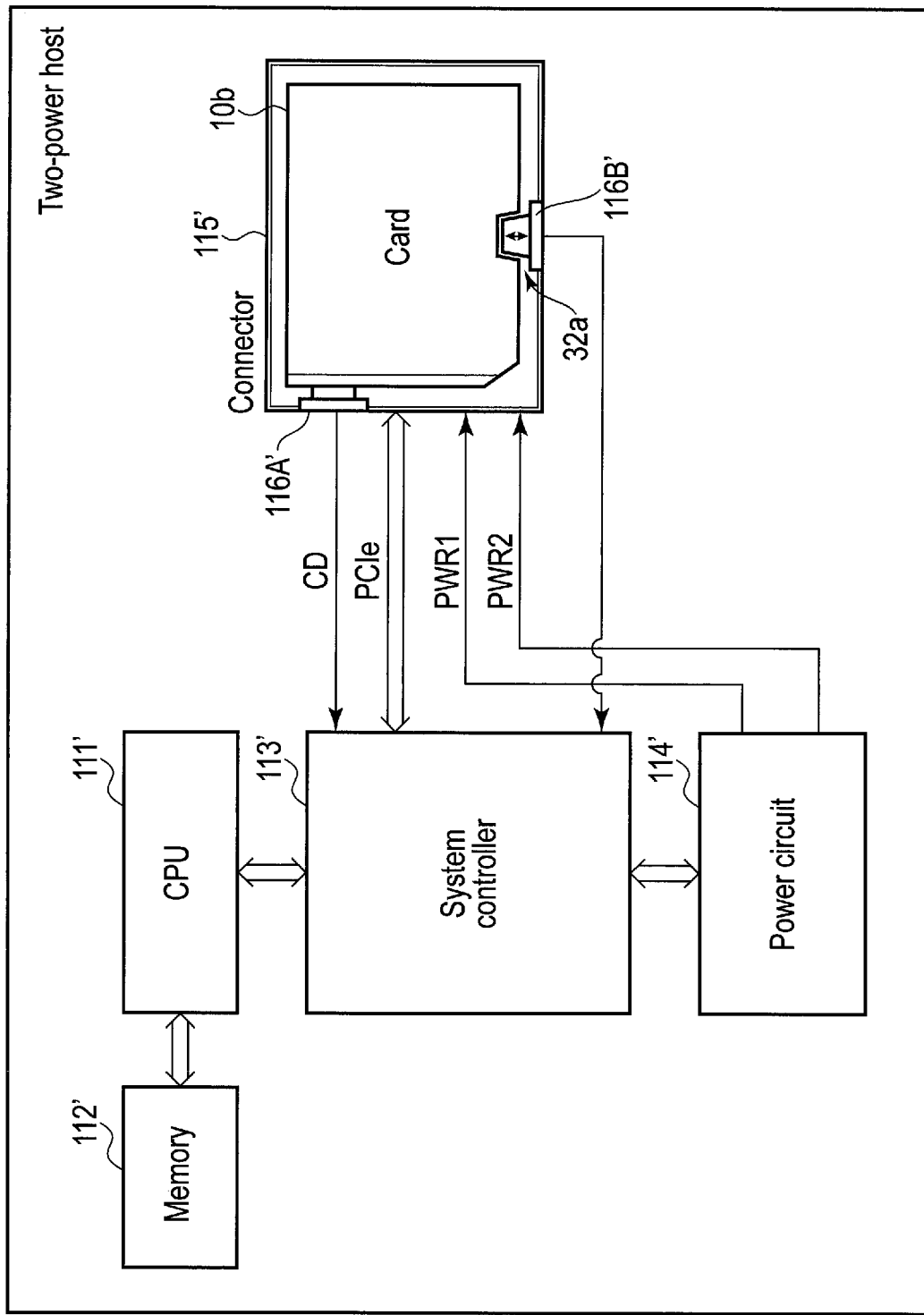
FIG. 40 is a block diagram illustrating a configuration example of an information processing apparatus that is the host device (two-power host) according to the second embodiment.

FIG. 40 is a block diagram illustrating a configuration example of the information processing apparatus that is the second-type host (in this example, two-power host).

The second-type host (in this example, two-power host) includes a CPU 111', a memory 112', a system controller 113', a power supply circuit 114', a connector 115', and the like.

The CPU 111' is a processor configured to execute various computer programs (operating system, application program, device driver, and the like) loaded onto the memory 112'. The system controller 113' is connected to the connector 115' via a serial interface such as PCIe and is configured to control a second-type card (in this example, two-power card 10b) placed into the connector 115'.

The power supply circuit 114' supplies two types of power supply voltages, i.e., power supply voltage PWR1 (3.3V or 2.5V) and power supply voltage PWR2 (1.8V) to the second-type card (in this example, two-power card 10b) placed into the connector 115' under control of the system controller 113'. In the connector 115', for example, the power supply voltage PWR1 is assigned to the A terminal, the D terminal and the E terminal, and the power supply voltage PWR2 is assigned to the B terminal and the C terminal.

A detection switch (A) 116A' is provided at the connector 115' to determine whether or not the card is placed into the connector 115'. The detection switch (A) 116A' may be implemented by, for example, a micro-switch or the like. When the card is placed into the connector 115', an active-level card detect signal CD is output from the detection switch (A) 116A' to the system controller 113'. Furthermore, a detection switch (B) 116B' is provided at the connector 115' to determine whether or not the notch 32*a* is formed at a predetermined position on the side of the card placed into the connector 115. The detection switch (B) 116B' may be implemented by, for example, a micro-switch or the like.

When the notch 32*a* is not formed at the predetermined position on the side of the card placed into the connector 115', the system controller 113' controls the power supply circuit 114' such that the power supply voltage PWR1 (3.3V or 2.5V) or the power supply voltage PWR2 (1.8V) is not supplied to the card. In this case, each of the power supply voltage PWR1 and the power supply voltage PWR2 is set to 0V. In contrast, when the notch 32*a* is formed at the predetermined position on the side of the card placed into the connector 115', the system controller 113' controls the power supply circuit 114' such that the power supply voltage PWR1 (3.3V or 2.5V) and the power supply voltage PWR2 (1.8V) are supplied to the card.

FIG. 41 is a block diagram illustrating a configuration example of the information processing apparatus that is the second-type host (in this example, a one-power host).

The second-type host (in this example, one-power host) includes a CPU 111", a memory 112", a system controller 113", a power supply circuit 114", a connector 115', and the like.

The CPU 111" is a processor configured to execute various computer programs (operating system, application program, device driver, and the like) loaded onto the memory 112". The system controller 113" is connected to the connector 115' via a serial interface such as PCIe and is configured to control a second-type card (in this example, one-power card 10*c*) placed into the connector 115'.

The power supply circuit 114" supplies one type of power supply voltage, i.e., power supply voltage PWR1 (3.3V or 2.5V) to the second-type card (in this example, one-power card 10*c*) placed into the connector 115' under control of the system controller 113". In the connector 115', for example, the power supply voltage PWR1 is allocated to the A terminal, the B terminal, the C terminal, the D terminal, and the E terminal.

In the connector 115', the detection switch (A) 116A' and the detection switch (B) 116B' are provided. Each of the detection switch (A) 116A' and the detection switch (B) 116B' may be implemented by, for example, a micro-switch or the like.

When the notch 32*a* is not formed at the predetermined position on the side of the card placed into the connector 115, the system controller 113" controls the power supply circuit 114" such that the power supply voltage PWR1 (3.3V or 2.5V) is not supplied to the card. In this case, the power supply voltage PWR1 is set to 0V. In contrast, when the notch 32*a* is formed at the predetermined position on the side of the card placed into the connector 115', the system controller 113" controls the power supply circuit 114" such that the power supply voltage PWR1 (3.3V) is supplied to the card.

Figure 42:
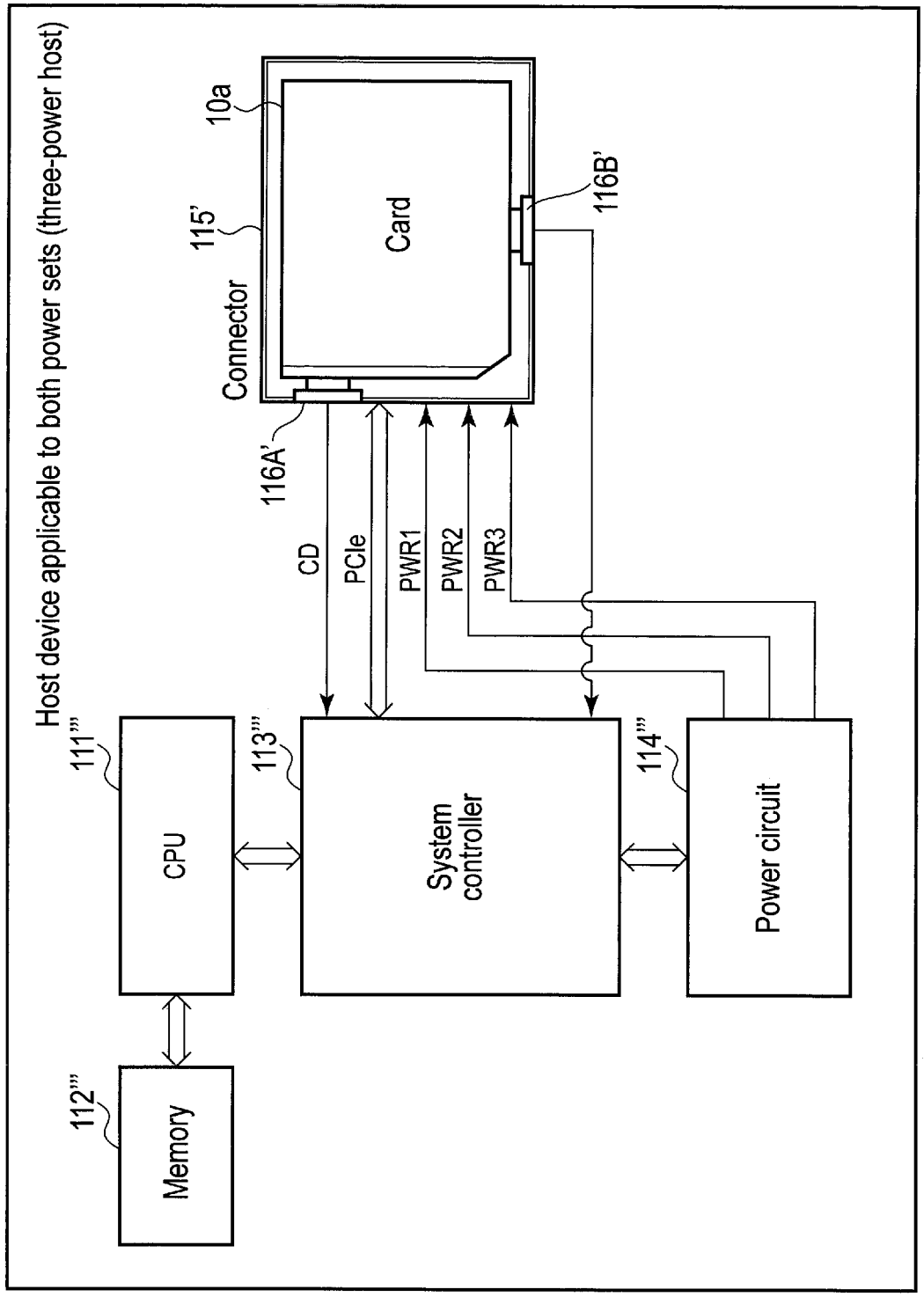
FIG. 42 is a block diagram illustrating a configuration example of an information processing apparatus that is the host device (three-power host) according to the second embodiment.

FIG. 42 is a block diagram illustrating a configuration example of the information processing apparatus that is the first-type host (in this example, three-power host).

The first-type host (in this example, three-power host) includes a CPU 111'''; a memory 112'''; a system controller 113'''; a power supply circuit 114'''; a connector 115'; and the like.

The CPU 111''' is a processor configured to execute various computer programs (operating system, application program, device driver, and the like) loaded onto the memory 112'''. The system controller 113''' is connected to the connector 115' via a serial interface such as PCIe and is configured to control a first-type card (in this example, three-power card 10*a*) placed into the connector 115'.

The power supply circuit 114''' supplies three types of power supply voltages, i.e., power supply voltage PWR1 (3.3V or 2.5V), the power supply voltage PWR2 (1.8V), and the power supply voltage PWR3 (1.2V) to the first-type card (in this example, three-power card 10*a*) placed into the connector 115' under control of the system controller 113'''. In the connector 115', for example, the power supply voltage PWR1 is assigned to the A terminal, the power supply voltage PWR2 is assigned to the B terminal and the C terminal, and the power supply voltage PWR3 is assigned to the D terminal and the E terminal.

In the connector 115', the detection switch (A) 116A' and the detection switch (B) 116B' are provided. Each of the detection switch (A) 116A' and the detection switch (B) 116B' may be implemented by, for example, a micro-switch or the like.

When the notch 32*a* is formed at the predetermined position on the side of the card placed into the connector 115', the system controller 113''' controls the power supply circuit 114''' such that the power supply voltage PWR1 (3.3V or 2.5V), the power supply voltage PWR2 (1.8V) or the power supply voltage PWR3 (1.2V) is not supplied to the card. In this case, each of the power supply voltage PWR1, the power supply voltage PWR2, and the power supply voltage PWR3 is set to 0V. In contrast, when the notch 32*a* is not formed at the predetermined position on the side of the card placed into the connector 115', the system controller 113''' controls the power supply circuit 114''' such that the power supply voltage PWR1 (3.3V or 2.5V), the power supply voltage PWR2 (1.8V), and the power supply voltage PWR3 (1.2V) are supplied to the card.

FIG. 43 is a timing chart illustrating a process executed by the card and the host device when the card operates in the power configuration supplied from the host device, and a process executed by the card and the host device when the card does not operate in the power configuration supplied from the host device.

FIG. 43(A) illustrates a timing chart in the case where the card operates in the power configuration supplied from the host device. The two-power host starts supply of the power supply voltage PWR1 (3.3V or 2.5V) and the power supply voltage PWR2 (1.8V) at timing t1, the one-power host starts supply of the only power supply voltage PWR1 (3.3V or 2.5V) at timing t1, and the three-power host starts supply of the power supply voltage PWR1 (3.3V or 2.5V), the power supply voltage PWR2 (1.8V), and power supply voltage PWR3 (1.2V) at timing t1.

When the power supply voltage PWR1 (3.3V or 2.5V) rises and becomes stable, each of the first-type card and the second-type card checks the voltage of the E terminal and detects the power configuration of the host device.

In addition, when the power supply voltage PWR1 (3.3V or 2.5V) rises and becomes stable, the clock request signal CLKREQ #becomes High.

When the power configuration of the host device matches the power configuration of the card, each of the first-type card and the second-type card drives the clock request signal CLKREQ # to Low before a predetermined period (Tpok) elapses after the start of supply of the first power set or the second power set.

When the clock request signal CLKREQ # is driven to Low, the host device supplies the reference clock REFCLK to the card at the point of time (timing t3) when the time (Tclk) elapses from the timing t2 when a predetermined period (Tpok) elapses after the start of supply of the first power set or the second power set. Then, at timing t4 when a predetermined period (TPVGGL) elapses after the start of supply of the first power set or the second power set, the host device drives PERST # to High, releases the reset status of the card, and starts the initialization sequence.

FIG. 43(B) illustrates a timing chart in the case where the card does not operate in the power configuration supplied from the host device. The two-power host starts supply of the power supply voltage PWR1 (3.3V or 2.5V) and the power supply voltage PWR2 (1.8V) at timing t1, the one-power host starts supply of the only power supply voltage PWR1 (3.3V or 2.5V) at timing t1, and the three-power host starts supply of the power supply voltage PWR1 (3.3V or 2.5V), the power supply voltage PWR2 (1.8V), and power supply voltage PWR3 (1.2V) at timing t1.

When the power supply voltage PWR1 (3.3V or 2.5V) rises and becomes stable, each of the first-type card and the second-type card checks the voltage of the E terminal and detects the power configuration of the host device.

In addition, when the power supply voltage PWR1 (3.3V) rises and becomes stable, the clock request signal CLKREQ #becomes High.

When the power configuration of the host device does not match the power configuration of the card, each of the first-type card and the second-type card maintains the clock request signal CLKREQ # at High even after a predetermined period (Tpok) elapses from the start of supply of the first power set or the second power set.

When the clock request signal CLKREQ # is High after the predetermined period (Tpok) elapses, the host device does not supply the reference clock REFCLK to the card, and maintains the card in the reset status by maintaining PERST # in the active status (Low) and does not start the initialization sequence.

FIG. 44 is a flowchart illustrating a procedure of a process executed by a first-type host (three-power host).

The first-type host (three-power host) determines which of three card statuses (no card, detection of the card having a notch, and detection of the card having no notch) is the current card status by checking the on/off status of the detection switch (A) 116A' and the detection switch (B) 116B' (step S121).

When the card is not placed into the connector (no card), the first-type host (three-power host) does not supply the first power set (PWR Set 1: n types of power supply voltages) to the connector.

When the notch 32a is formed on the card placed into the connector (card having a notch is detected), the first-type host (three-power host) does not supply the first power set (PWR Set 1: n types of power supply voltages) to the connector.

When the notch 32a is not formed on the card placed into the connector (card having no notch is detected), the first-type host (three-power host) supplies the first power set (PWR Set 1: n types of power supply voltages) to the card (step S122).

The first-type host (three-power host) waits for the predetermined time (Tpok) elapsing after the start of supply of the first power set (PWR Set 1: n types of power supply voltages) (step 3123). Then, when the predetermined time (Tpok) elapses after the start of supply of the first power set (n types of power supply voltages), the first-type host (three-power host) checks the clock request signal CLKREQ #(step S124).

When the clock request signal CLKREQ # is High, the first-type host (three-power host) recognizes that an abnormality occurs on the card, stops the supply of the first power set (PWR Set 1: n types of power supply voltages), and sets all of n types of power supply voltages to 0V (step S125). In other words, the first-type host (three-power host) does not supply the reference clock REFCLK to the card, and maintains PERST # in the active status (Low) and does not start the initialization sequence.

When the clock request signal CLKREQ # is Low, the first-type host (three-power host) supplies the reference clock REFCLK to the card (step S126). Then, the first-type host (three-power host) waits until the frequency of the reference clock REFCLK becomes stable. In this case, the first-type host (three-power host) waits for, for example, the predetermined time ($T_{PVPGL}$) elapsing after the start of supply of the first power set (PWR Set 1: n types of power supply voltages) (step S127). In a low temperature environment, this wait time includes the warm-up time of the card.

When the predetermined time ($T_{PVPGL}$) elapses after the start of supply of the first power set (PWR Set 1: n types of power supply voltages), the first-type host (three-power host) drives PERST # to High to release the reset status of the card (step S128), and thereby starts the initialization sequence to enable data to be transmitted or received between the card and the host device via the PCIe interface. In other words, in step S128, the first-type host (three-power host) supplies the High signal (PERST #) to the terminal (P133) of the card used to release the reset status of the card after the predetermined time elapses after the supply of n types of power supply voltages to the card.

Figure 45:
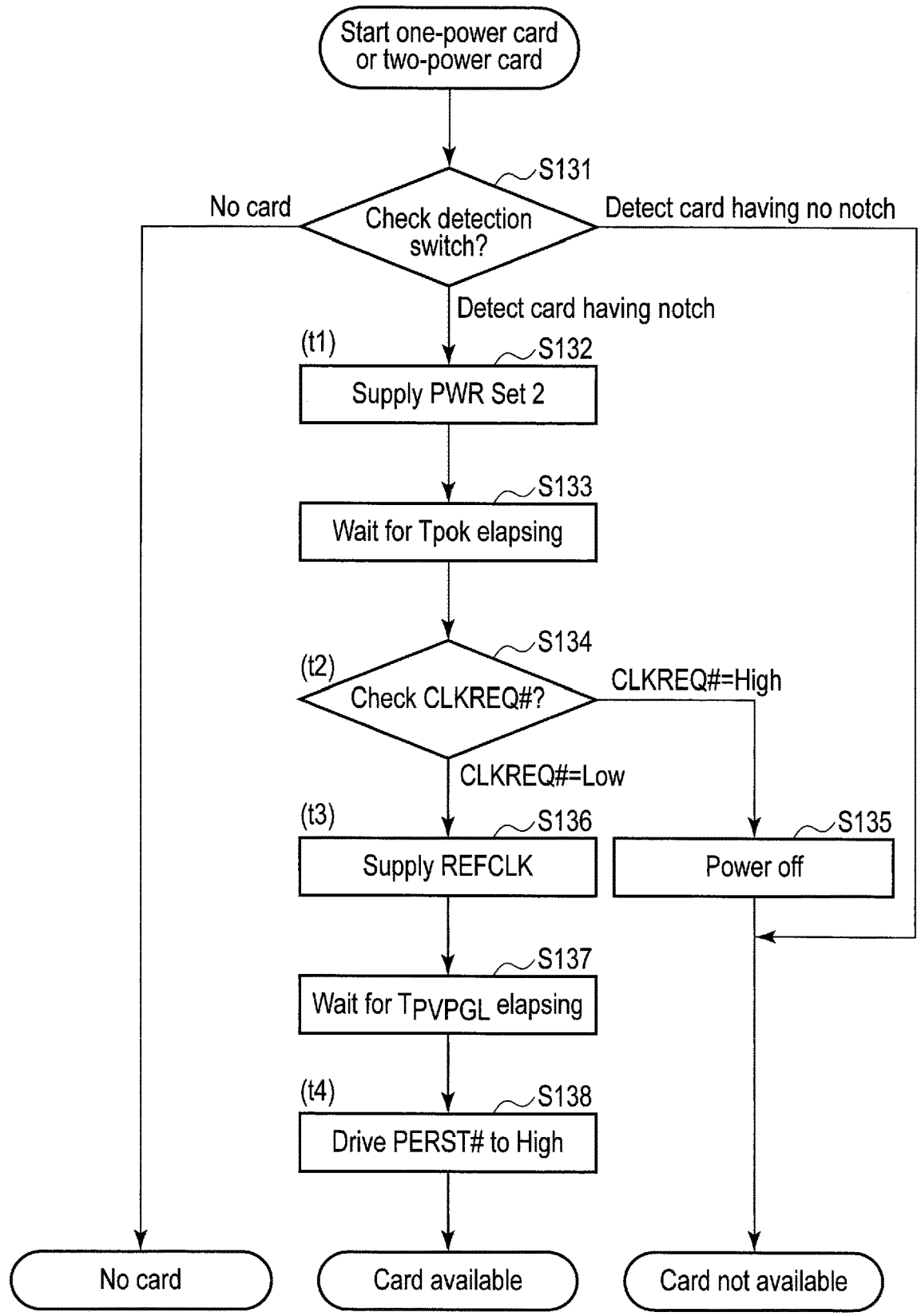
FIG. 45 is a flowchart illustrating a procedure of a process executed by the host device (two-power host or one-power host) according to the second embodiment.

FIG. 45 is a flowchart illustrating a procedure of a process executed by a second-type host (one-power host or two-power host).

The second-type host (one-power host or two-power host) determines which of three card statuses (no card, detection of the card having a notch, and detection of the card having no notch) is the current card status by checking the on/off status of the detection switch (A) 116A' and the detection switch (B) 116B' (step S131).

When the card is not placed into the connector (no card), the second-type host (one-power host or two-power host) does not supply the second power set (PWR Set 2: m types of power supply voltages) to the connector.

When the notch 32a is not formed on the card placed into the connector (card having no notch is detected), the second-type host (one-power host or two-power host) does not supply the second power set (PWR Set 2: m types of power supply voltages) to the connector.

When the notch 32a is formed on the card placed into the connector (card having a notch is detected), the second-type host (one-power host or two-power host) supplies the second power set (PWR Set 2: m types of power supply voltages) to the card (step S132).

The second-type host (one-power host or two-power host) waits for the predetermined time (Tpok) elapsing after the start of supply of the second power set (PWR Set 2: m types of power supply voltages) (step S133). Then, when the predetermined time (Tpok) elapses after the start of supply of the second power set (PWR Set 2: m types of power supply voltages), the second-type host (one-power host or two-power host) checks the clock request signal CLKREQ #(step S134).

When the clock request signal CLKREQ # is High, the second-type host (one-power host or two-power host) recognizes that an abnormality occurs on the card, stops the supply of the second power set (PWR Set 2: m types of power supply voltages), and sets all of m types of power supply voltages to 0V (step S135). In other words, the second-type host (one-power host or two-power host) does not supply the reference clock REFCLK to the card, and maintains PERST # in the active status (Low) and does not start the initialization sequence.

When the clock request signal CLKREQ # is Low, the second-type host (one-power host or two-power host) supplies the reference clock REFCLK to the card (step S136). Then, the second-type host (one-power host or two-power host) waits until the frequency of the reference clock REFCLK becomes stable. In this case, the second-type host (one-power host or two-power host) waits for, for example, the predetermined time ($T_{PVPGL}$) elapsing after the start of supply of the second power set (PWR Set 2: m types of power supply voltages) (step S137). In a low temperature environment, this wait time includes the warm-up time of the card.

When the predetermined time ($T_{PVPGL}$) elapses after the start of supply of the second power set (PWR Set 2: m types of power supply voltages), the second-type host (one-power host or two-power host) drives PERST # to High to release the reset status of the card (step S138), and thereby starts the initialization sequence to enable data to be transmitted or received between the card and the host device via the PCIe interface. In other words, in step S138, the second-type host (one-power host or two-power host) supplies the High signal (PERST #) to the terminal (P133) of the card used to release the reset status of the card after the predetermined time elapses after the supply of m types of power supply voltages to the card.

Figure 46:
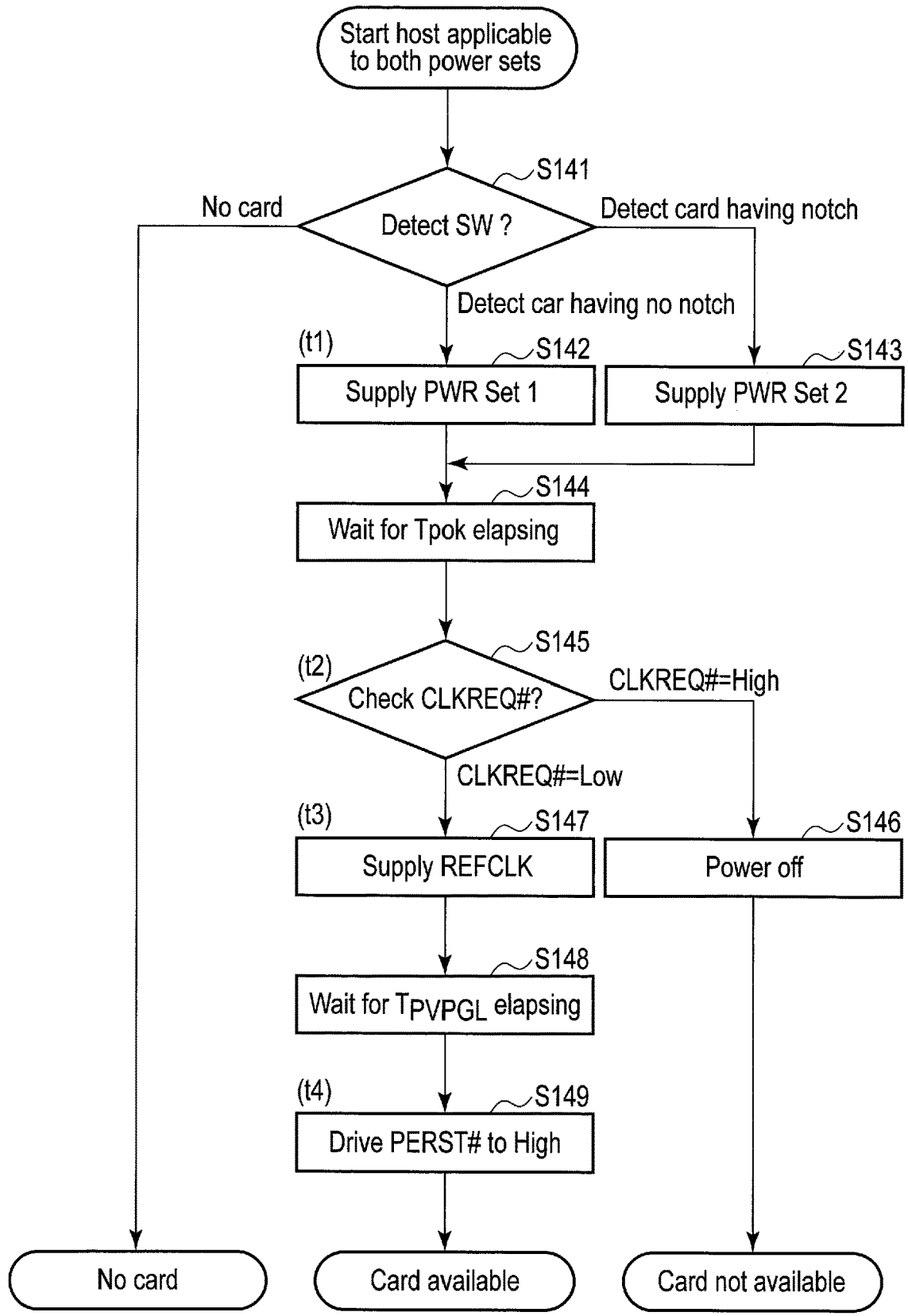
FIG. 46 is a flowchart illustrating a procedure of a process executed by the host device applicable to both the first power host and the second power host, according to the second embodiment.

FIG. 46 is a flowchart illustrating a procedure of a process executed by the host device applicable to both the power sets and configured to selectively supply the first power set (n types of power supply voltages) and the second power set (m types of power supply voltages) in accordance with the card power configuration.

The host applicable to both the power sets determines which of three card statuses (no card, detection of the card having a notch, and detection of the card having no notch) is the current card status by checking the on/off status of the detection switch (A) 116A' and the detection switch (B) 116B' (step S141).

When the card is not placed into the connector (no card), the host applicable to both the power sets does not supply the first power set (n types of power supply voltages) or the second power set (m types of power supply voltages) to the connector.

When the notch 32a is not formed on the card placed into the connector (card having no notch is detected), the host applicable to both the power sets supplies the first power set (PWR Set 1: n types of power supply voltages) to the connector (step S142).

When the notch 32a is formed on the card placed into the connector (card having a notch is detected), the host applicable to both the power sets supplies the second power set (PWR Set 2: m types of power supply voltages) to the connector (step S143).

The host applicable to both the power sets waits for the predetermined time (Tpok) elapsing after the start of supply of the first power set (n types of power supply voltages) or the second power set (m types of power supply voltages) (step S144). Then, when the predetermined time (Tpok) elapses after the start of supply of the first power set (n types of power supply voltages) or the second power set (m types of power supply voltages), the host applicable to both the power sets checks the clock request signal CLKREQ #(step S145).

When the clock request signal CLKREQ # is High, the host applicable to both the power sets recognizes that an abnormality occurs on the card, stops the supply of the power set currently supplied, and sets all of power supply voltages to 0V (step S146). In other words, the host applicable to both the power sets does not supply the reference clock REFCLK to the card, and maintains PERST # in the active status (Low) and does not start the initialization sequence.

When the clock request signal CLKREQ # is Low, the host applicable to both the power sets supplies the reference clock REFCLK to the card (step S147). Then, the host applicable to both the power sets waits until the frequency of the reference clock REFCLK becomes stable. In this case, the host applicable to both the power sets waits for, for example, the predetermined time ($T_{PVPGL}$) elapsing after the start of supply of the first power set (n types of power supply voltages) or the second power set (m types of power supply voltages) (step S148). In a low temperature environment, this wait time includes the warm-up time of the card.

When the predetermined time ($T_{PVPGL}$) elapses after the start of supply of the first power set (n types of power supply voltages) or the second power set (m types of power supply voltages), the host applicable to both the power sets drives PERST # to High to release the reset status of the card (step S149), and thereby starts the initialization sequence to enable data to be transmitted or received between the card and the host device via the PCIe interface. In other words, in step S149, the host applicable to both the power sets supplies the High signal (PERST #) to the terminal (P133) of the card used to release the reset status of the card after the predetermined time elapses after the supply of n types of power supply voltages or m types of power supply voltages to the card.

As described above, according to the second embodiment, each of the first-type host and the second-type host comprises the notch check function and, when the power configuration of the card placed into the connector does not match the power configuration of the host, each of the first-type host and the second-type host does not supply the power supply voltage to the card. Therefore, even if the second-type card (second-type semiconductor storage device) is placed into the first-type host or the first-type card (first-type semiconductor storage device) is placed into the second-type host, occurrence of inconvenience that the card may be broken or large current flows to the card to ignite can be prevented.

In the second embodiment, too, the notch 32a may be formed on a third edge 33 of the body of the second-type card (second-type semiconductor storage device). In addition, the mechanical identifier indicative of the second-type card (second-type semiconductor storage device) is the notch 32a, but a mechanical part other than the notch by which the host device can discriminate the difference in shape between the first-generation card (first-type card) and the second-generation card (second-type card) may be formed as a mechanical identifier at a predetermined position of the body of the second-type card (second-type semiconductor storage device). Examples of mechanical part other than the notch include a hole formed in the card body, a protrusion formed on a side or a surface of the card body, a pad formed on a surface of the card body, and the like. In addition, a configuration of detecting the processing of the surface of the card body, the color of the face of the card body and the like by a sensor arranged on the connector can be employed.

In the second embodiment, too, a NAND flash memory is illustrated as an example of the nonvolatile memory. However, the functions of the second embodiment can also be applied to, for example, various other nonvolatile memories such as a magnetoresistive random access memory (MRAM), a phase change random access memory (PRAM), a resistive random access memory (ReRAM) or a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An information processing system comprising a host device and a semiconductor storage device capable of being placed into the host device, the semiconductor storage device being a second type semiconductor storage device operating with m types of power supply voltages supplied from outside, the m types of power supply voltages being less than n types of power supply voltages for a first-type semiconductor storage device, the first-type semiconductor storage device operating with the n types of power supply voltages supplied from outside, n being an integer of 2 or more, m being an integer of 1 or more and being less than n, the host device being configured to:

check whether or not a predetermined condition is satisfied, when the host device is configured to supply the m types of power supply voltages to the second-type semiconductor storage device;

supply no power supply voltages to a semiconductor storage device placed into a connector of the host device, when the predetermined condition is not satisfied;

supply the m types of power supply voltages to the semiconductor storage device placed into the connector, when the predetermined condition is satisfied, and when the predetermined condition is satisfied, supply a first signal to a terminal of the semiconductor storage device placed into the connector after a predetermined time elapses after supplying the m types of power supply voltages to the semiconductor storage device placed into the connector, the terminal being used to release a reset status of the semiconductor storage device placed into the connector, wherein the second-type semiconductor storage device includes a plurality of power supply terminals, and a number of the plurality of power supply terminals is equal to a number of a plurality of power supply terminals included in the first-type semiconductor storage device, the semiconductor storage device that is the second-type semiconductor storage device is configured to:

determine whether the host device into which the semiconductor storage device is placed is a first-type host device supplying the n types of power supply voltages or a second-type host device supplying the m types of power supply voltages, based on a voltage of a first power supply terminal and a voltage of a second power supply terminal, or the voltage of the first power supply terminal, the first power supply terminal and the second power supply terminal being included in the plurality of power supply terminals of the semiconductor storage device;

when the host device into which the semiconductor storage device is placed is the second-type host device, assert a clock request signal for the host device, the clock request signal being a signal that requests the host device to supply a reference clock signal; and when the host device into which the semiconductor storage device is placed is the first-type host device, not assert the clock request signal for the host device or assert the clock request signal for the host device after changing settings of an internal circuit of the semiconductor storage device so as to generate plural types of power supply voltages necessary for an operation of the semiconductor storage device from the n types of power supply voltages supplied to the plurality of power supply terminals, wherein the n types of power supply voltages include a first power supply voltage, a second power supply voltage lower than the first power supply voltage, and a third power supply voltage lower than the second power supply voltage, the m types of power supply voltages include the first power supply voltage or the first power supply voltage and the second power supply voltage, the first-type semiconductor storage device is configured to operate with three types of power supply voltages supplied from outside, and the second-type semiconductor storage device is configured to operate with one type of power supply voltage supplied from outside or two types of power supply voltages supplied from outside, the first power supply terminal is a power supply terminal to which the third power supply voltage is assigned in the first-type semiconductor storage device and to which the first power supply voltage is assigned in the second-type semiconductor storage device, and the second power supply terminal is a power supply terminal to which the second power supply voltage is assigned in the first-type semiconductor storage device and to which the first power supply voltage, the second power supply voltage, or 0V is assigned in the second-type semiconductor storage device.

2. The information processing system of claim 1, wherein the predetermined condition is that a notch is formed at a predetermined position of the semiconductor storage device placed into the connector.

3. The information processing system of claim 1, wherein the m types of power supply voltages include the first power supply voltage, and the second-type semiconductor storage device is configured to operate with one type of power supply voltage supplied from outside.

4. The information processing system of claim 3, wherein the second power supply terminal is a power supply terminal to which the second power supply voltage is assigned in the first-type semiconductor storage device and to which 0V or the first power supply voltage is assigned in the second-type semiconductor storage device.

5. The information processing system of claim 1, wherein the host device being configured to:

check whether or not the predetermined condition is satisfied, when the host device is configured to supply the n types of power supply voltages to the first-type semiconductor storage device;

supply no power supply voltages to the semiconductor storage device placed into the connector, when the predetermined condition is satisfied;

supply the n types of power supply voltages to the semiconductor storage device placed into the connector, when the predetermined condition is not satisfied, and when the predetermined condition is not satisfied, supply the first signal to a terminal of the semiconductor storage device placed into the connector after a predetermined time elapses after supplying the n types of power supply voltages to the semiconductor storage device placed into the connector, the terminal being used to release a reset status of the semiconductor storage device placed into the connector.

6. A controlling method of an information processing system, the information processing system including a host device and a semiconductor storage device capable of being placed into the host device, the semiconductor storage device being a second type semiconductor storage device operating with m types of power supply voltages supplied from outside, the m types of power supply voltages being less than n types of power supply voltages for a first-type semiconductor storage device, the first-type semiconductor storage device operating with the n types of power supply voltages supplied from outside, n being an integer of 2 or more, m being an integer of 1 or more and being less than n, the controlling method comprising:

checking whether or not a predetermined condition is satisfied, when the host device is configured to supply the m types of power supply voltages to the second-type semiconductor storage device;

supplying no power supply voltages to a semiconductor storage device placed into a connector of the host device, when the predetermined condition is not satisfied;

supplying the m types of power supply voltages to the semiconductor storage device placed into the connector, when the predetermined condition is satisfied, and when the predetermined condition is satisfied, supplying a first signal to a terminal of the semiconductor storage device placed into the connector after a predetermined time elapses after supplying the m types of power supply voltages to the semiconductor storage device placed into the connector, the terminal being used to release a reset status of the semiconductor storage device placed into the connector, wherein the second-type semiconductor storage device includes a plurality of power supply terminals, and a number of the plurality of power supply terminals is equal to a number of a plurality of power supply terminals included in the first-type semiconductor storage device, when the semiconductor storage device is the second-type semiconductor storage device, the controlling method further comprises:

determining whether the host device into which the semiconductor storage device is placed is a first-type host device supplying the n types of power supply voltages or a second-type host device supplying the m types of power supply voltages, based on a voltage of a first power supply terminal and a voltage of a second power supply terminal, or the voltage of the first power supply terminal, the first power supply terminal and the second power supply terminal being included in the plurality of power supply terminals of the semiconductor storage device;

when the host device into which the semiconductor storage device is placed is the second-type host device, asserting a clock request signal for the host device, the clock request signal being a signal that requests the host device to supply a reference clock signal; and when the host device into which the semiconductor storage device is placed is the first-type host device, not asserting the clock request signal for the host device or asserting the clock request signal for the host device after changing settings of an internal circuit of the semiconductor storage device so as to generate plural types of power supply voltages necessary for an operation of the semiconductor storage device from the n types of power supply voltages supplied to the plurality of power supply terminals, wherein the n types of power supply voltages include a first power supply voltage, a second power supply voltage lower than the first power supply voltage, and a third power supply voltage lower than the second power supply voltage, the m types of power supply voltages include the first power supply voltage or the first power supply voltage and the second power supply voltage, the first-type semiconductor storage device is configured to operate with three types of power supply voltages supplied from outside, and the second-type semiconductor storage device is configured to operate with one type of power supply voltage supplied from outside or two types of power supply voltages supplied from outside, the first power supply terminal is a power supply terminal to which the third power supply voltage is assigned in the first-type semiconductor storage device and to which the first power supply voltage is assigned in the second-type semiconductor storage device, and the second power supply terminal is a power supply terminal to which the second power supply voltage is assigned in the first-type semiconductor storage device and to which the first power supply voltage, the second power supply voltage, or 0V is assigned in the second-type semiconductor storage device.

7. The controlling method of claim 6, wherein
the predetermined condition is that a notch is formed at a predetermined position of the semiconductor storage device placed into the connector.

8. The controlling method of claim 6, wherein
the m types of power supply voltages include the first power supply voltage, and
the second-type semiconductor storage device is configured to operate with one type of power supply voltage supplied from outside.

9. The controlling method of claim 8, wherein
the second power supply terminal is a power supply terminal to which the second power supply voltage is assigned in the first-type semiconductor storage device and to which 0V or the first power supply voltage is assigned in the second-type semiconductor storage device.

10. The controlling method of claim 6, further comprising:

checking whether or not the predetermined condition is satisfied, when the host device is configured to supply the n types of power supply voltages to the first-type semiconductor storage device;

supplying no power supply voltages to the semiconductor storage device placed into the connector, when the predetermined condition is satisfied;

supplying the n types of power supply voltages to the semiconductor storage device placed into the connector, when the predetermined condition is not satisfied, and when the predetermined condition is not satisfied, supplying the first signal to a terminal of the semiconductor storage device placed into the connector after a predetermined time elapses after supplying the n types of power supply voltages to the semiconductor storage device placed into the connector, the terminal being used to release a reset status of the semiconductor storage device placed into the connector.

* * * * *